US012046604B2

(12) United States Patent
Yamazaki et al.

(10) Patent No.: US 12,046,604 B2
(45) Date of Patent: Jul. 23, 2024

(54) LIQUID CRYSTAL DISPLAY DEVICE, EL DISPLAY DEVICE, AND MANUFACTURING METHOD THEREOF

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 590 days.

(21) Appl. No.: 17/204,460

(22) Filed: Mar. 17, 2021

(65) Prior Publication Data

US 2021/0202542 A1 Jul. 1, 2021

Related U.S. Application Data

(63) Continuation of application No. 15/435,693, filed on Feb. 17, 2017, now abandoned, which is a
(Continued)

(30) Foreign Application Priority Data

Nov. 11, 2011 (JP) .................................. 2011-247360
Nov. 11, 2011 (JP) .................................. 2011-247367

(51) Int. Cl.
*H01L 27/12* (2006.01)
*G02F 1/1333* (2006.01)
(Continued)

(52) U.S. Cl.
CPC .... *H01L 27/1259* (2013.01); *G02F 1/133345* (2013.01); *G02F 1/136227* (2013.01);
(Continued)

(58) Field of Classification Search
CPC ............ H01L 27/1259; H01L 27/1225; H01L 27/124; H01L 27/1255; H01L 27/127;
(Continued)

(56) References Cited

U.S. PATENT DOCUMENTS 5,477,355 A 12/1995 Sasaki et al.
5,731,856 A 3/1998 Kim et al.
(Continued)

FOREIGN PATENT DOCUMENTS

CN 001790749 A 6/2006
CN 001828872 A 9/2006
(Continued)

OTHER PUBLICATIONS

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Douglas W Owens
(74) *Attorney, Agent, or Firm* — Fish & Richardson P.C.

(57) ABSTRACT

A display device is manufactured with five photolithography steps: a step of forming a gate electrode, a step of forming a protective layer for reducing damage due to an etching step or the like, a step of forming a source electrode and a drain electrode, a step of forming a contact hole, and a step of forming a pixel electrode. The display device includes a groove portion which is formed in the step of forming the contact hole and separates the semiconductor layer.

17 Claims, 23 Drawing Sheets

Related U.S. Application Data continuation of application No. 13/667,271, filed on Nov. 2, 2012, now Pat. No. 9,576,982.

(51) Int. Cl.
  *G02F 1/1362* (2006.01)
  *G02F 1/1368* (2006.01)

(52) U.S. Cl.
  CPC ...... *G02F 1/136286* (2013.01); *G02F 1/1368* (2013.01); *H01L 27/1225* (2013.01); *H01L 27/124* (2013.01); *H01L 27/1255* (2013.01); *H01L 27/127* (2013.01); *H01L 27/1288* (2013.01); *G02F 1/13629* (2021.01); *G02F 1/136295* (2021.01); *G02F 2201/123* (2013.01); *H01L 27/1222* (2013.01)

(58) Field of Classification Search
  CPC . H01L 27/1288; H01L 27/1222; H01L 21/77; H01L 27/12; G02F 1/133345; G02F 1/136227; G02F 1/136286; G02F 1/1368; G02F 1/13629; G02F 1/136295; G02F 2201/123; G02F 1/1362
  See application file for complete search history.

(56) References Cited

U.S. PATENT DOCUMENTS

| | | | |
|---|---|---|---|
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,493,048 B1 | 12/2002 | Baek et al. | |
| 6,563,174 B2 | 5/2003 | Kawasaki et al. | |
| 6,624,477 B1 * | 9/2003 | Takemura | H01L 29/78621 257/E29.147 |
| 6,650,379 B2 | 11/2003 | Baek et al. | |
| 6,674,093 B1 | 1/2004 | Tanaka et al. | |
| 6,727,522 B1 | 4/2004 | Kawasaki et al. | |
| 6,768,521 B2 | 7/2004 | Baek et al. | |
| 6,838,308 B2 | 1/2005 | Haga | |
| 6,891,196 B2 | 5/2005 | Tanaka et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,115,906 B2 | 10/2006 | Lai | |
| 7,139,045 B2 | 11/2006 | Baek et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,326,602 B2 | 2/2008 | Lai | |
| 7,382,421 B2 | 6/2008 | Hoffman et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,442,960 B2 | 10/2008 | Suh et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,485,507 B2 | 2/2009 | Ahn et al. | |
| 7,495,252 B2 | 2/2009 | Ahn et al. | |
| 7,501,293 B2 | 3/2009 | Ito et al. | |
| 7,576,394 B2 | 8/2009 | Furuta et al. | |
| 7,601,984 B2 | 10/2009 | Sano et al. | |
| 7,605,875 B2 | 10/2009 | Baek et al. | |
| 7,642,038 B2 | 1/2010 | Fujii | |
| 7,674,650 B2 | 3/2010 | Akimoto et al. | |
| 7,732,819 B2 | 6/2010 | Akimoto et al. | |
| 7,768,617 B2 | 8/2010 | Yamazaki et al. | |
| 7,855,379 B2 | 12/2010 | Hayashi et al. | |
| 7,880,836 B2 | 2/2011 | Kimura et al. | |
| 7,889,295 B2 | 2/2011 | Kimura et al. | |
| 7,919,396 B2 | 4/2011 | Ahn et al. | |
| 7,935,579 B2 | 5/2011 | Park et al. | |
| 7,969,012 B2 | 6/2011 | Sasagawa | |
| 7,994,500 B2 | 8/2011 | Kim et al. | |
| 7,999,892 B2 | 8/2011 | Kimura et al. | |
| 8,039,840 B2 | 10/2011 | Hosoya | |
| 8,067,775 B2 | 11/2011 | Miyairi et al. | |
| 8,088,652 B2 | 1/2012 | Hayashi et al. | |
| 8,148,779 B2 | 4/2012 | Jeong et al. | |
| 8,188,480 B2 | 5/2012 | Itai | |
| 8,203,143 B2 | 6/2012 | Imai | |
| 8,218,099 B2 | 7/2012 | Yamazaki et al. | |
| 8,222,092 B2 | 7/2012 | Yamazaki et al. | |
| 8,242,496 B2 | 8/2012 | Yamazaki et al. | |
| 8,253,135 B2 | 8/2012 | Uochi et al. | |
| 8,293,595 B2 | 10/2012 | Yamazaki et al. | |
| 8,304,987 B2 | 11/2012 | Kim et al. | |
| 8,309,961 B2 | 11/2012 | Yamazaki et al. | |
| 8,324,621 B2 | 12/2012 | Yamazaki et al. | |
| 8,378,343 B2 | 2/2013 | Yamazaki et al. | |
| 8,378,351 B2 | 2/2013 | Fukumoto et al. | |
| 8,378,391 B2 | 2/2013 | Koyama et al. | |
| 8,399,274 B2 | 3/2013 | Kang et al. | |
| 8,405,084 B2 | 3/2013 | Lee et al. | |
| 8,420,441 B2 | 4/2013 | Yamazaki et al. | |
| 8,427,595 B2 | 4/2013 | Yamazaki et al. | |
| 8,436,349 B2 | 5/2013 | Sano et al. | |
| 8,445,905 B2 | 5/2013 | Yamazaki et al. | |
| 8,471,256 B2 | 6/2013 | Yamazaki et al. | |
| 8,501,555 B2 | 8/2013 | Yamazaki et al. | |
| 8,501,606 B2 | 8/2013 | Lee et al. | |
| 8,508,700 B2 | 8/2013 | Kimura et al. | |
| 8,520,178 B2 | 8/2013 | Yamazaki et al. | |
| 8,581,413 B2 | 11/2013 | Sasagawa | |
| 8,610,120 B2 | 12/2013 | Miyake et al. | |
| 8,630,127 B2 | 1/2014 | Uochi et al. | |
| 8,675,158 B2 | 3/2014 | Kimura et al. | |
| 8,759,829 B2 | 6/2014 | Uochi et al. | |
| 8,778,730 B2 | 7/2014 | Hara et al. | |
| 8,790,960 B2 | 7/2014 | Yamazaki | |
| 8,791,463 B2 | 7/2014 | Misaki | |
| 8,841,710 B2 | 9/2014 | Yamazaki et al. | |
| 8,872,171 B2 | 10/2014 | Yamazaki et al. | |
| 8,878,172 B2 | 11/2014 | Ito et al. | |
| 8,878,184 B2 | 11/2014 | Hosoya | |
| 8,884,284 B2 | 11/2014 | Koyama | |
| 8,916,869 B2 | 12/2014 | Koyama et al. | |
| 9,024,313 B2 | 5/2015 | Yamazaki et al. | |
| 9,029,851 B2 | 5/2015 | Miyairi et al. | |
| 9,035,313 B2 | 5/2015 | Jeong et al. | |
| 9,111,806 B2 | 8/2015 | Ito et al. | |
| 9,128,336 B2 | 9/2015 | Kimura et al. | |
| 9,136,389 B2 | 9/2015 | Yamazaki et al. | |
| 9,184,189 B2 | 11/2015 | Uochi et al. | |
| 9,318,512 B2 | 4/2016 | Miyairi et al. | |
| 9,331,112 B2 | 5/2016 | Koyama et al. | |
| 9,362,416 B2 | 6/2016 | Yamazaki et al. | |
| 9,406,808 B2 | 8/2016 | Yamazaki et al. | |
| 9,412,798 B2 | 8/2016 | Yamazaki et al. | |
| 9,417,492 B2 | 8/2016 | Kimura et al. | |
| 9,576,982 B2 | 2/2017 | Yamazaki et al. | |
| 9,601,603 B2 | 3/2017 | Miyairi et al. | |
| 9,647,137 B2 | 5/2017 | Ito et al. | |
| 9,715,845 B2 | 7/2017 | Umezaki et al. | |
| 9,748,436 B2 | 8/2017 | Yamazaki et al. | |
| 9,773,814 B2 | 9/2017 | Koyama et al. | |
| 9,835,912 B2 | 12/2017 | Kimura et al. | |
| 9,859,441 B2 | 1/2018 | Yamazaki et al. | |
| 9,947,797 B2 | 4/2018 | Yamazaki et al. | |
| 10,019,924 B2 | 7/2018 | Umezaki et al. | |
| 10,115,831 B2 | 10/2018 | Yamazaki et al. | |
| 10,141,343 B2 | 11/2018 | Ito et al. | |
| 10,153,380 B2 | 12/2018 | Miyairi et al. | |
| 10,170,632 B2 | 1/2019 | Miyairi et al. | |
| 10,203,571 B2 | 2/2019 | Kimura et al. | |
| 10,360,831 B2 | 7/2019 | Umezaki et al. | |
| 10,396,236 B2 | 8/2019 | Yamazaki et al. | |
| 10,692,894 B2 | 6/2020 | Ito et al. | |
| 10,977,977 B2 | 4/2021 | Umezaki et al. | |

(56) References Cited

U.S. PATENT DOCUMENTS

| | | |
|---|---|---|
| 10,978,490 B2 | 4/2021 | Ito et al. |
| 2001/0029054 A1 | 10/2001 | Maeda et al. |
| 2001/0046027 A1 | 11/2001 | Tai et al. |
| 2002/0000557 A1 | 1/2002 | Kido |
| 2002/0056838 A1 | 5/2002 | Ogawa |
| 2002/0075423 A1 | 6/2002 | Fujino |
| 2002/0132454 A1 | 9/2002 | Ohtsu et al. |
| 2002/0171108 A1 | 11/2002 | Lim et al. |
| 2003/0076452 A1 | 4/2003 | Kim et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0221203 A1 | 10/2005 | Fujii |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0097254 A1 | 5/2006 | Ahn et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0145157 A1 | 7/2006 | Choi et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267094 A1 | 11/2006 | Ahn et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152220 A1 | 7/2007 | Kwack |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0106685 A1 | 5/2008 | Choi et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224249 A1 | 9/2009 | Miyairi et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0321731 A1 | 12/2009 | Jeong et al. |
| 2010/0006833 A1 | 1/2010 | Ha et al. |
| 2010/0006845 A1 | 1/2010 | Seo et al. |
| 2010/0025675 A1 | 2/2010 | Yamazaki et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0072467 A1 | 3/2010 | Yamazaki et al. |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0102311 A1 | 4/2010 | Ito et al. |
| 2010/0105163 A1 | 4/2010 | Ito et al. |
| 2010/0109002 A1 | 5/2010 | Itagaki et al. |
| 2010/0136743 A1 | 6/2010 | Akimoto et al. |
| 2010/0140612 A1 | 6/2010 | Omura et al. |
| 2010/0163865 A1 | 7/2010 | Arai |
| 2010/0163868 A1 | 7/2010 | Yamazaki et al. |
| 2010/0224880 A1 | 9/2010 | Kimura |
| 2010/0244020 A1 | 9/2010 | Sakata et al. |
| 2010/0283049 A1 | 11/2010 | Sato et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0084265 A1 | 4/2011 | Arasawa et al. |
| 2011/0085104 A1 | 4/2011 | Arasawa et al. |
| 2011/0122355 A1 | 5/2011 | Matsumuro et al. |
| 2011/0193083 A1 | 8/2011 | Kim et al. |
| 2011/0204375 A1 | 8/2011 | Yagi et al. |
| 2011/0210328 A1 | 9/2011 | Yamazaki et al. |
| 2011/0210396 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0241008 A1 | 10/2011 | Yamazaki et al. |
| 2012/0032227 A1 | 2/2012 | Seabaugh et al. |
| 2012/0052606 A1 | 3/2012 | Yamazaki |
| 2012/0052625 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |
| 2012/0194756 A1 | 8/2012 | Hayakawa et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0120701 A1 | 5/2013 | Yamazaki et al. |
| 2013/0134414 A1 | 5/2013 | Yamazaki et al. |
| 2015/0048363 A1 | 2/2015 | Yamazaki et al. |

(56) References Cited

U.S. PATENT DOCUMENTS

| | | |
|---|---|---|
| 2016/0268359 A1 | 9/2016 | Yamazaki et al. |
| 2018/0138283 A1 | 5/2018 | Kimura |
| 2019/0074379 A1 | 3/2019 | Miyairi et al. |
| 2019/0109259 A1 | 4/2019 | Yamazaki et al. |
| 2019/0157499 A1 | 5/2019 | Yamazaki et al. |
| 2021/0210612 A1 | 7/2021 | Kimura |
| 2021/0225889 A1 | 7/2021 | Ito et al. |

FOREIGN PATENT DOCUMENTS

| | | |
|---|---|---|
| CN | 101621075 A | 1/2010 |
| CN | 101685835 A | 3/2010 |
| CN | 101901839 A | 12/2010 |
| CN | 102117824 A | 7/2011 |
| EP | 1598860 A | 11/2005 |
| EP | 1737044 A | 12/2006 |
| EP | 2141743 A | 1/2010 |
| EP | 2144294 A | 1/2010 |
| EP | 2226847 A | 9/2010 |
| EP | 2256814 A | 12/2010 |
| EP | 2312560 A | 4/2011 |
| EP | 2479604 A | 7/2012 |
| EP | 2479605 A | 7/2012 |
| EP | 2528100 A | 11/2012 |
| EP | 3051588 A | 8/2016 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-133455 A | 5/1999 |
| JP | 11-505377 | 5/1999 |
| JP | 2000-044236 A | 2/2000 |
| JP | 2000-131719 A | 5/2000 |
| JP | 2000-150900 A | 5/2000 |
| JP | 2000-357586 A | 12/2000 |
| JP | 2001-196595 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-157151 A | 6/2004 |
| JP | 2004-273614 A | 9/2004 |
| JP | 2004-273732 A | 9/2004 |
| JP | 2005-077822 A | 3/2005 |
| JP | 2005-316356 A | 11/2005 |
| JP | 2005-340771 A | 12/2005 |
| JP | 2006-140433 A | 6/2006 |
| JP | 2006-261408 A | 9/2006 |
| JP | 2007-073559 A | 3/2007 |
| JP | 2007-096055 A | 4/2007 |
| JP | 2007-123861 A | 5/2007 |
| JP | 2008-270758 A | 11/2008 |
| JP | 2008-294136 A | 12/2008 |
| JP | 2009-141002 A | 6/2009 |
| JP | 2009-157354 A | 7/2009 |
| JP | 2009-231613 A | 10/2009 |
| JP | 2010-016347 A | 1/2010 |
| JP | 2010-016348 A | 1/2010 |
| JP | 2010-021520 A | 1/2010 |
| JP | 2010-032643 A | 2/2010 |
| JP | 2010-040552 A | 2/2010 |
| JP | 2010-056546 A | 3/2010 |
| JP | 2010-067954 A | 3/2010 |
| JP | 2010-093240 A | 4/2010 |
| JP | 2010-103340 A | 5/2010 |
| JP | 2010-103360 A | 5/2010 |
| JP | 2010-171411 A | 8/2010 |
| JP | 2010-232652 A | 10/2010 |
| JP | 2010-232682 A | 10/2010 |
| JP | 2010-245118 A | 10/2010 |
| JP | 2010-251721 A | 11/2010 |
| JP | 2011-009719 A | 1/2011 |
| JP | 2011-029304 A | 2/2011 |
| JP | 2011-077517 A | 4/2011 |
| JP | 2011-085918 A | 4/2011 |
| JP | 2011-135061 A | 7/2011 |
| JP | 2011-222767 A | 11/2011 |
| JP | 2012-084859 A | 4/2012 |
| TW | 200535776 | 11/2005 |
| TW | 200811931 | 3/2008 |
| TW | 201023315 | 6/2010 |
| TW | 201034198 | 9/2010 |
| TW | 201117371 | 5/2011 |
| TW | 201119030 | 6/2011 |
| TW | 201123309 | 7/2011 |
| TW | 201123356 | 7/2011 |
| TW | 201123421 | 7/2011 |
| TW | 201131766 | 9/2011 |
| TW | 201131780 | 9/2011 |
| TW | 201133074 | 10/2011 |
| TW | 201133787 | 10/2011 |
| TW | 201135910 | 10/2011 |
| WO | WO-2004/114391 | 12/2004 |
| WO | WO-2007/066677 | 6/2007 |
| WO | WO-2008/105347 | 9/2008 |
| WO | WO-2009/072532 | 6/2009 |
| WO | WO-2010/029885 | 3/2010 |
| WO | WO-2010/032639 | 3/2010 |
| WO | WO-2010/047217 | 4/2010 |
| WO | WO-2011/007675 | 1/2011 |
| WO | WO-2011/007677 | 1/2011 |
| WO | WO-2011/013523 | 2/2011 |
| WO | WO-2011/027664 | 3/2011 |
| WO | WO-2011/043203 | 4/2011 |
| WO | WO-2011/046003 | 4/2011 |
| WO | WO-2011/055626 | 5/2011 |
| WO | WO-2011/065208 | 6/2011 |
| WO | WO-2011/089767 | 7/2011 |
| WO | WO-2011/132376 | 10/2011 |
| WO | WO-2012/035975 | 3/2012 |

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated By TFT Transfer Technology", IEDM 05: Technical Digest of International Electron Devices Meeting, Dec. 5, 2005, pp. 1067-1069.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2: Distinguished Paper: World-Largest (6.5") Flexible Full Color Top Emission Amoled Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA Amoled Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", Idw '09 : Proceedings of the 16th International Display Workshops, 2009, pp. 689-692.

Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kim.H et al., "22.1: Invited Paper: Technological Challenges for Large-Size AMOLED Display", SID Digest '08 : SID International Symposium Digest of Technical Papers, May 20, 2008, vol. 39, No. 1, pp. 291-294.

Quirk.M et al., "Semiconductor manufacturing technology", Prentice-Hall, 2001, pp. 314-320, Prentice-Hall, Inc.

Taiwanese Office Action (Application No. 101140528) Dated Oct. 14, 2016.

Taiwanese Office Action (Application No. 106108996) Dated Jul. 27, 2018.

Chinese Office Action (Application No. 201710232434.8) Dated Oct. 30, 2019.

Taiwanese Office Action (Application No. 111112758) Dated Apr. 27, 2023.

\* cited by examiner

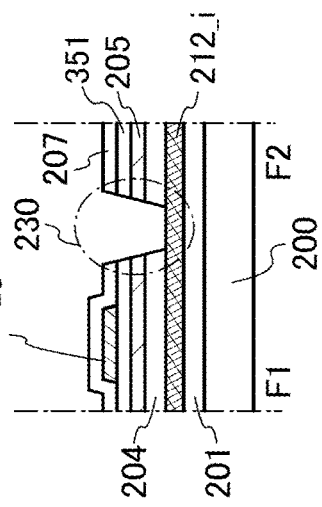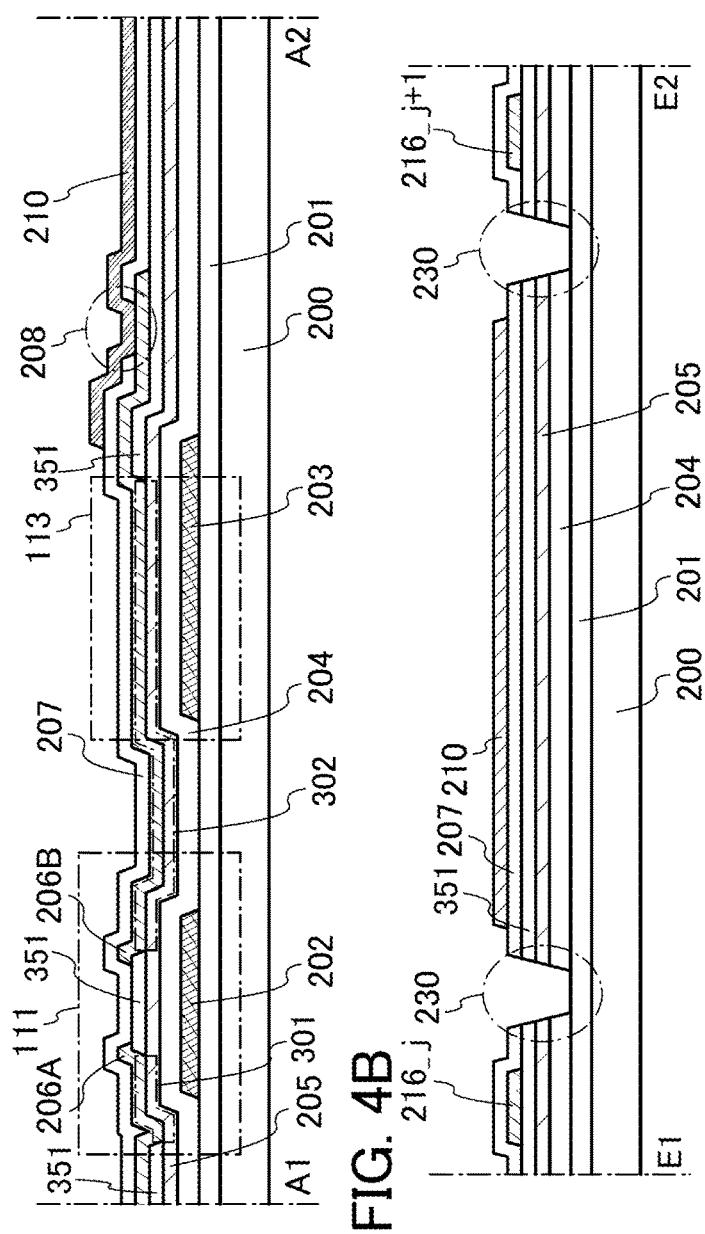

FIG. 7A1
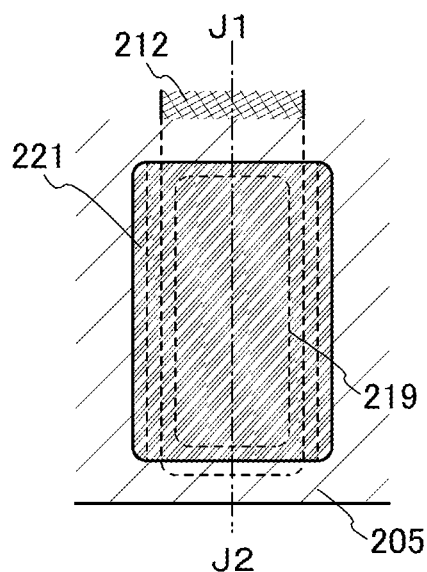
FIG. 7A2
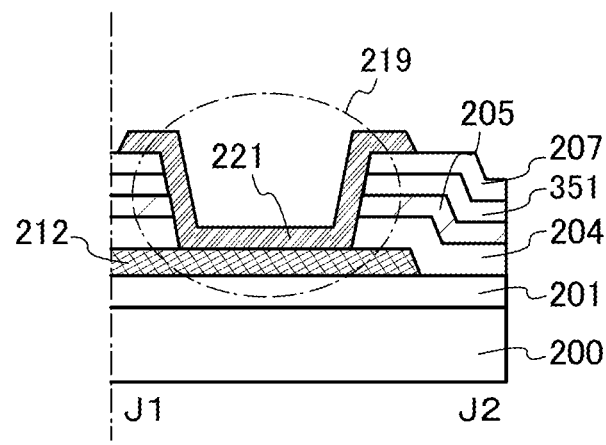
FIG. 7B1
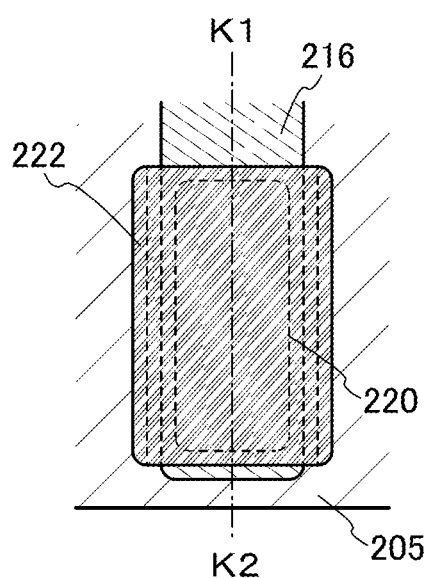
FIG. 7B2
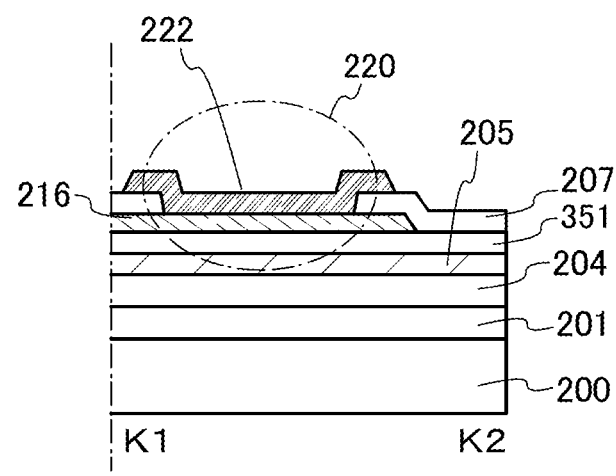

FIG. 19A1
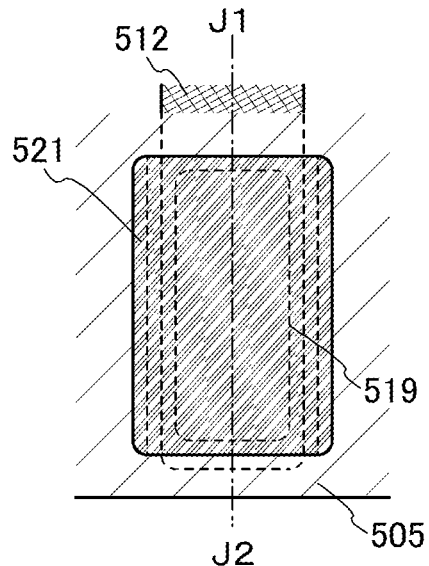
FIG. 19A2
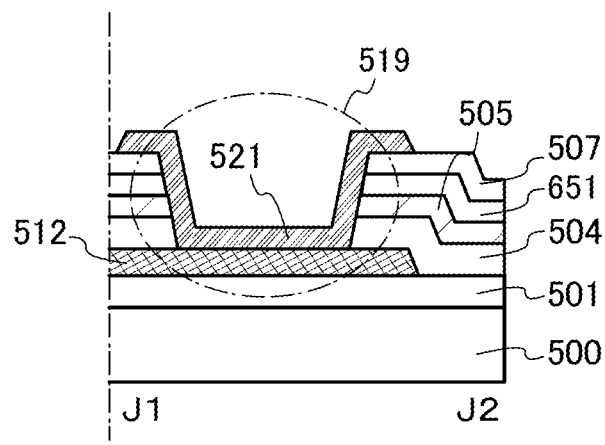
FIG. 19B1
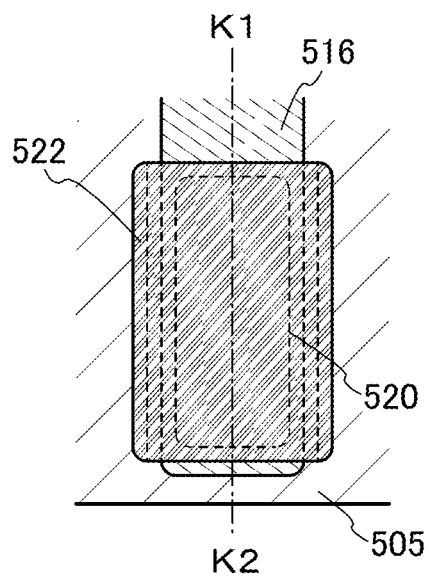
FIG. 19B2
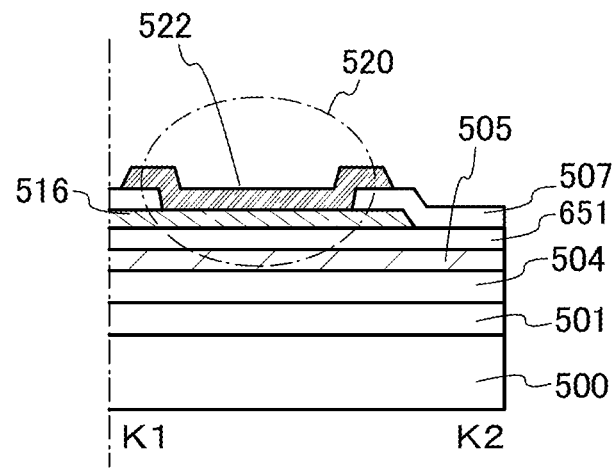

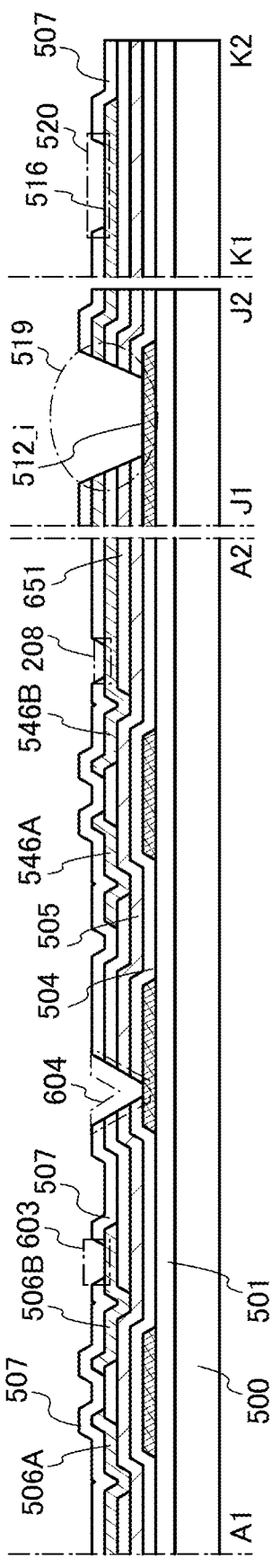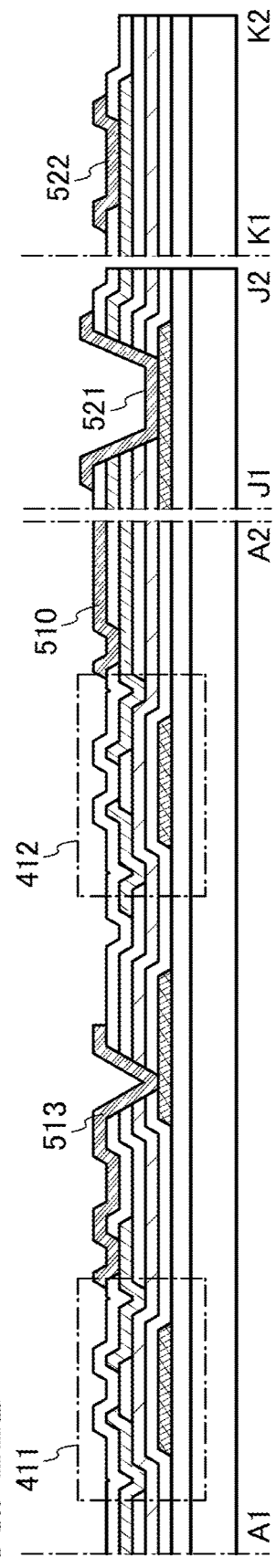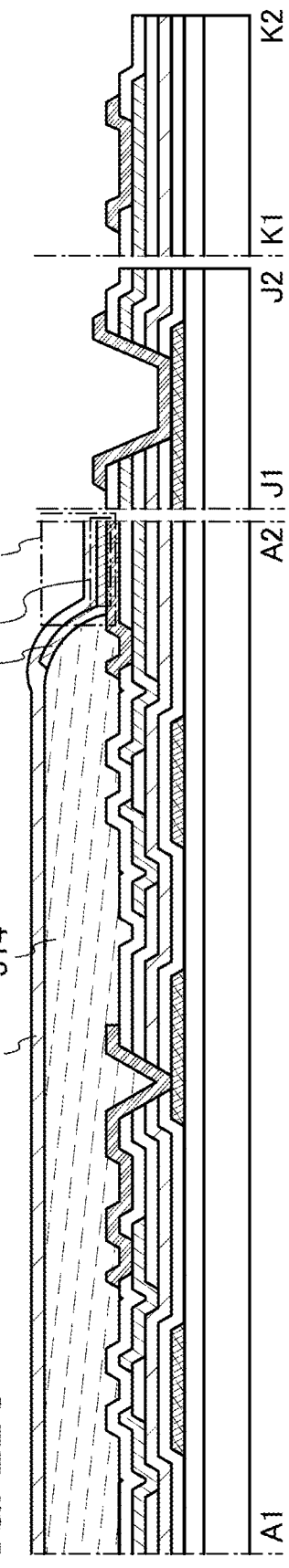

LIQUID CRYSTAL DISPLAY DEVICE, EL DISPLAY DEVICE, AND MANUFACTURING METHOD THEREOF

CROSS-REFERENCE TO RELATED APPLICATIONS

This application is a continuation of U.S. application Ser. No. 15/435,693, filed Feb. 17, 2017, now pending, which is a continuation of U.S. application Ser. No. 13/667,271,filed Nov. 2, 2012, now U.S. Pat. No. 9,576,982, which claims the benefit of foreign priority applications filed in Japan as Serial No. 2011-247360 on Nov. 11, 2011, and Ser. No. 2011-9247367 on Nov. 11, 2011, all of which are incorporated by reference.

BACKGROUND OF THE INVENTION

1. Field of the Invention

The present invention relates to a semiconductor device, a liquid crystal display device, an EL display device, and methods for manufacturing these devices.

In this specification, a semiconductor device means all types of devices that can function by utilizing semiconductor characteristics, and a transistor, a semiconductor circuit, a memory device, an imaging device, a display device, an electro-optical device, an electronic device, and the like are all semiconductor devices.

2. Description of the Related Art

Display devices, such as active matrix liquid crystal display devices and electroluminescent (EL) display devices, which include transistors have been in practical use. Transistors are widely used for electronic devices such as integrated circuits (ICs) as well as for display devices.

In recent years, demands for display devices with larger screen size, higher definition, and higher aperture ratio are increasing. In addition, display devices are required to have high reliability and be produced at low cost.

In liquid crystal display devices and EL display devices, transistors are used as switching elements, driving transistors, and the like. Therefore, it is important to improve the reliability of the transistor for the display device to have high reliability. In addition, it is effective to simplify the manufacturing process of the transistor in order to simplify the manufacturing process of the display device for the purpose of reducing production cost.

Suppressing deterioration of a semiconductor layer is an effective way to improve the reliability of a transistor. Deterioration of the semiconductor layer is caused by damage due to an etching step in a photolithography step or by diffusion of an impurity element from another layer to the semiconductor layer. Therefore, in order to suppress deterioration of the semiconductor layer, it is effective to provide a layer for reducing damage to the semiconductor layer due to a manufacturing step such as a photolithography step or to provide a blocking layer for preventing diffusion of an impurity element from another layer to the semiconductor layer.

Meanwhile, reduction in the number of photolithography steps or simplification of the photolithography step is effective for simplification of a manufacturing process of a transistor. For example, when one photolithography step is added, the following steps are further needed: resist application, prebaking, light exposure, development, post-baking, and the like and, moreover, steps before and after the aforementioned steps, such as film formation, etching, resist removal, cleaning, and drying. The number of steps is significantly increased only by adding one photolithography step in the manufacturing process.

As an example, in a manufacturing process of a bottom-gate transistor which is used as a switching element in a large-sized liquid crystal display device, the transistor is generally manufactured through photolithography steps using at least five photomasks. Specifically, in the case of a transistor for a pixel in the liquid crystal display device, five photolithography steps are needed: a step of forming a gate electrode (including a wiring formed in the same layer), a step of forming an island-shaped semiconductor layer, a step of forming a source electrode and a drain electrode (including a wiring formed in the same layer), a step of forming an opening (contact hole) (the step includes removal of an insulating layer or the like in a region other than the opening), and a step of forming a pixel electrode (including a wiring or the like formed in the same layer). Accordingly, omitting one photomask or simplifying the photolithography step is highly effective in shortening the manufacturing process of the transistor.

As another example, in a manufacturing process of a bottom-gate transistor which is used as a switching element in a large-sized EL display device, the transistor is generally manufactured through photolithography steps using at least six photomasks. Specifically, in the case of a transistor for a pixel in the EL display device, six photolithography steps are needed: a step of forming a gate electrode (including a wiring formed in the same layer), a step of forming an island-shaped semiconductor layer, a step of forming a source electrode and a drain electrode (including a wiring formed in the same layer), a step of forming an opening (contact hole) (the step includes removal of an insulating layer or the like in a region other than the opening), a step of forming one electrode of an EL element (including a wiring or the like formed in the same layer), and a step of forming a partition layer used for separately coloring EL layers with corresponding colors. Accordingly, omitting one photomask or simplifying the photolithography step is highly effective in shortening the manufacturing process of the transistor.

Therefore, many techniques for reducing the number of photolithography steps or simplifying the photolithography step in a manufacturing process of a transistor have been developed. Examples of techniques for simplifying the photolithography step include techniques such as backside light exposure, resist reflow, and a lift-off method. A technique using a multi-tone mask (called a half-tone mask or a gray-tone mask) is widely known as a technique for simplifying the photolithography step in a manufacturing process of a transistor. A technique for reducing the number of manufacturing steps by using a multi-tone mask is disclosed in Patent Document 1, for example.

REFERENCE

Patent Document

[Patent Document 1] Japanese Published Patent Application No. 2003-179069

SUMMARY OF THE INVENTION

However, when the number of photolithography steps is reduced or the photolithography step is simplified in order to reduce the production cost, part of the semiconductor layer is exposed to an etching gas or an etchant in an etching step of the semiconductor layer or in an etching step for forming the source electrode (also referred to as a first electrode) and the drain electrode (also referred to as a second electrode), which causes a problem such as deterioration of the semiconductor layer.

In order to suppress deterioration of the semiconductor layer, a protective layer for reducing damage to the semiconductor layer due to an etching step or the like may be provided. However, another photomask is needed in order to provide the protective layer over the semiconductor layer and provide openings for connection between the semiconductor layer and the first and second electrodes in the protective layer. In the case of a bottom-gate transistor used as a transistor for a pixel in a liquid crystal display device, this increase in the number of photomasks results in a need of at least six photomasks. In the case of a bottom-gate transistor used as a transistor for a pixel in an EL display device, this increase in the number of photomasks results in a need of at least seven photomasks. Thus, mere formation of the protective layer for reducing damage due to an etching step or the like for the purpose of suppressing deterioration of the semiconductor layer causes a problem such as an increase in the number of photolithography steps and etching steps.

In view of the above, an object of one embodiment of the present invention is to suppress deterioration of a semiconductor layer without increasing the number of photolithography steps in a manufacturing process of a transistor.

Another object of one embodiment of the present invention is to improve the reliability of a transistor without increasing the number of photomasks used in a manufacturing process of a display device including the transistor.

One embodiment of the present invention is a semiconductor device which can be manufactured without increasing the number of photomasks by omitting a photolithography step and an etching step for forming an island-shaped semiconductor layer. Specifically, a semiconductor device used for a liquid crystal display device is manufactured with five photolithography steps: a step of forming a gate electrode (including a wiring formed in the same layer), a step of forming a protective layer for reducing damage due to an etching step or the like, a step of forming a first electrode and a second electrode (including a wiring formed in the same layer), a step of forming an opening (the step includes removal of an insulating layer or the like in a region other than the opening), and a step of forming a pixel electrode (including a wiring or the like formed in the same layer). The semiconductor device according to one embodiment of the present invention includes a groove portion which is formed in the step of forming the opening and separates the semiconductor layer. In the semiconductor device according to one embodiment of the present invention, openings are provided in the protective layer over the semiconductor layer; thus, the first electrode and the second electrode are connected to the semiconductor layer through the openings, and deterioration of the semiconductor layer which overlaps with the protective layer in a region other than the openings is suppressed.

One embodiment of the present invention is a liquid crystal display device which includes a transistor including a gate electrode, a semiconductor layer, a protective layer, a first electrode, and a second electrode; a first wiring electrically connected to the gate electrode; a second wiring electrically connected to the first electrode; a pixel electrode electrically connected to the second electrode; a capacitor wiring; and a groove portion. The protective layer is provided over and in contact with the semiconductor layer, and the semiconductor layer and the protective layer overlap with the first wiring, the second wiring, the pixel electrode, and the capacitor wiring. The first electrode and the second electrode are electrically connected to the semiconductor layer through openings formed in the protective layer. The groove portion is formed to cross the first wiring in a line width direction of the first wiring. The groove portion is formed to cross the capacitor wiring in a line width direction of the capacitor wiring. Further, the groove portion is formed to extend beyond an edge of the pixel electrode in a direction parallel to a direction in which the second wiring extends.

In the liquid crystal display device according to one embodiment of the present invention, it is preferable that a semiconductor layer be not provided on a bottom surface of the groove portion.

In the liquid crystal display device according to one embodiment of the present invention, it is preferable that a semiconductor layer be provided on a side surface of the groove portion.

In the liquid crystal display device according to one embodiment of the present invention, the groove portion preferably overlaps with an alignment film.

In the liquid crystal display device according to one embodiment of the present invention, at least part of the groove portion preferably overlaps with the pixel electrode.

In the liquid crystal display device according to one embodiment of the present invention, the semiconductor layer preferably includes an oxide semiconductor.

In the liquid crystal display device according to one embodiment of the present invention, the protective layer preferably includes an oxide having an insulating property.

In the liquid crystal display device according to one embodiment of the present invention, the oxide having an insulating property preferably is a material in which, in an oxide containing indium, gallium, and zinc, part of the gallium is replaced with at least one element selected from titanium, zirconium, hafnium, and germanium.

One embodiment of the present invention is a method for manufacturing a liquid crystal display device, including the steps of forming a gate electrode over a substrate by a first photolithography step; forming a gate insulating layer over the gate electrode; forming a semiconductor layer over the gate insulating layer; forming a protective layer having openings over the semiconductor layer by a second photolithography step; forming a first electrode and a second electrode over the protective layer and in contact with the semiconductor layer through the openings by a third photolithography step; forming an insulating layer over the first electrode and the second electrode; forming an opening by selectively removing part of the insulating layer which overlaps with the second electrode and forming a groove portion by removing part of the insulating layer, part of the semiconductor layer, and part of the gate insulating layer by a fourth photolithography step; and forming a pixel electrode over the insulating layer by a fifth photolithography step.

In the method for manufacturing a liquid crystal display device, according to one embodiment of the present invention, a base layer is preferably formed between the substrate and the gate electrode.

In the method for manufacturing a liquid crystal display device, according to one embodiment of the present invention, the semiconductor layer preferably includes an oxide semiconductor.

The method for manufacturing a liquid crystal display device, according to one embodiment of the present invention preferably includes a step of cleaning a surface of the semiconductor layer exposed in the openings in the protective layer after formation of the openings.

One embodiment of the present invention is a semiconductor device which can be manufactured without increasing the number of photomasks by omitting a photolithography step and an etching step for forming an island-shaped semiconductor layer. Specifically, a semiconductor device used for an EL display device is manufactured with six photolithography steps: a step of forming a gate electrode (including a wiring formed in the same layer), a step of forming a protective layer for reducing damage due to an etching step or the like, a step of forming a source electrode and a drain electrode (including a wiring formed in the same layer), a step of forming an opening (the step includes removal of an insulating layer or the like in a region other than the opening), a step of forming one electrode of an EL element (including a wiring or the like formed in the same layer), and a step of forming a partition layer used for separately coloring EL layers with corresponding colors. The semiconductor device according to one embodiment of the present invention includes a groove portion which is formed in the step of forming the opening and separates the semiconductor layer. In the semiconductor device according to one embodiment of the present invention, openings are provided in the protective layer over the semiconductor layer; thus, the source electrode and the drain electrode are connected to the semiconductor layer through the openings, and deterioration of the semiconductor layer which overlaps with the protective layer in a region other than the openings is suppressed.

One embodiment of the present invention is an EL display device which includes a first transistor, a second transistor, a first wiring electrically connected to a gate electrode of the first transistor, a second wiring electrically connected to one of electrodes serving as a source and a drain of the first transistor, a third wiring electrically connected to one of electrodes serving as a source and a drain of the second transistor, a fourth wiring electrically connecting the other of the electrodes serving as the source and the drain of the first transistor to a gate electrode of the second transistor, an EL element electrically connected to the other of the electrodes serving as the source and the drain of the second transistor, a capacitor formed in a region where the other of the electrodes serving as the source and the drain of the first transistor overlaps with the third wiring, and a groove portion. A protective layer is provided over and in contact with a semiconductor layer of the first transistor and the second transistor, and the semiconductor layer and the protective layer overlap with the first wiring, the second wiring, the third wiring, the fourth wiring, and the EL element. The electrodes serving as the sources and the drains of the first transistor and the second transistor are electrically connected to the semiconductor layer through openings formed in the protective layer. The groove portion is formed to cross the first wiring in a line width direction of the first wiring. Further, the groove portion is formed to cross the gate electrode of the second transistor in a line width direction of the gate electrode of the second transistor in a direction parallel to a direction in which the second wiring and the third wiring extend.

In the EL display device according to one embodiment of the present invention, it is preferable that a semiconductor layer be not provided on a bottom surface of the groove portion.

In the EL display device according to one embodiment of the present invention, it is preferable that a semiconductor layer be provided on a side surface of the groove portion.

In the EL display device according to one embodiment of the present invention, the groove portion preferably overlaps with a partition layer.

In the EL display device according to one embodiment of the present invention, one electrode of the EL element and the fourth wiring are preferably formed in the same layer.

In the EL display device according to one embodiment of the present invention, the semiconductor layer preferably includes an oxide semiconductor.

In the EL display device according to one embodiment of the present invention, the protective layer preferably includes an oxide having an insulating property.

In the EL display device according to one embodiment of the present invention, the oxide having an insulating property preferably is a material in which, in an oxide containing indium, gallium, and zinc, part of the gallium is replaced with at least one element selected from titanium, zirconium, hafnium, and germanium.

One embodiment of the present invention is a method for manufacturing an EL display device, including the steps of forming a gate electrode over a substrate by a first photolithography step; forming a gate insulating layer over the gate electrode; forming a semiconductor layer over the gate insulating layer; forming a protective layer having openings over the semiconductor layer by a second photolithography step; forming a source electrode and a drain electrode over the protective layer and in contact with the semiconductor layer through the openings in the protective layer by a third photolithography step; forming an insulating layer over the source electrode and the drain electrode; forming an opening by selectively removing part of the insulating layer and forming a groove portion by removing part of the insulating layer, part of the semiconductor layer, and part of the gate insulating layer by a fourth photolithography step; forming one electrode of an EL element over the insulating layer and the opening in the insulating layer by a fifth photolithography step; and forming a partition layer used for separately coloring EL layers of EL elements with corresponding colors over the insulating layer and part of the one electrode of the EL element by a sixth photolithography step.

In the method for manufacturing an EL display device, according to one embodiment of the present invention, a base layer is preferably formed between the substrate and the gate electrode.

In the method for manufacturing an EL display device, according to one embodiment of the present invention, the semiconductor layer preferably includes an oxide semiconductor.

The method for manufacturing an EL display device, according to one embodiment of the present invention preferably includes a step of cleaning a surface of the semiconductor layer exposed in the openings in the protective layer after formation of the openings.

According to one embodiment of the present invention, it is possible to suppress deterioration of a semiconductor layer without increasing the number of photolithography steps in a manufacturing process of a transistor.

According to one embodiment of the present invention, it is possible to improve the reliability of a transistor without increasing the number of photomasks used in a manufacturing process of a display device including the transistor.

BRIEF DESCRIPTION OF THE DRAWINGS

FIGS. 4A to 4C are cross-sectional views illustrating one embodiment of the present invention.

FIGS. 7A1 and 7B1 and FIGS. 7A2 and 7B2 are top views and cross-sectional views, respectively, illustrating one embodiment of the present invention.

FIGS. 19A1 and 19B1 and FIGS. 19A2 and 19B2 are top views and cross-sectional views, respectively, illustrating one embodiment of the present invention.

FIGS. 22A to 22C are cross-sectional views illustrating one embodiment of the present invention.

DETAILED DESCRIPTION OF THE INVENTION

Figure 1:
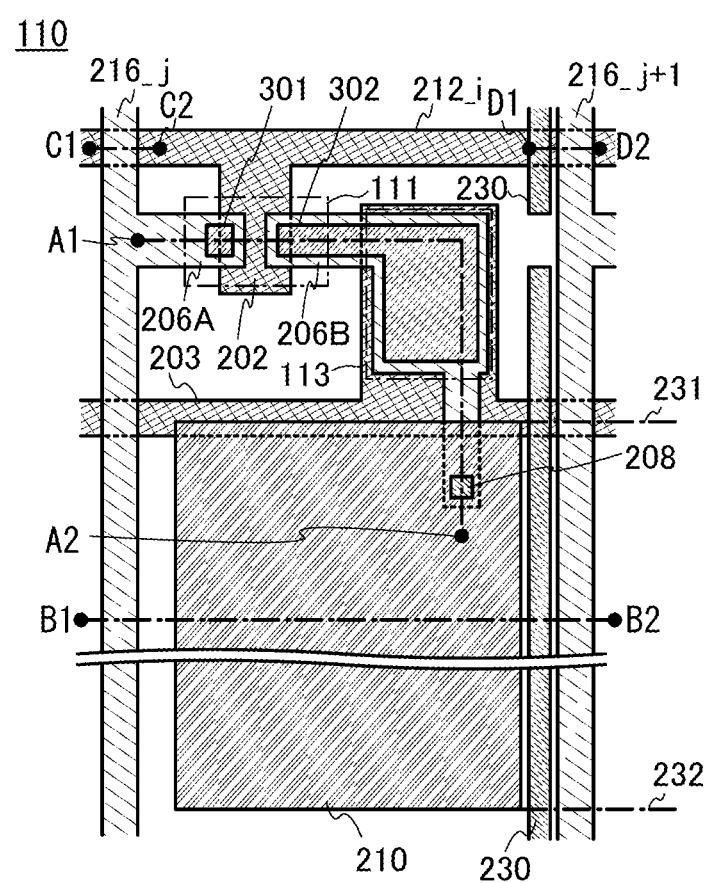
FIG. 1 is a top view illustrating one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

In this specification and the like, ordinal numbers such as "first", "second", and "third" are used in order to avoid confusion among components, and the terms do not limit the components numerically.

Note that the position, size, range, or the like of each structure illustrated in drawings and the like is not accurately represented in some cases for easy understanding. Therefore, the disclosed invention is not necessarily limited to the position, size, range, or the like disclosed in the drawings and the like.

Functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Embodiment 1

In this embodiment, examples of a pixel configuration of a liquid crystal display device formed through a process in which the number of photomasks and the number of photolithography steps are reduced, and an example of a method for forming the pixel configuration will be described with reference to FIG. 1, FIGS. 2A to 2D, FIG. 3, FIGS. 4A to 4C, FIGS. 5A and 5B, FIGS. 6A and 6B, FIGS. 7A1, 7A2, 7B1, and 7B2, FIGS. 8A and 8B, FIGS. 9A to 9C, and FIGS. 10A to 10C.

Figure 6A:
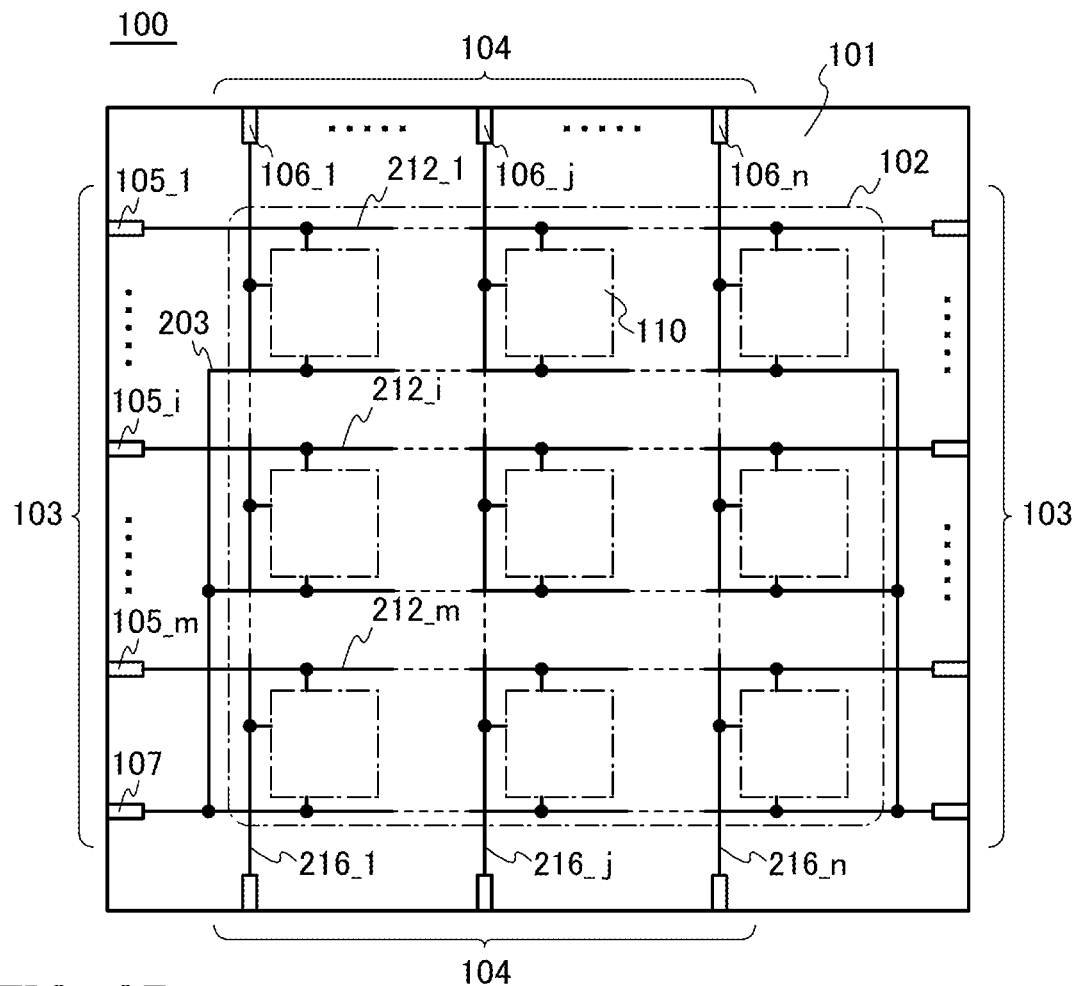
FIGS. 6A and 6B are circuit diagrams illustrating one embodiment of the present invention.

FIG. 6A illustrates an example of the configuration of a semiconductor device 100 that is used in a liquid crystal display device. The semiconductor device 100 includes a pixel region 102, a terminal portion 103 including in terminals 105 (in is an integer of greater than or equal to 1) and a terminal 107, and a terminal portion 104 including n terminals 106 (n is an integer of greater than or equal to 1) over a substrate 101. Further, the semiconductor device 100 includes in wirings 212 connected to the terminal portion 103, n wirings 216 connected to the terminal portion 104, and a wiring 203. The pixel region 102 includes a plurality of pixels 110 arranged in a matrix of in (rows) and n (columns). A pixel 110(i,j) in the i-th row and the j-th column (i is an integer of greater than or equal to 1 and less than or equal to m, and j is an integer of greater than or equal to 1 and less than or equal to n) is connected to a wiring 212_i and a wiring 216_j. In addition, each pixel is connected to the wiring 203 serving as a capacitor electrode or a capacitor wiring, and the wiring 203 is connected to the terminal 107. The wiring 212_i is connected to a terminal 105_i, and the wiring 216_j is connected to a terminal 106_j.

The terminal portion 103 and the terminal portion 104 are external input terminals and are connected to external control circuits with flexible printed circuits (FPC) or the like. Signals supplied from the external control circuits are input to the semiconductor device 100 through the terminal portion 103 and the terminal portion 104. In FIG. 6A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 100 is facilitated. Moreover, the influence of signal delay due to an increase in wiring resistance, which is caused by an increase in size or in definition of the semiconductor device 100, can be reduced. Moreover, the semiconductor device 100 can have redundancy, so that the reliability of the semiconductor device 100 can be improved. Although two terminal portions 103 and two terminal portions 104 are provided in FIG. 6A, a structure in which one terminal portion 103 and one terminal portion 104 are provided may also be employed.

Figure 6B:
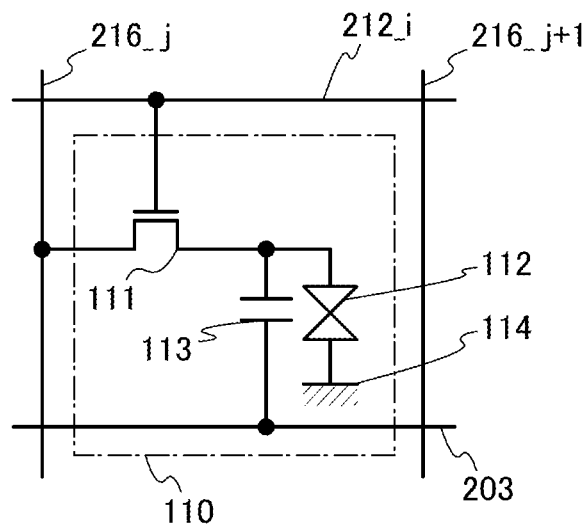

FIG. 6B illustrates a circuit configuration of the pixel 110. The pixel 110 includes a transistor 111, a liquid crystal element 112, and a capacitor 113. A gate electrode of the transistor 111 is connected to the wiring 212_i, and one of a source electrode and a drain electrode (hereinafter referred to as a first electrode) of the transistor 111 is connected to the wiring 216_j. The other of the source electrode and the drain electrode (hereinafter referred to as a second electrode) of the transistor 111 is connected to one electrode of the liquid crystal element 112 and one electrode of the capacitor 113. The other electrode of the liquid crystal element 112 is connected to an electrode 114. The potential of the electrode 114 may be a fixed potential such as 0 V, GND, or a common potential. The other electrode of the capacitor 113 is connected to the wiring 203.

The transistor 111 has a function of selecting whether an image signal supplied from the wiring 216_j is input to the liquid crystal element 112. When a signal that turns on the transistor 111 is supplied to the wiring 212_i, an image signal is supplied to the liquid crystal element 112 from the wiring 216_j through the transistor 111. The light transmittance of the liquid crystal element 112 is controlled depending on the supplied image signal (potential). The capacitor 113 has a function as a storage capacitor (also referred to as a Cs capacitor) for holding a potential supplied to the liquid crystal element 112. The capacitor 113 need not necessarily be provided;

however, in the case of providing the capacitor 113, variation in the potential applied to the liquid crystal element 112, which is caused by a current flowing between the first electrode and the second electrode in an off state of the transistor 111 (off-state current), can be suppressed.

For a semiconductor layer where a channel of the transistor 111 is formed, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide. The display device described in this embodiment has a structure in which the semiconductor layer remains in the pixel region; thus, in the case where the display device including the semiconductor is used for a transmissive display device, the transmittance of visible light is preferably increased by, for example, thinning the semiconductor layer as much as possible.

It is preferable to use an oxide semiconductor for the semiconductor layer where the channel of the transistor 111 is formed. An oxide semiconductor has an energy gap that is as wide as 3.0 eV or more, and thus has high transmittance with respect to visible light. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Thus, the potential applied to the liquid crystal element 112 can be held without the capacitor 113. In addition, a liquid crystal display device with low power consumption can be provided.

Next, an example of the configuration of the pixel 110 illustrated in FIGS. 6A and 6B will be described with reference to FIG. 1 and FIGS. 2A to 2D. FIG. 1 is a top view illustrating a plan structure of the pixel 110, and FIGS. 2A to 2D are cross-sectional views illustrating a stacked structure of the pixel 110. Note that chain lines A1-A2, B1-B2, C1-C2, and D1-D2 in FIG. 1 correspond to cross sections A1-A2, B1-B2, C1-C2, and D1-D2 in FIGS. 2A to 2D, respectively.

In the transistor 111 described in this embodiment, a first electrode 206A and a second electrode 206B face each other with a constant distance therebetween. Note that the first electrode 206A and the second electrode 206B may have other patterns; for example, the second electrode 206B may be surrounded by the first electrode 206A that is U-shaped (or C-shaped, square-bracket-like shaped, or horseshoe-shaped).

The wiring 203 serves as a capacitor electrode or a capacitor wiring. In this embodiment, the capacitor 113 is formed using the overlapping wiring 203 and second electrode 206B.

The semiconductor device described in this embodiment has a structure in which the semiconductor layer 205 remains in the entire pixel region 102 because a photolithography step and an etching step for forming an island-shaped semiconductor layer are not performed in order to simplify the manufacturing process. Consequently, a first parasitic transistor in which the wiring 212_i functions as a gate electrode, the wiring 216_j functions as one of a source electrode and a drain electrode, and the wiring 216_j+1 functions as the other of the source electrode and the drain electrode is formed.

Further, a second parasitic transistor in which the wiring 203 functions as a gate electrode, the wiring 216_j functions as one of a source electrode and a drain electrode, and the wiring 216_j+1 functions as the other of the source electrode and the drain electrode is formed.

Furthermore, a third parasitic transistor in which a pixel electrode 210 functions as a gate electrode, an insulating layer 207 functions as a gate insulating layer, the wiring 216_j functions as one of a source electrode and a drain electrode, and the wiring 216_j+1 functions as the other of the source electrode and the drain electrode is formed.

Note that a parasitic transistor is a transistor formed due to formation of a channel in a region where a transistor is not intentionally formed but the semiconductor layer remains. In the structure of this embodiment, damage on the semiconductor layer can be reduced by the omission of the photolithography step and the etching step for forming the island-shaped semiconductor layer; thus, deterioration of the semiconductor layer can be suppressed.

When such a potential as to turn on the transistor 111 is supplied to the wiring 212_i, the first parasitic transistor is also turned on, so that the wiring 216_j and the wiring 216_j+1 are electrically connected to each other. The electrical connection between the wiring 216_j and the wiring 216_j+1 by the first parasitic transistor causes interference of image signals therebetween; accordingly, it becomes difficult to supply accurate image signals to the liquid crystal element 112.

In the case where the second parasitic transistor functions as an n-channel transistor, when the potential of the wiring 216_j or the wiring 216_j+1 is lower than that supplied to the wiring 203 and the absolute value of the potential difference is larger than the threshold voltage of the second parasitic transistor, a channel is formed in the semiconductor layer 205 located below the pixel electrode 210 and the second parasitic transistor is on.

When the second parasitic transistor is on, the wiring 216_$j$ and the wiring 216_$j$+1 are electrically connected to each other. The electrical connection between the wiring 216_$j$ and the wiring 216_$j$+1 by the second parasitic transistor causes interference of image signals therebetween; accordingly, it becomes difficult to supply accurate image signals to the liquid crystal element 112.

In the case where the third parasitic transistor functions as an n-channel transistor, when the potential of the wiring 216_$j$ or the wiring 216_$j$+1 is lower than the potential supplied to the pixel electrode 210 or the potential held in the pixel electrode 210 and the absolute value of the potential difference is larger than the threshold voltage of the third parasitic transistor, a channel is formed in the semiconductor layer 205 located below the pixel electrode 210 and the third parasitic transistor is on.

n the third parasitic transistor is on, the wiring 216_$j$ and the wiring 216_$j$+1 are electrically connected to each other. The electrical connection between the wiring 216_$j$ and the wiring 216_$j$+by the third parasitic transistor causes interference of image signals therebetween; accordingly, it becomes difficult to supply accurate image signals to the liquid crystal element 112. When the pixel electrode 210 is formed close to the wiring 216_$j$ or the wiring 216_$j$+1 for the purpose of increasing the pixel aperture ratio or the like, the influence of the third parasitic transistor is increased.

In view of this, a structure in which a groove portion 230 in which the semiconductor layer 205 is removed is provided in the pixel 110 so that the above-described parasitic transistors are not formed is employed in this embodiment. The groove portion 230 is provided so as to cross the wiring 212_$i$ in the line width direction of the wiring 212_$i$ across both edges thereof; in this way, formation of the first parasitic transistor can be prevented. In addition, the groove portion 230 is provided so as to cross the wiring 203 in the line width direction of the wiring 203 across both edges thereof; in this way, formation of the second parasitic transistor can be prevented. Note that a plurality of groove portions 230 may be provided over the wiring 212_$i$, and a plurality of groove portions 230 may be provided over the wiring 203.

Furthermore, the groove portion 230 is formed at least between the wiring 216_$j$ and the pixel electrode 210 or between the wiring 216_$j$+1 and the pixel electrode 210, along a direction parallel to the direction in which the wiring 216_$j$ or the wiring 216_$j$+1 extends, so as to extend beyond an edge 231 and an edge 232 of the pixel electrode 210. In this way, formation of the third parasitic transistor can be prevented. The groove portion 230 is not necessarily provided in parallel to the wiring 216_$j$ or the wiring 216_$j$+1 and may have a flection portion or a bending portion.

In FIG. 1, the groove portions 230 are separated in a region between the wiring 212_$i$ and the wiring 203. However, the groove portion 230 provided to cross the wiring 212_$i$ in the line width direction of the wiring 212_$i$ across the both edges thereof may be extended and connected to the groove portion 230 provided to cross the wiring 203 in the line width direction of the wiring 203 across the both edges thereof.

It is also possible to prevent formation of the second parasitic transistor without providing the groove portion 230 over the wiring 203 by setting the potential of the wiring 203 to be lower than the potential supplied to the wiring 216_$j$ or the wiring 216_$j$+1. However, in this case, a power supply for supplying the above-described potential to the wiring 203 needs to be provided additionally.

Although the size of the groove portion 230 in which the semiconductor layer 205 is removed is not particularly limited, for surely preventing formation of a parasitic transistor, the width of the portion where the semiconductor layer is removed in the groove portion 230 in a direction perpendicular to the direction in which the wiring 216_$j$ or the wiring 216_$j$+1 extends is preferably 1 µm or more, further preferably 2 µm or more.

In the transistor 111 of this embodiment, a protective layer 351 is provided over the semiconductor layer 205 to suppress deterioration of the semiconductor layer 205. In particular, an opening 301 and an opening 302 are provided in parts of the protective layer 351 over the semiconductor layer 205 to connect the first electrode 206A and the second electrode 206B to the semiconductor layer 205 in this embodiment. This structure makes it possible to suppress deterioration of the semiconductor layer 205 due to exposure of part of the semiconductor layer 205 to an etching gas or an etchant in the etching step of the semiconductor layer 205 or the etching step for forming the first electrode 206A and the second electrode 206B.

Note that the opening 301 and the opening 302 in the layout of the pixel 110 in FIG. 1 are preferably formed by processing with a photomask using optical proximity correction (OPC). When the opening 301 and the opening 302 for connecting the first electrode 206A and the second electrode 206B to the semiconductor layer 205 in the transistor 111 are formed with a photomask using OPC, deformation of the openings due to diffraction of light is suppressed, so that variations in channel width and channel length of the transistor can be reduced.

The cross section A1-A2 shows the stacked structure of the transistor 111 and the stacked structure of the capacitor 113. The transistor 111 is a bottom-gate transistor. The cross section B1-B2 shows the stacked structure from the wiring 216_$j$ to the wiring 216_$j$+1, including the pixel electrode 210 and the groove portion 230. Further, the cross section C1-C2 shows the stacked structure of an intersection of the wiring 216_$j$ and the wiring 212_$i$. The cross section D1-D2 shows the groove portion 230 and the stacked structure of an intersection of the wiring 216_$j$+1 and the wiring 212_$i$.

Figure 2C:
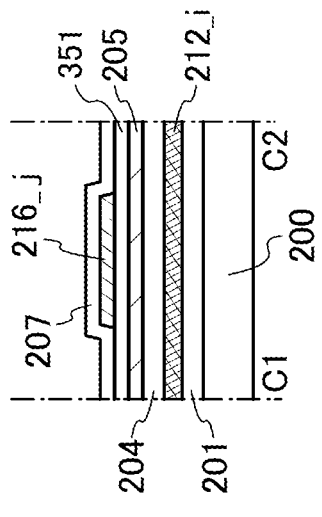
FIGS. 2A to 2D are cross-sectional views illustrating one embodiment of the present invention.
Figure 2D:
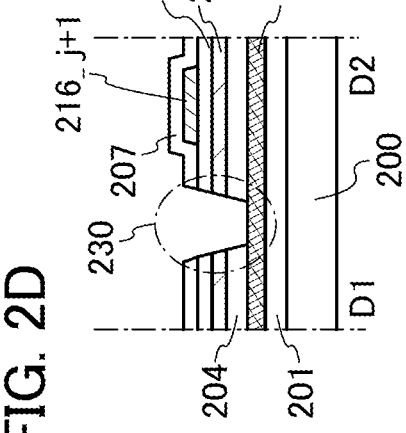
Figure 2A:
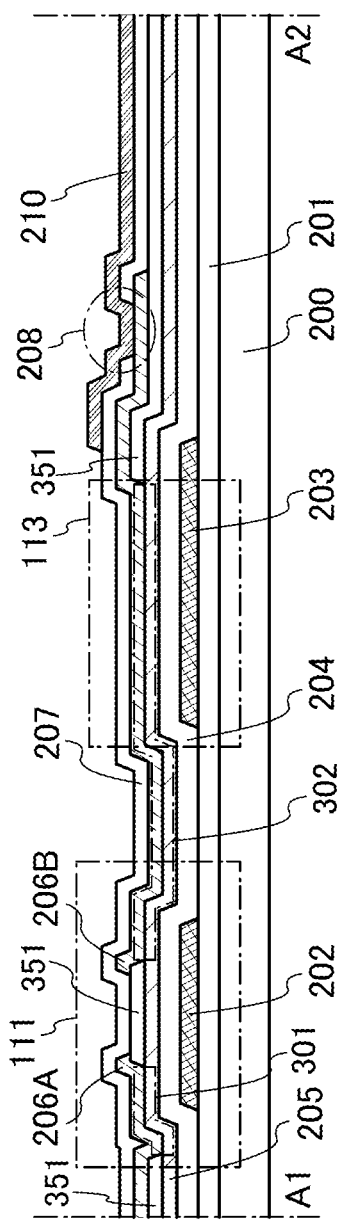

In the cross section A1-A2 in FIG. 2A, a base layer 201 is formed over a substrate 200, and a gate electrode 202 and the wiring 203 are formed over the base layer 201. Over the gate electrode 202 and the wiring 203, a gate insulating layer 204 and the semiconductor layer 205 are formed. The protective layer 351 is formed over the semiconductor layer 205. The first electrode 206A and the second electrode 206B are formed over the protective layer 351. The semiconductor layer 205 is connected to the first electrode 206A and the second electrode 206B through the opening 301 and the opening 302 formed in the protective layer 351. Further, the insulating layer 207 is formed over the first electrode 206A and the second electrode 206B to be in contact with part of the protective layer 351. The pixel electrode 210 is formed over the insulating layer 207. The pixel electrode 210 is connected to the second electrode 206B through an opening 208 formed in the insulating layer 207.

A portion in which the wiring 203 and the second electrode 206B overlap with each other with the gate insulating layer 204 and the semiconductor layer 205 interposed therebetween functions as the capacitor 113. The gate insulating layer 204 and the semiconductor layer 205 function as a dielectric layer. In the case where a multi-layer dielectric layer is formed between the wiring 203 and the pixel electrode 210, even when a pinhole is generated in one dielectric layer, the pinhole is covered with another dielectric layer; accordingly, the capacitor 113 can operate normally. The relative permittivity of an oxide semiconductor is as high as 14 to 16. Accordingly, when an oxide semiconductor is used for the semiconductor layer 205, the capacitance value of the capacitor 113 can be increased.

Figure 2B:
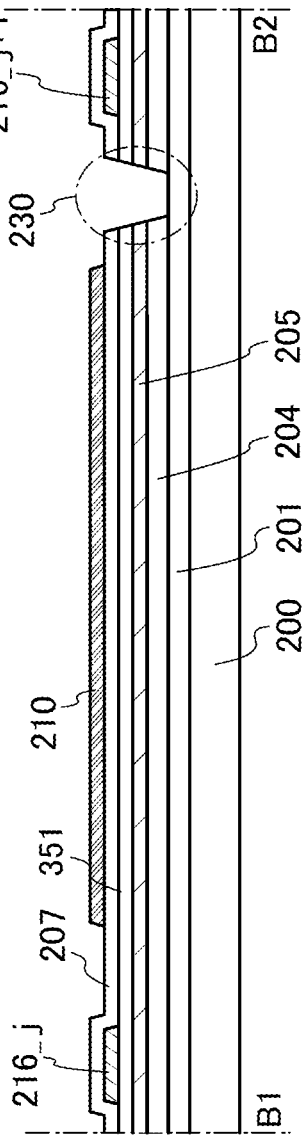

In the cross section B1-B2 illustrated in FIG. 2B, the base layer 201 is formed over the substrate 200, the gate insulating layer 204 is formed over the base layer 201, and the semiconductor layer 205 is formed over the gate insulating layer 204. The protective layer 351 is formed over the semiconductor layer 205. The wiring 216_j and the wiring 216_j+1 are formed over the protective layer 351, and the insulating layer 207 is formed over the protective layer 351, the wiring 216_j, and the wiring 216_j+1. Further, the pixel electrode 210 is formed over the insulating layer 207.

The groove portion 230 is formed between the wiring 216_j+1 and the pixel electrode 210 by removing part of the gate insulating layer 204, part of the semiconductor layer 205, part of the protective layer 351, and part of the insulating layer 207. The groove portion 230 does not include a semiconductor layer at least on its bottom surface.

In the cross section C1-C2 illustrated in FIG. 2C, the base layer 201 is formed over the substrate 200, and the wiring 212_i is formed over the base layer 201. Over the wiring 212_i, the gate insulating layer 204 and the semiconductor layer 205 are formed. The protective layer 351 is formed over the semiconductor layer 205. Further, the wiring 216_j is formed over the protective layer 351, and the insulating layer 207 is formed over the wiring 216_j.

In the cross section D1-D2 illustrated in FIG. 2D, the base layer 201 is formed over the substrate 200, and the wiring 212_i is formed over the base layer 201. Over the wiring 212_i, the gate insulating layer 204 and the semiconductor layer 205 are formed. The protective layer 351 is formed over the semiconductor layer 205. The wiring 216_j+1 is formed over the protective layer 351, and the insulating layer 207 is formed over the wiring 216_j+1. In addition, the groove portion 230 is formed by removing part of the gate insulating layer 204, part of the semiconductor layer 205, part of the protective layer 351, and part of the insulating layer 207.

Figure 3:
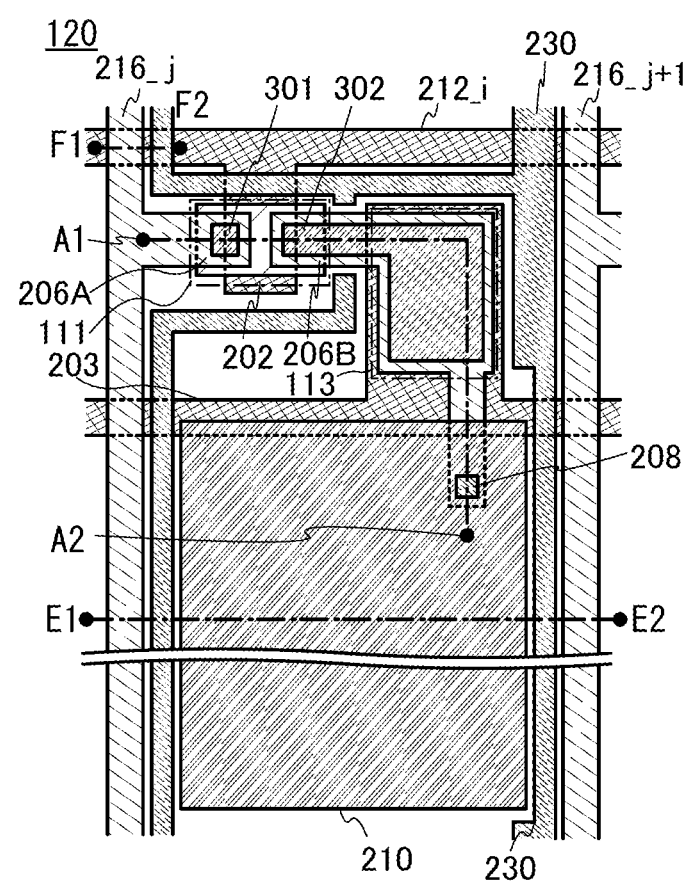
FIG. 3 is a top view illustrating one embodiment of the present invention.

Next, an example of the pixel configuration, which is different from that illustrated in FIG. 1 will be described with reference to FIG. 3 and FIGS. 4A to 4C. FIG. 3 is a top view illustrating a plan structure of a pixel 120. Cross sections A1-A2, E1-E2, and F1-F2 in FIGS. 4A to 4C correspond to cross sections of portions indicated by chain lines A1-A2, E1-E2, and F1-F2 in FIG. 3. The pixel 120 illustrated in FIG. 3 is different from the pixel 110 illustrated in FIG. 1 in the structure of the groove portion 230. Note that the structure of the portion indicated by the chain line A1-A2 in FIG. 3 is the same as that in FIG. 1 and FIG. 2A.

The pixel 120 has a structure in which the groove portion 230 is provided between the wiring 216_j and the pixel electrode 210 and between the wiring 216_j+1 and the pixel electrode 210. The groove portion 230 is provided to not only cross the wiring 212_i and the wiring 203 in the line width direction of the wiring 212_i and the wiring 203 across the both edges thereof but also to exist in the region between the wiring 212_i and the wiring 203. By making the area of the groove portion 230 larger, formation of parasitic transistors can be prevented more surely.

Figure 5A:
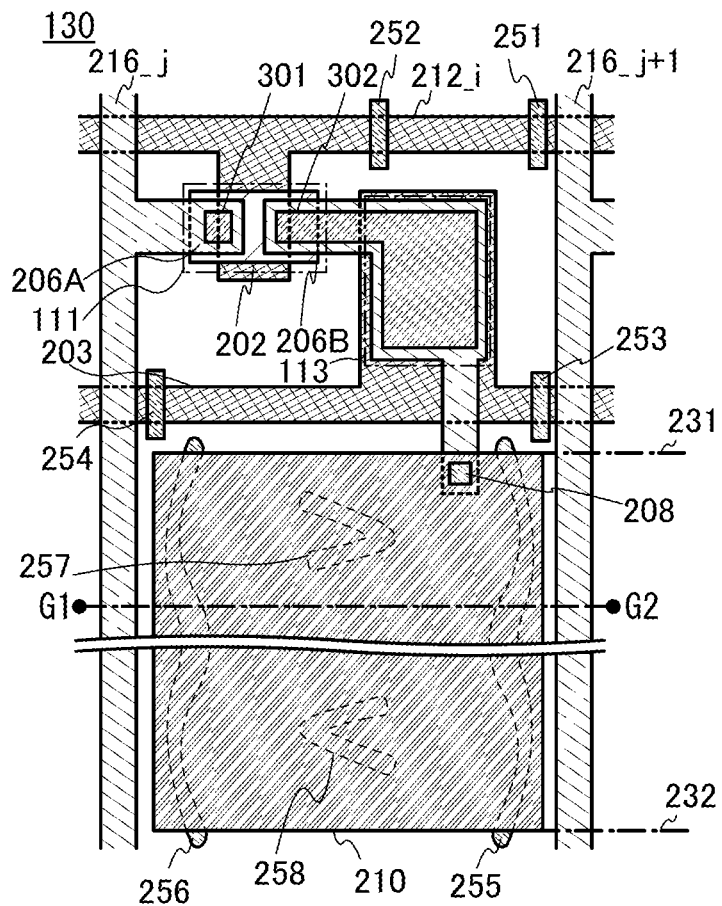
FIGS. 5A and 5B are a top view and a cross-sectional view illustrating one embodiment of the present invention.
Figure 5B:
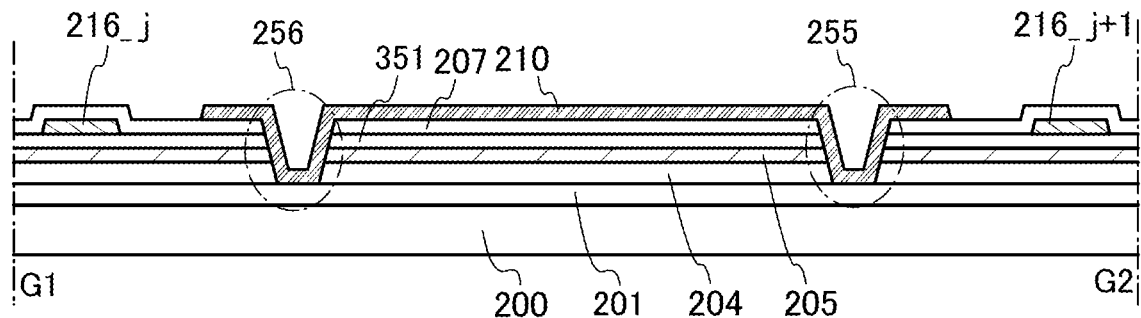

Next, an example of the pixel configuration, which is different from those in FIG. 1, FIGS. 2A to 2D, FIG. 3, and FIGS. 4A to 4C, will be described with reference to FIGS. 5A and 5B. FIG. 5A is a top view illustrating a plan structure of a pixel 130. A cross section G1-G2 in FIG. 5B corresponds to a cross section of a portion indicated by a chain line G1-G2 in FIG. 5A. FIGS. 5A and 5B illustrate an example of the pixel configuration, in which the pixel 130 has a configuration which can be applied to a reflective liquid crystal display device by using a conductive layer with high light reflectance for the pixel electrode 210.

In the pixel 130, a groove portion 251 and a groove portion 252 in which the semiconductor layer 205 is removed are provided so as to cross the wiring 212_i in the line width direction of the wiring 212_i across the both edges thereof. When a plurality of groove portions which cross the wiring 212_i in the line width direction of the wiring 212_i across the both edges thereof is provided, the influence of a parasitic channel formed by the overlap with the wiring 212_i can be reduced more surely.

Since the photolithography step and the etching step for forming the island-shaped semiconductor layer are not performed, in the semiconductor layer remaining in a region other than where the transistor is formed, a channel may be formed depending on the potential supplied to the pixel electrode or the like which overlaps with the semiconductor layer. Such a channel is called a parasitic channel.

In the pixel 130, a groove portion 253 and a groove portion 254 in which the semiconductor layer 205 is removed are provided so as to cross the wiring 203 in the line width direction of the wiring 203 across the both edges thereof. When a plurality of groove portions which cross the wiring 203 in the line width direction of the wiring 203 across the both edges thereof is provided, the influence of a parasitic channel formed by the overlap with the wiring 203 can be reduced more surely.

Further in the pixel 130, a groove portion 255 and a groove portion 256 in which the semiconductor layer 205 is removed are provided along a direction parallel to the direction in which the wiring 216_j or the wiring 216_j+1 extends, so as to extend beyond the edge 231 and the edge 232 of the pixel electrode 210. When a plurality of groove portions is provided along a direction parallel to the direction in which the wiring 216_j or the wiring 216_j+1 extends so as to extend beyond the edge 231 and the edge 232 of the pixel electrode 210, the influence of a parasitic channel formed by the overlap with the pixel electrode 210 can be reduced more surely. The groove portion 255 and the groove portion 256 are not necessarily provided in parallel to the wiring 216_j or the wiring 216_j+1 and may have a flection portion or a bending portion.

The groove portion 255 and the groove portion 256 in the pixel 130 each have a bending portion, and part of the groove portion 255 and part of the groove portion 256 overlap with the pixel electrode 210. The pixel 130 includes a groove portion 257 and a groove portion 258 formed to overlap with the pixel electrode 210. The groove portions 255 to 258 provided in this manner so as to overlap with the pixel electrode 210 can make a surface of the pixel electrode 210 uneven. The uneven surface of the pixel electrode 210 enables incident light from the outside to be reflected diffusely, so that more favorable display can be performed. Accordingly, visibility of display is improved.

The groove portions 255 to 258 formed to overlap with the pixel electrode 210 preferably have a tapered side surface because coverage with the pixel electrode 210 can be improved.

Next, examples of the structures of the terminal 105 and the terminal 106 will be described with reference to FIGS. 7A1, 7A2, 7B1, and 7B2. FIGS. 7A1 and 7A2 are a top view and a cross-sectional view, respectively, of the terminal 105. A chain line J1-J2 in FIG. 7A1 corresponds to a cross section J1-J2 in FIG. 7A2. FIGS. 7B1 and 7B2 are a top view and a cross-sectional view, respectively, of the terminal 106. A chain line K1-K2 in FIG. 7B1 corresponds to a cross section K1-K2 in FIG. 7B2. In the cross sections J1-J2 and K1-K2, J2 and K2 correspond to end portions of the substrate.

In the cross section J1-J2, the base layer 201 is formed over the substrate 200, and the wiring 212 is formed over the baser layer 201. The gate insulating layer 204, the semiconductor layer 205, the protective layer 351, and the insulating layer 207 are formed over the wiring 212. An electrode 221 is formed over the insulating layer 207, and the electrode 221 is connected to the wiring 212 through an opening 219 formed in the gate insulating layer 204, the semiconductor layer 205, the protective layer 351, and the insulating layer 207.

In the cross section K1-K2, the base layer 201, the gate insulating layer 204, the semiconductor layer 205, and the protective layer 351 are formed over the substrate 200. The wiring 216 is formed over the protective layer 351, and the insulating layer 207 is formed over the wiring 216. An electrode 222 is formed over the insulating layer 207, and the electrode 222 is connected to the wiring 216 through an opening 220 formed in the insulating layer 207.

Note that the terminal 107 can have a structure similar to that of the terminal 105 or the terminal 106.

The pixel region 102 and the terminal portion 104 are connected with n wirings 216. In the case where the wirings 216 extending from the pixel region 102 to the terminals 106 in the terminal portion 104 are located close to each other, a parasitic channel may be formed in a portion of the semiconductor layer 205, which is between the adjacent wirings 216, due to the potential difference between the adjacent wirings 216, and therefore the adjacent wirings 216 may be electrically connected to each other.

This phenomenon can be prevented by providing a conductive layer over the entire region from the pixel region 102 to the terminal portion 104 or between the adjacent wirings 216 with an insulating layer provided between the conductive layer and the semiconductor layer 205 and by setting the potential of the conductive layer to such a potential as not to form a parasitic channel in the semiconductor layer 205.

For example, since most of oxide semiconductors tend to be n-channel semiconductors, in the case of using an oxide semiconductor for the semiconductor layer 205, the potential of the conductive layer is set to a potential that is lower than the potential supplied to the wirings 216.

Further, it is also possible to prevent electrical connection between the adjacent wirings 216 by removing the semiconductor layer 205 between the adjacent wirings 216 in a step for forming groove portions that is described below.

Figure 8A:
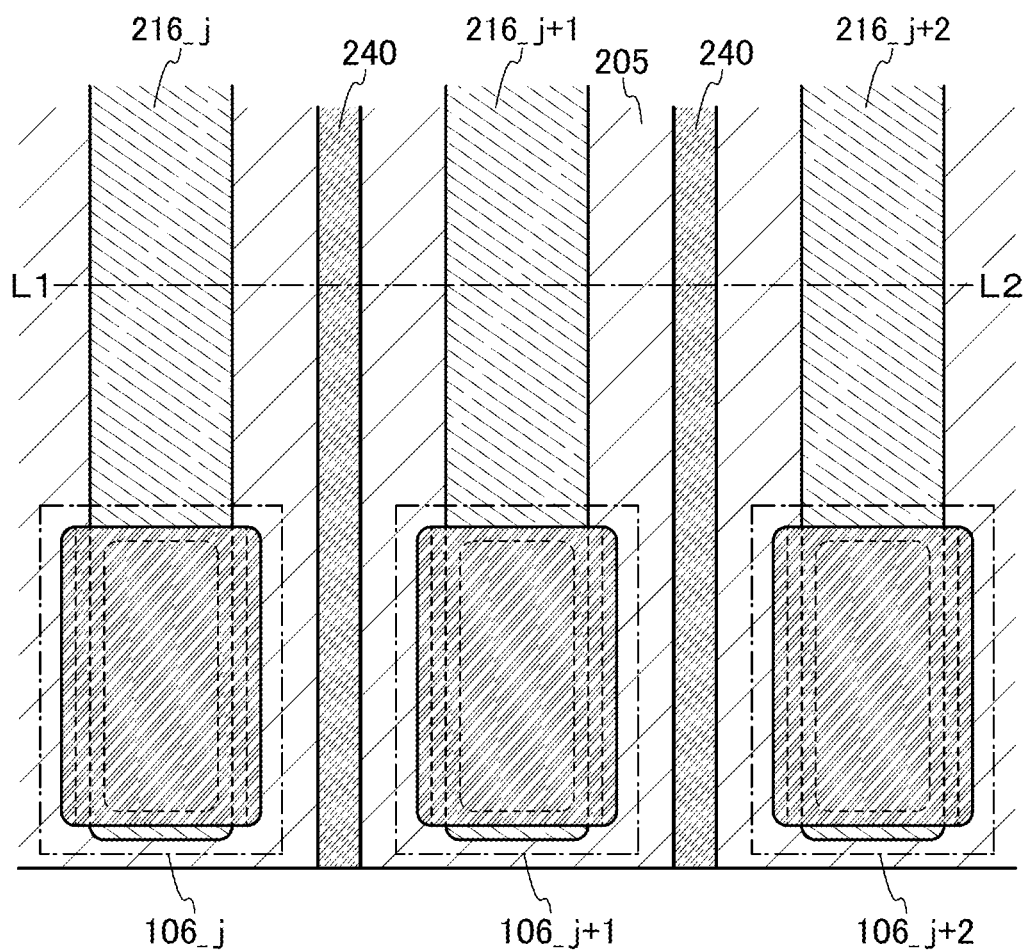
FIGS. 8A and 8B are a top view and a cross-sectional view illustrating one embodiment of the present invention.
Figure 8B:
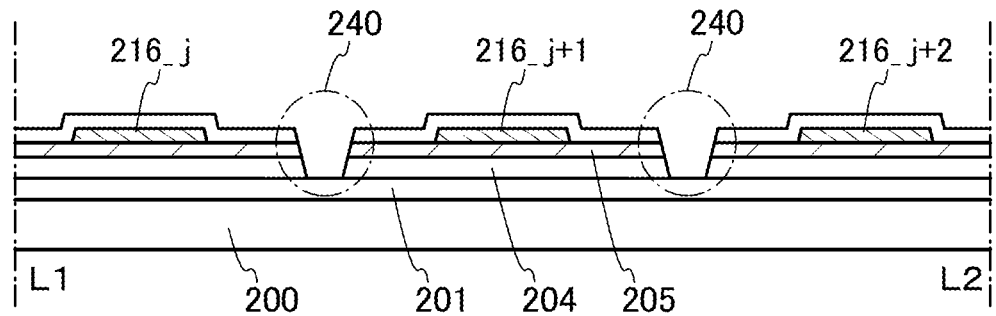
Figure 9A:
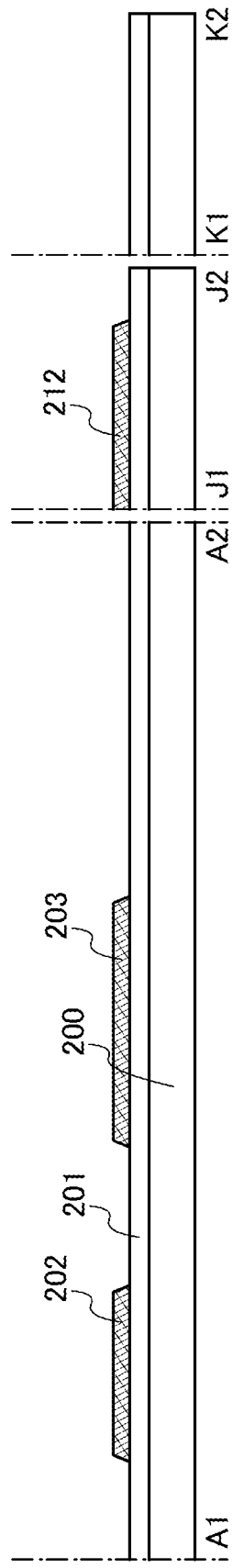
FIGS. 9A to 9C are cross-sectional views illustrating one embodiment of the present invention.
Figure 9B:
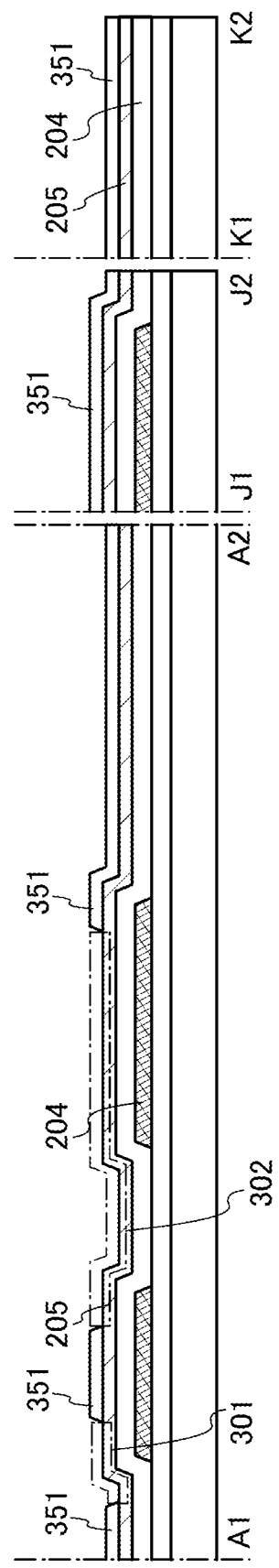
Figure 9C:
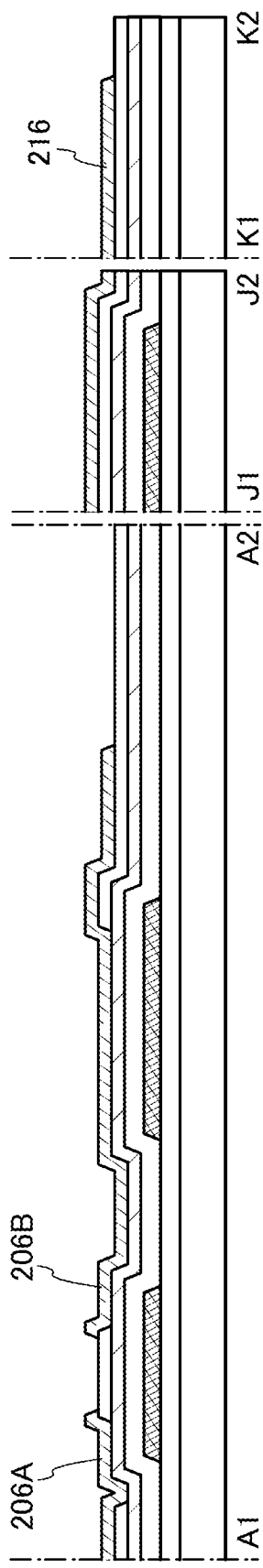

FIGS. 8A and 8B illustrate a structure in which the semiconductor layer 205 is removed by formation of groove portions 240 between the adjacent wirings 216. FIG. 8A is a top view illustrating a plan structure of the wirings 216 which are connected to the terminals 106. A cross section L1-L2 illustrated in FIG. 8B corresponds to a cross section in a portion indicated by a chain line L1-L2 in FIG. 8A. In FIG. 8A, the wiring 216_j is connected to the terminal 106_j, the wiring 216_j+1 is connected to the terminal 106_j+1, and the wiring 216_j+2 is connected to the terminal 106_j+2. Note that the groove portions 240 can be formed in a manner similar to that of the groove portions 230.

The groove portion 240 in which the semiconductor layer 205 is removed is formed between the adjacent wirings 216_j and 216_j+1. The groove portion 240 in which the semiconductor layer 205 is removed is formed between the adjacent wirings 216_j+1 and 216_j+2. By providing the groove portions 240 in which the semiconductor layer 205 is removed between the adjacent wirings 216, electrical connection between the adjacent wirings 216 can be prevented.

Although the size of the groove portion 240 in which the semiconductor layer 205 is removed is not particularly limited, for surely preventing formation of a parasitic channel, the width of the portion where the semiconductor layer is removed in the groove portion 240 in a direction perpendicular to the direction in which the wiring 216_j or the wiring 216_j+1 extends is preferably 1 μm or more, further preferably 2 μm or more.

Then, a manufacturing method of the pixel portion of the liquid crystal display device described with reference to FIG. 1 will be described with reference to FIGS. 9A to 9C and FIGS. 10A to 10C. Note that cross sections A1-A2, J1-J2, and K1-K2 in FIGS. 9A to 9C and FIGS. 10A to 10C are cross-sectional views of the portions taken along the chain lines A1-A2, J1-J2, and K1-K2 in FIG. 1 and FIGS. 7A1, 7A2, 7B1, and 7B2, respectively. Note that a structure in which an oxide semiconductor is used for the semiconductor layer is specifically described in the description of the manufacturing method using FIGS. 9A to 9C and FIGS. 10A to 10C. The advantages of using an oxide semiconductor for the semiconductor layer are as described above.

First, an insulating layer to be the base layer 201 is formed with a thickness of greater than or equal to 50 nm and less than or equal to 300 nm, preferably greater than or equal to 100 nm and less than or equal to 200 nm over the substrate 200. As the substrate 200, a glass substrate, a ceramic substrate, a plastic substrate that has high heat resistance enough to withstand a process temperature of this manufacturing process, or the like can be used. As the glass substrate, for example, an alkali-free glass substrate of barium borosilicate glass, aluminoborosilicate glass, aluminosilicate glass, or the like may be used. In this embodiment, aluminoborosilicate glass is used for the substrate 200.

The base layer 201 can be formed with a single-layer structure or a stacked structure using one or more of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of impurity elements from the substrate 200. Note that in this specification, silicon nitride oxide contains more nitrogen than oxygen and, in the case where measurements are performed using Rutherford backscattering spectrometry (RBS) and hydrogen forward scattering (HFS), contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The base layer 201 can be formed by a sputtering method, a CVD method, a coating method, a printing method, or the like as appropriate.

In this embodiment, a stack of a silicon nitride layer and a silicon oxide layer is used as the base layer 201. Specifically, a 50-nm-thick silicon nitride layer is formed over the substrate 200, and a 150-nm-thick silicon oxide layer is formed over the silicon nitride layer.

Next, over the base layer 201, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 202, the wiring 203, and the wiring 212 are formed.

The conductive layer for forming the gate electrode 202, the wiring 203, and the wiring 212 can be formed with a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

In this embodiment, the conductive layer is formed as follows: a 5-nm-thick Ti layer is formed over the base layer 201, and a 250-nm-thick Cu layer is formed over the Ti layer. Then, the conductive layer is selectively removed by etching through the first photolithography step, whereby the gate electrode 202, the wiring 203, and the wiring 212 are formed (see FIG. 9A). The formed gate electrode 202, wiring 203, and wiring 212 preferably have tapered edges because coverage with an insulating layer or a conductive layer that is later to be stacked thereover can be improved.

Note that unless otherwise specified, a photolithography step in this specification includes a step of forming a resist mask, a step of etching a conductive layer or an insulating layer, and a step of separating the resist mask.

Then, the gate insulating layer 204 is formed with a thickness of greater than or equal to 50 nm and less than or equal to 800 nm, preferably greater than or equal to 100 nm and less than or equal to 600 nm over the gate electrode 202, the wiring 203, and the wiring 212. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate (HfSi$_x$O$_y$ (x>0, y>0)), hafnium silicate to which nitrogen is added, hafnium aluminate to which nitrogen is added, or the like by a plasma CVD method, a sputtering method, or the like. The gate insulating layer 204 is not limited to a single layer and may be a stack of different layers. For example, the gate insulating layer 204 may be formed in the following manner: a silicon nitride layer (SiN$_y$ (y>0)) is formed by a plasma CVD method as a gate insulating layer A and a silicon oxide layer (SiO$_x$ (x>0)) is stacked over the gate insulating layer A as a gate insulating layer B.

Other than a sputtering method and a plasma CVD method, the gate insulating layer 204 can be formed by a film formation method such as a high-density plasma CVD method using microwaves (e.g., a frequency of 2.45 GHz).

In this embodiment, a stack of a silicon nitride layer and a silicon oxide layer is used as the gate insulating layer 204. Specifically, a 50-nm-thick silicon nitride layer is formed over the gate electrode 202, and a 100-nm-thick silicon oxide layer is formed over the silicon nitride layer.

The gate insulating layer 204 may be formed using an insulating material containing the same kind of component as the oxide semiconductor that is formed later. In the case of stacking layers of different materials to form the gate insulating layer 204, a layer in contact with the oxide semiconductor may be formed using an insulating material containing the same kind of component as the oxide semiconductor. This is because such a material is compatible with the oxide semiconductor, and therefore, the use of such a material for the gate insulating layer 204 enables a state of the interface between the gate insulating layer 204 and the oxide semiconductor to be kept well. Here, "the same kind of component as the oxide semiconductor" means one or more of elements selected from constituent elements of the oxide semiconductor.

Specifically, in the case where an oxide material containing In, Ga, and Zn is used for the oxide semiconductor layer, a material in which Ga, among In, Ga, and Zn that are elements contained in the oxide semiconductor, is replaced with at least one selected from elements which become a tetravalent cation is preferably used as the insulating material that can be used for the gate insulating layer 204 and contains the same kind of component as the oxide semiconductor that is formed later.

Examples of an element which becomes a tetravalent cation are Ti, Zr, and Hf, which are Group 4 elements in the periodic table, and Ge, which is a Group 14 element in the periodic table. When Ga, which becomes a trivalent cation, in the In-Ga-Zn-based oxide semiconductor (hereinafter referred to as IGZO) is replaced with any of the above Group 4 elements and Group 14 element in the periodic table, the element can be bonded more strongly to oxygen included in the oxide semiconductor and thus enables the gate insulating layer 204 to have a higher insulating property than the IGZO.

Alternatively, cerium (Ce), which is a lanthanoid, may be used as the element which becomes a tetravalent cation; the gate insulating layer 204 can have a higher insulating property than the IGZO by replacement of Ga with Ce.

Further, in the case where an oxide material containing In, Ga, and Zn is used for the oxide semiconductor layer, a material in which Ga, among In, Ga, and Zn that are elements contained in the oxide semiconductor, is replaced with yttrium (Y) is also preferable as the insulating material that can be used for the gate insulating layer 204 and contains the same kind of component as the oxide semiconductor. There can be a large difference in electronegativity between yttrium, which has a smaller electronegativity than Ga, and oxygen, so that yttrium can form a stronger ionic bond with oxygen in the oxide semiconductor and thus enables the gate insulating layer 204 to have a higher insulating property than the IGZO.

In the case of employing a stacked structure, the gate insulating layer 204 may have a stacked structure of a film formed using an insulating material containing the same kind of component as the oxide semiconductor and a film formed using a material different from that of the film In the case of using an oxide semiconductor layer as the semiconductor layer, in order that the oxide semiconductor layer contains hydrogen, a hydroxyl group, and moisture as little as possible, it is preferable to preheat the substrate 200 in a preheating chamber of a sputtering apparatus as pretreatment before the formation of the oxide semiconductor layer so that impurities such as hydrogen or moisture adsorbed on the substrate 200 or the gate insulating layer 204 are eliminated and removed. As an exhaustion unit provided in the preheating chamber, a cryopump is preferable. Note that this preheating treatment can be omitted. Further, this preheating may be similarly performed on the substrate 200 over which the gate electrode 202, the wiring 203, and the wiring 212 are formed before the formation of the gate insulating layer 204.

An oxide semiconductor used for the semiconductor layer 205 preferably contains at least indium (In) or zinc (Zn). In particular, In and Zn are preferably contained. In addition, as a stabilizer for reducing variation in electric characteristics of a transistor formed using the semiconductor layer, gallium (Ga) is preferably contained in addition to In and Zn. Tin (Sn) is preferably contained as a stabilizer. Hafnium (Hf)

is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In-Zn-based oxide, a Sn-Zn-based oxide, an Al-Zn-based oxide, a Zn-Mg-based oxide, a Sn-Mg-based oxide, an In-Mg-based oxide, or an In-Ga-based oxide, a three-component metal oxide such as an In-Ga-Zn-based oxide (also referred to as IGZO), an In-Al-Zn-based oxide, an In-Sn-Zn-based oxide, a Sn-Ga-Zn-based oxide, an Al-Ga-Zn-based oxide, a Sn-Al-Zn-based oxide, an In-Hf-Zn-based oxide, an In-La-Zn-based oxide, an In-Ce-Zn-based oxide, an In-Pr-Zn-based oxide, an In-Nd-Zn-based oxide, an In-Sm-Zn-based oxide, an In-Eu-Zn-based oxide, an In-Gd-Zn-based oxide, an In-Tb-Zn-based oxide, an In-Dy-Zn-based oxide, an In-Ho-Zn-based oxide, an In-Er-Zn-based oxide, an In-Tm-Zn-based oxide, an In-Yb-Zn-based oxide, or an In-Lu-Zn-based oxide, or a four-component metal oxide such as an In-Sn-Ga-Zn-based oxide, an In-Hf-Ga-Zn-based oxide, an In-Al-Ga-Zn-based oxide, an In-Sn-Al-Zn-based oxide, an In-Sn-Hf-Zn-based oxide, or an In-Hf-Al-Zn-based oxide can be used.

The oxide semiconductor layer preferably includes In, more preferably In and Ga. It is effective to perform dehydration or dehydrogenation in a later step in order to increase the purity of the oxide semiconductor layer.

Here, for example, an In-Ga-Zn-based oxide means an oxide containing indium (In), gallium (Ga), and zinc (Zn) and there is no particular limitation on the ratio of In:Ga:Zn. The In-Ga-Zn-based oxide may contain a metal element other than In, Ga, and Zn.

The oxide semiconductor is in a single crystal state, a polycrystalline (also referred to as polycrystal) state, an amorphous state, or the like. The oxide semiconductor is preferably a c-axis aligned crystalline oxide semiconductor (CAAC-OS).

The CAAC-OS is not completely single crystal nor completely amorphous. The CAAC-OS is an oxide semiconductor with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS, distribution of crystal parts is not necessarily uniform. For example, in the formation process of the CAAC-OS, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS, the crystal part in a region to which the impurity is added becomes amorphous in some cases.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

With use of the CAAC-OS in a transistor, change in electrical characteristics of the transistor due to irradiation with visible light or ultraviolet light is small.

Next, the semiconductor layer 205 is formed by a sputtering method, an evaporation method, a PCVD method, a PLD method, an ALD method, an MBE method, or the like.

The semiconductor layer 205 is formed in an oxygen gas atmosphere preferably by a sputtering method. At this time, the substrate temperature is set to higher than or equal to 100° C. and lower than or equal to 600° C., preferably higher than or equal to 150° C. and lower than or equal to 550° C., more preferably higher than or equal to 200° C. and lower than or equal to 500° C. The thickness of the semiconductor layer 205 is greater than or equal to 1 nm and less than or equal to 40 nm, preferably greater than or equal to 3 nm and less than or equal to 20 nm. The impurity concentration in the obtained semiconductor layer 205 is decreased with an increase in the substrate temperature in film formation. Further, the atomic arrangement in the semiconductor layer 205 is ordered and the density thereof is increased, so that a polycrystalline oxide semiconductor or a CAAC-OS is likely to be formed. Furthermore, since an oxygen gas atmosphere is employed for the deposition, an unnecessary atom such as a rare gas atom is not contained in the semiconductor layer 205, so that a polycrystalline oxide semiconductor or a CAAC-OS is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. The thinner the semiconductor layer 205 is, the lower the short channel effect of the transistor is. However, when the semiconductor layer 205 is too thin, the semiconductor layer 205 is significantly influenced by interface scattering; thus, the field effect mobility might be decreased.

In the case of forming the semiconductor layer 205 using an In-Ga-Zn-based oxide material by a sputtering method, it is preferable to use an In-Ga-Zn-based oxide target having an atomic ratio of In:Ga:Zn=1:1:1, 4:2:3, 3:1:2, 1:1:2, 2:1:3, or 3:1:4. When the semiconductor layer 205 is formed using an In-Ga-Zn-based oxide target having the aforementioned atomic ratio, a polycrystalline oxide semiconductor or a CAAC-OS is likely to be formed.

In this embodiment, the oxide semiconductor layer is formed with a thickness of 30 nm by a sputtering method with the use of an In-Ga-Zn-based oxide target. The oxide semiconductor layer can be formed by a sputtering method in a rare gas (typically, argon) atmosphere, an oxygen atmosphere, or a mixed atmosphere of a rare gas and oxygen.

As a target for forming the oxide semiconductor layer by a sputtering method, for example, a metal oxide target having a composition ratio of $In_2O_3:Ga_2O_3:ZnO=1:1:1$[molar ratio] is used to form an In—Ga—Zn—O layer.

It is preferable that a high-purity gas from which impurities such as hydrogen, water, a hydroxyl group, and hydride are removed be used as a sputtering gas for the formation of the oxide semiconductor layer. For example, when argon is used as a sputtering gas, it is preferable that the purity be 9N, the dew point be $-121°$ C., the content of $H_2O$ be 0.1 ppb or lower, and the content of $H_2$ be 0.5 ppb or lower. When oxygen is used as a sputtering gas, it is preferable that the purity be 8 N, the dew point be $-112°$ C., the content of $H_2O$ be 1 ppb or lower, and the content of H2 be 1 ppb or lower.

When the oxide semiconductor layer is formed, the substrate is held in a deposition chamber kept under reduced pressure, and the substrate temperature is set to a temperature higher than or equal to $100°$ C. and lower than or equal to $600°$ C., preferably higher than or equal to $300°$ C. and lower than or equal to $500°$ C.

By heating the substrate during the film formation, the concentration of impurities such as hydrogen, moisture, hydride, or hydroxide in the formed oxide semiconductor layer can be reduced. In addition, damage by sputtering can be reduced. Then, a sputtering gas from which hydrogen and moisture are removed is introduced into the deposition chamber while moisture remaining therein is removed, and the oxide semiconductor layer is formed with the use of the above target.

In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is evacuated with the cryopump, for example, a hydrogen atom, a compound containing a hydrogen atom, such as water (H2O), (further preferably, also a compound containing a carbon atom), and the like are removed, whereby the concentration of impurities in the oxide semiconductor layer formed in the deposition chamber can be reduced.

An example of the deposition conditions is as follows: the distance between the substrate and the target is 100 mm; the pressure is 0.6 Pa, the direct current (DC) power is 0.5 kW; and oxygen (the proportion of the oxygen flow rate is 100%) is used as a sputtering gas. Note that a pulsed direct-current power source is preferably used, in which case powder substances (also referred to as particles or dust) that are generated in deposition can be reduced and the film thickness can be uniform.

Next, first heat treatment is performed. By the first heat treatment, excessive hydrogen (including water and a hydroxyl group) in the oxide semiconductor layer is removed (dehydration or dehydrogenation), whereby the impurity concentration in the oxide semiconductor layer can be reduced.

The first heat treatment is performed at a temperature higher than or equal to $250°$ C. and lower than or equal to $750°$ C., or higher than or equal to $400°$ C. and lower than the strain point of the substrate, in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: $-55°$ C.), preferably less than or equal to 1 ppm, further preferably less than or equal to 10 ppb in the case where measurement is performed using a dew-point meter of a cavity ring-down laser spectroscopy (CRDS) system).

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the first heat treatment can employ GRTA, in which the substrate is transferred into an inert gas heated at a high temperature, and heated for several minutes there, and then taken out from the inert gas.

When the heat treatment is performed in an atmosphere of an inert gas such as nitrogen or a rare gas, oxygen, or ultra-dry air, it is preferable that the atmosphere do not contain water, hydrogen, or the like. The purity of nitrogen, oxygen, or the rare gas which is introduced into the heat treatment apparatus is preferably 6 N (99.9999%) or higher, further preferably 7 N (99.99999%) or higher (i.e., the impurity concentration is preferably 1 ppm or lower, further preferably 0.1 ppm or lower).

The first heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor layer can be reduced; however, oxygen vacancies are caused at the same time. By the heat treatment in the oxidation atmosphere, the caused oxygen vacancies can be reduced.

In the oxide semiconductor which is purified by sufficiently reducing the hydrogen concentration and in which defect levels in an energy gap due to oxygen deficiency are reduced by supplying a sufficient amount of oxygen, the carrier concentration is less than $1\times10^{12}$ /cm$^3$, preferably less than $1\times10^{11}$ /cm$^3$, further preferably less than $1.45\times10^{10}$ /cm$^3$. For example, the off-state current (per unit channel width (1 μm) here) at room temperature ($25°$ C.) is 100 zA (1 zA (zeptoampere) is $1\times10^{-21}$A) or less, preferably 10 zA or less. The off-state current at $85°$ C. is 100 zA ($1\times10^{-19}$A) or less, preferably 10 zA ($1\times10^{-20}$A) or less. In this manner, by using an oxide semiconductor which is made to be an i-type (intrinsic) or substantially i-type oxide semiconductor, the transistor 111 with excellent off-state current characteristics can be obtained.

The electrical characteristics of a transistor including a purified oxide semiconductor, such as the threshold voltage and the on-state current, have almost no temperature dependence. Further, transistor characteristics hardly change due to light deterioration.

As described above, variation in electric characteristics of a transistor including a purified and i-type (intrinsic) oxide semiconductor obtained by reducing the oxygen vacancies is suppressed and thus, the transistor is electrically stable. Accordingly, a liquid crystal display device including an oxide semiconductor, which has high reliability and stable electric characteristics, can be provided.

Next, the protective layer 351 is formed over the semiconductor layer 205. The protective layer 351 can be formed using a material and a method similar to those of the gate insulating layer 204.

When the protective layer 351 in contact with the semiconductor layer 205 contains much oxygen, the protective layer 351 can function as a supply source which supplies oxygen to the semiconductor layer 205.

In this embodiment, a 200-nm-thick silicon oxide layer is used as the protective layer 351. Then, a resist mask is formed over the protective layer 351 by a second photolithography step and part of the protective layer 351 over the semiconductor layer 205 is selectively removed, whereby the opening 301 and the opening 302 are formed (see FIG. 9B). The protective layer which remains over the semiconductor layer 205 after the formation of the opening 301 and the opening 302 has a trapezoidal or triangular cross-sectional shape, and the taper angle θ of a lower end portion of the cross-sectional shape is 60° or less, preferably 45° or less, further preferably 30° or less. For example, in this embodiment, a resist mask is formed over the silicon oxide layer by a photolithography step and selective etching is performed, so that the protective layer 351 whose cross-sectional shape is a trapezoid and whose taper angle θ at the lower end portion is about 30° is formed.

Heat treatment may be performed after the protective layer 351 is formed. In this embodiment, heat treatment is performed at 300° C. for one hour in a nitrogen atmosphere.

The protective layer 351 may be formed using an insulating material containing the same kind of component as the semiconductor layer 205. In the case of stacking layers of different materials to form the protective layer 351, a layer in contact with the oxide semiconductor may be formed using an insulating material containing the same kind of component as the oxide semiconductor. This is because such a material is compatible with the oxide semiconductor, and therefore, the use of such a material for the protective layer 351 enables a state of the interface between the protective layer 351 and the oxide semiconductor to be kept well. Here, "the same kind of component as the oxide semiconductor" means one or more of elements selected from constituent elements of the oxide semiconductor.

Specifically, in the case where an oxide material containing In, Ga, and Zn is used for the oxide semiconductor layer, a material in which Ga, among In, Ga, and Zn that are elements contained in the oxide semiconductor, is replaced with an element which becomes a tetravalent cation is preferably used as the insulating material that can be used for the protective layer 351 and contains the same kind of component as the oxide semiconductor.

Examples of an element which becomes a tetravalent cation are Ti, Zr, and Hf, which are Group 4 elements in the periodic table, and Ge, which is a Group 14 element in the periodic table. When Ga, which becomes a trivalent cation, in the IGZO is replaced with any of the above Group 4 elements and Group 14 element in the periodic table, the element can be bonded more strongly to oxygen included in the oxide semiconductor and thus enables the protective layer 351 to have a higher insulating property than the IGZO.

Alternatively, cerium (Ce), which is a lanthanoid, may be used as the element which becomes a tetravalent cation; the protective layer 351 can have a higher insulating property than the IGZO by replacement of Ga with Ce.

Further, in the case where an oxide material containing In, Ga, and Zn is used for the oxide semiconductor layer, a material in which Ga, among In, Ga, and Zn that are elements contained in the oxide semiconductor, is replaced with yttrium (Y) is also preferable as the insulating material that can be used for the protective layer 351 and contains the same kind of component as the oxide semiconductor. There can be a large difference in electronegativity between yttrium, which has a smaller electronegativity than Ga, and oxygen, so that yttrium can form a stronger ionic bond with oxygen in the oxide semiconductor and thus enables the protective layer 351 to have a higher insulating property than the IGZO.

In the case of employing a stacked structure, the protective layer 351 may have a stacked structure of a film formed using an insulating material containing the same kind of component as the oxide semiconductor and a film formed using a material different from that of the film.

Note that impurities are likely to be attached to a surface of the semiconductor layer 205 which is exposed by the etching for forming the opening 301 and the opening 302. The impurities include an element which is included in an etching gas or an etchant used for the etching, an element which exists in a treatment chamber where the etching is performed, or the like. Specific examples of the impurities are boron, chlorine, fluorine, carbon, and aluminum.

Next, surfaces of the semiconductor layer 205 and the protective layer 351 are subjected to cleaning treatment. The cleaning treatment can be performed using an alkaline solution such as a TMAH solution, water, dilute hydrofluoric acid, or the like. Alternatively, the cleaning treatment can be performed by plasma treatment using oxygen, dinitrogen monoxide, or a rare gas (typically argon). The cleaning treatment can remove the above impurities attached to the surfaces of the semiconductor layer 205 and the protective layer 351.

Note that a dilute hydrofluoric acid in which 50 weight% hydrofluoric acid is diluted 100 times to 100000 times with water is preferably used for the cleaning treatment. When dilute hydrofluoric acid is used for the cleaning treatment, the impurities attached to the semiconductor layer 205 can be removed together with part of the semiconductor layer 205.

Next, a conductive layer which is to be the first electrode 206A, the second electrode 206B, and the wiring 216 is formed over the protective layer 351 and the semiconductor layer 205 in the openings 301 and 302. The conductive layer for forming the first electrode 206A, the second electrode 206B, and the wiring 216 can be formed using a material and a method similar to those of the gate electrode 202. The conductive layer for forming the first electrode 206A, the second electrode 206B, and the wiring 216 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide (In$_2$O$_3$—ZnO), or any of these metal oxide materials containing silicon oxide can be used.

In this embodiment, the conductive layer is formed as follows: a 5-nm-thick Ti layer is formed over the protective layer 351 and the semiconductor layer 205 in the openings 301 and 302, and a 250-nm-thick Cu layer is formed over the Ti layer. Then, a resist mask is formed by a third photolithography step and the conductive layer is selectively removed by etching; thus, the first electrode 206A, the second electrode 206B, and the wiring 216 are formed (see FIG. 9C).

Figure 10A:
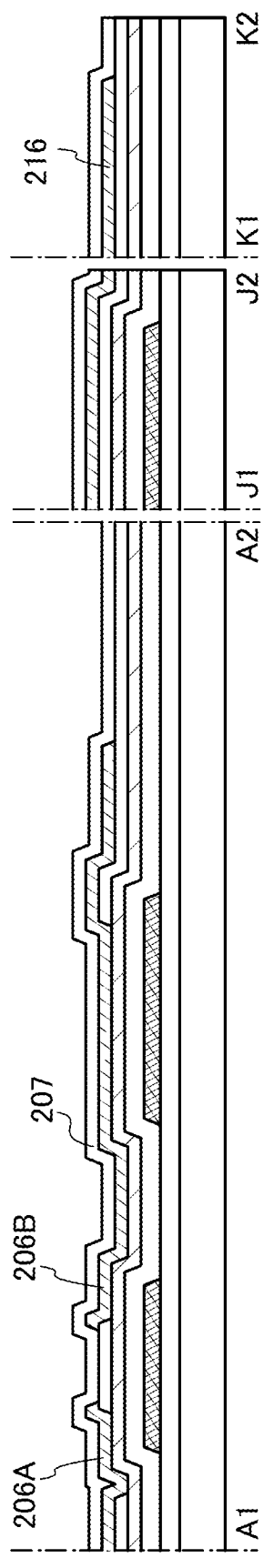
FIGS. 10A to 10C are cross-sectional views illustrating one embodiment of the present invention.
Figure 10B:
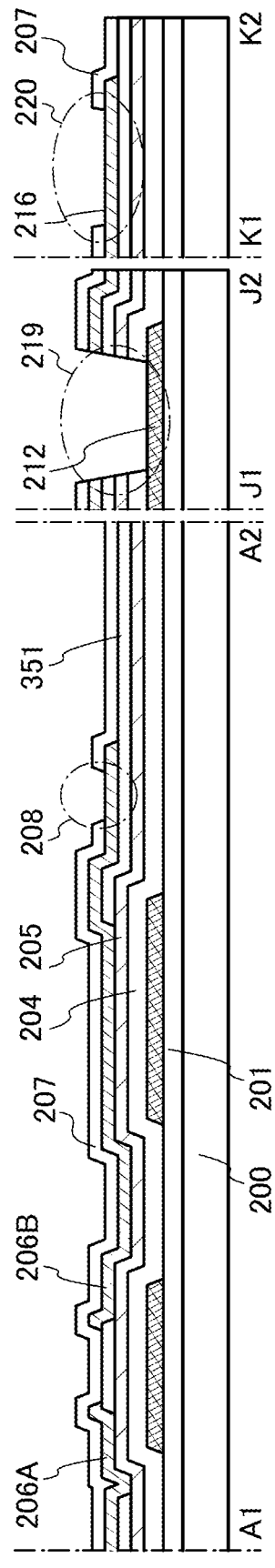
Figure 10C:
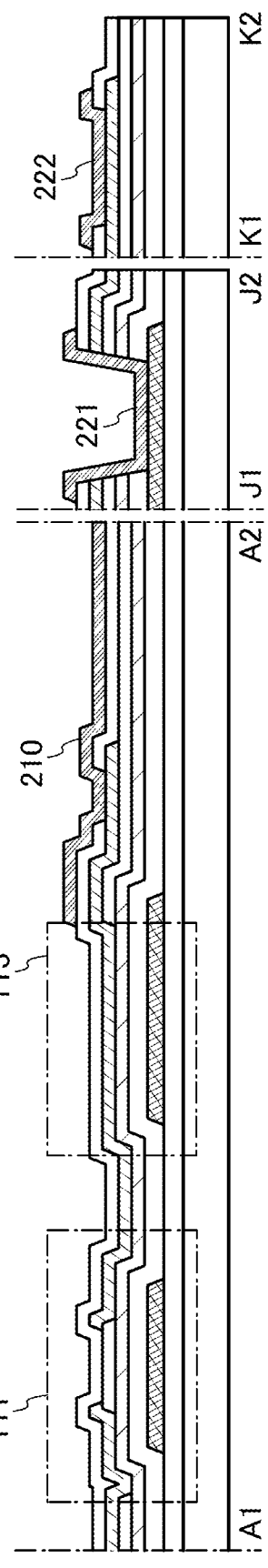

Next, the insulating layer 207 is formed over the first electrode 206A, the second electrode 206B, the protective layer 351, and the wiring 216 (see FIG. 10A). The insulating layer 207 can be formed using a material and a method similar to those of the gate insulating layer 204 or the base layer 201. Sputtering is preferably employed in terms of low possibility of entry of hydrogen, water, and the like. If hydrogen is contained in the insulating layer 207, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to form the insulating layer 207 by a method through which hydrogen and impurities containing hydrogen are not contained in the insulating layer 207.

As the insulating layer 207, an inorganic insulating material such as silicon oxide, silicon oxynitride, hafnium oxide, aluminum oxide, or gallium oxide can be typically used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the insulating layer 207 or may be stacked together with the insulating layer 207.

In this embodiment, a 200-nm-thick silicon oxide layer is formed as the insulating layer 207 by a sputtering method. The substrate temperature in the film formation may be higher than or equal to room temperature and lower than or equal to 300° C., and in this embodiment, is 100° C. The silicon oxide layer can be formed by sputtering in a rare gas (typically argon) atmosphere, an oxygen atmosphere, or a mixed atmosphere of a rare gas and oxygen. As a target, silicon oxide or silicon can be used. For example, a silicon oxide layer can be formed by sputtering in an atmosphere containing oxygen with the use of silicon as the target.

In order to remove moisture remaining in the deposition chamber at the time of formation of the insulating layer 207, an entrapment vacuum pump (e.g., a cryopump) is preferably used. When the insulating layer 207 is formed in the deposition chamber evacuated using a cryopump, the impurity concentration in the insulating layer 207 can be reduced. In addition, as an exhaustion unit for removing moisture remaining in the chamber used for depositing the insulating layer 207, a turbo molecular pump provided with a cold trap may be used.

It is preferable that a high-purity gas from which impurities such as hydrogen, water, a hydroxyl group, and hydride are removed be used as a sputtering gas used for the formation of the insulating layer 207.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for a wiring layer formed by the first photolithography step or the third photolithography step, the heat treatment temperature is set to be 380° C. or lower, preferably 350° C. or lower. In the case where Cu is used for a wiring layer formed by the first photolithography step or the third photolithography step, the heat treatment temperature is set to be 450° C. or lower. For example, the second heat treatment may be performed at 450° C. for one hour in a nitrogen atmosphere.

By the second heat treatment, part of the oxide semiconductor layer (a channel formation region) is heated in the state of being in contact with the insulating layer 207, so that oxygen can be supplied from the insulating layer 207 containing oxygen to the semiconductor layer 205. It is preferable that the above atmosphere do not contain water, hydrogen, or the like.

Next, a resist mask is formed by a fourth photolithography step, and part of the insulating layer 207 over the second electrode 206B is selectively removed, so that the opening 208 is formed. In addition, part of the insulating layer 207 over the wiring 216 in the cross section K1-K2 is selectively removed, so that the opening 220 is formed. Over the wiring 212 in the cross section J1-J2, part of the insulating layer 207, part of the protective layer 351, part of the semiconductor layer 205, and part of the gate insulating layer 204 are selectively removed, so that the opening 219 is formed (see FIG. 10B). Although not illustrated, by this photolithography step, the groove portions 230 are formed in a manner similar to that of the opening 219. Therefore, at side surfaces of the groove portions 230, the insulating layer 207, the protective layer 351, the semiconductor layer 205, and the gate insulating layer 204 are exposed.

For the etching of the insulating layer 207, the protective layer 351, the semiconductor layer 205, and the gate insulating layer 204, either dry etching or wet etching or both of them may be used. For example, a gas containing chlorine (a chlorine-based gas such as chlorine (Cl$_2$), boron trichloride (BCl$_3$), silicon tetrachloride (SiCl$_4$), or carbon tetrachloride (CCl$_4$)) can be employed as an etching gas used for the dry etching.

As a dry etching method, a parallel plate reactive ion etching (RIE) method, an inductively coupled plasma (ICP) etching method, or the like can be used. Since the base layer 201 has a function of preventing diffusion of an impurity element from the substrate 200, for the above etching, etching conditions are preferably adjusted so as to etch the base layer 201 as little as possible.

In general, etching of the semiconductor layer and formation of the opening are separately performed through their respective photolithography steps and etching steps; according to the manufacturing process of this embodiment, etching of the semiconductor layer and formation of the opening can be performed by one photolithography step and one etching step. Therefore, not only the number of photomasks but the number of photolithography steps can be reduced as well, which can reduce the number of etching steps after the photolithography steps. In other words, a liquid crystal display device can be manufactured at low cost with high productivity with a smaller number of photolithography steps.

In addition, according to the manufacturing process of this embodiment, a photoresist is not directly formed on the oxide semiconductor layer. Further, since the channel formation region in the oxide semiconductor layer is protected by the insulating layer 207, moisture is not attached to the channel formation region in the oxide semiconductor layer in later separation and cleaning steps of the photoresist; thus, variation in characteristics of the transistor 111 is reduced and the reliability is increased.

Next, the pixel electrode 210 is formed over the second electrode 206B in the opening 208 and over the insulating layer 207. As a conductive layer which is to be the pixel electrode 210, a light-transmitting conductive layer (also referred to as a transparent conductive layer) is formed with a thickness of more than or equal to 30 nm and less than or equal to 200 nm, preferably more than or equal to 50 nm and less than or equal to 100 nm by a sputtering method, a vacuum evaporation method, or the like. Through the above-described process, the semiconductor device including the transistor 111 and the capacitor 113 is completed (see FIG. 10C).

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Alternatively, a material formed of one to ten graphene sheets may be used.

In this embodiment, an example of a manufacturing method of a pixel portion of a transmissive liquid crystal display device is described. However, without limitation thereto, one embodiment of the present invention can be applied to a pixel portion of a reflective or semi-transmissive liquid crystal display device as well. In the case of obtaining a pixel portion of a reflective liquid crystal display device, the pixel electrode may be formed using a conductive layer with high light reflectance (also referred to as a reflective conductive layer), for example, using a metal having high visible-light reflectance, such as aluminum, titanium, silver, rhodium, or nickel; an alloy containing at least one of the above metals; or stacked layers of the above materials. In the case of obtaining a pixel portion of a semi-transmissive liquid crystal display device, one pixel electrode is formed using a transparent conductive layer and a reflective conductive layer and provided with a transmissive portion and a reflective portion.

In this embodiment, an ITO layer with a thickness of 80 nm is formed as the light-transmitting conductive layer. By a fifth photolithography step, a resist mask is formed, and the light-transmitting conductive layer is selectively etched; thus, the pixel electrode 210, the electrode 221, and the electrode 222 are formed.

The pixel electrode 210 is connected to the second electrode 206B through the opening 208. The electrode 221 is connected to the wiring 212 through the opening 219. The electrode 222 is connected to the wiring 216 through the opening 220.

In addition, in the opening 219 and the opening 220 formed in the terminal portion 103 and the terminal portion 104, it is important that the wiring 212 and the wiring 216 be not kept in an exposed state and be covered with an oxide conductive material such as ITO. When the wiring 212 and the wiring 216, which are metal layers, are kept in an exposed state, exposed surfaces are oxidized and contact resistance with an FPC or the like is increased. The increase in contact resistance causes distortion in waveform or delay of a signal that is input from the outside, and a signal from the outside cannot be transmitted correctly, so that the reliability of the semiconductor device is lowered. By covering the exposed surfaces of the wiring 212 and the wiring 216 with an oxide conductive material such as ITO, the increase in contact resistance can be prevented, and the reliability of the semiconductor device can be improved.

According to this embodiment, a semiconductor device can be manufactured through a smaller number of photolithography steps than the conventional one and deterioration of a semiconductor layer can be suppressed. Therefore, a highly reliable liquid crystal display device can be manufactured at low cost with high productivity.

In this embodiment, an example of a bottom gate transistor is described, but this embodiment can also be applied to a top gate transistor.

This embodiment can be freely combined with any of the other embodiments.

Embodiment 2

In this embodiment, examples of a pixel configuration of an EL display device formed through a process in which the number of photomasks and the number of photolithography steps are reduced, and an example of a method for forming the pixel configuration will be described with reference to FIG. 13, FIGS. 14A to 14D, FIG. 15, FIGS. 16A to 16C, FIG. 17, FIGS. 18A and 18B, FIGS. 19A1, 19A2, 19B1, and 19B2, FIGS. 20A and 20B, FIGS. 21A to 21C, and FIGS. 22A to 22C.

Figure 18A:
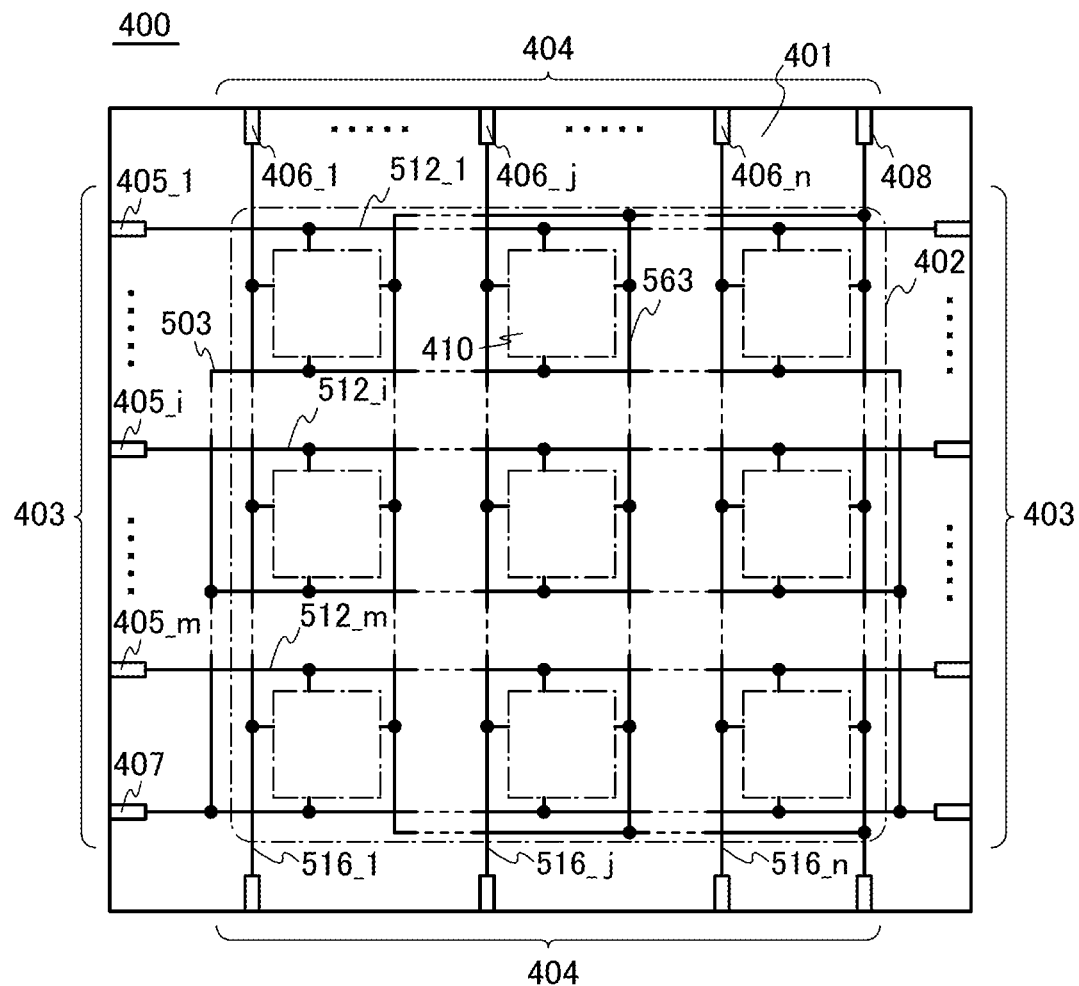
FIGS. 18A and 18B are circuit diagrams illustrating one embodiment of the present invention.

FIG. 18A illustrates an example of the configuration of a semiconductor device 400 that is used in an EL display device. The semiconductor device 400 includes a pixel region 402, a terminal portion 403 including in terminals 405 (in is an integer of greater than or equal to 1) and a terminal 407, and a terminal portion 404 including n terminals 406 (n is an integer of greater than or equal to 1) and a terminal 408 over a substrate 401. Further, the semiconductor device 400 includes in wirings 512 electrically connected to the terminal portion 403, n wirings 516 electrically connected to the terminal portion 404, a wiring 503, and a wiring 563. The pixel region 402 includes a plurality of pixels 410 arranged in a matrix of in (rows) and n (columns). A pixel 410(0 in the i-th row and the j-th column (i is an integer of greater than or equal to 1 and less than or equal to in, and j is an integer of greater than or equal to 1 and less than or equal to n) is connected to a wiring 512_i and a wiring 516_j. Each pixel is connected to the wiring 503 which is to be a common electrode, and the wiring 503 is connected to the terminal 407. In addition, each pixel is connected to the wiring 563 for supplying current, and the wiring 563 is connected to the terminal 408. The wiring 512_i is connected to a terminal 405_i, and the wiring 516_j is connected to a terminal 406_j.

The terminal portion 403 and the terminal portion 404 are external input terminals and are connected to external control circuits with flexible printed circuits (FPC) or the like. Signals supplied from the external control circuits are input to the semiconductor device 400 through the terminal portion 403 and the terminal portion 404. In FIG. 18A, such terminal portions 403 are provided on the right and left of the pixel region 402, so that signals are input from two directions. Further, such terminal portions 404 are provided above and below the pixel region 402, so that signals are input from two directions. By inputting signals from two portions, signal supply capability is increased and high-speed operation of the semiconductor device 400 is facilitated. Moreover, the influence of signal delay due to an increase in wiring resistance, which is caused by an increase in size or in definition of the semiconductor device 400, can be reduced. Moreover, the semiconductor device 400 can have redundancy, so that the reliability of the semiconductor device 400 can be improved. Although two terminal portions 403 and two terminal portions 404 are provided in FIG. 18A, a structure in which one terminal portion 403 and one terminal portion 404 are provided may also be employed.

Figure 18B:
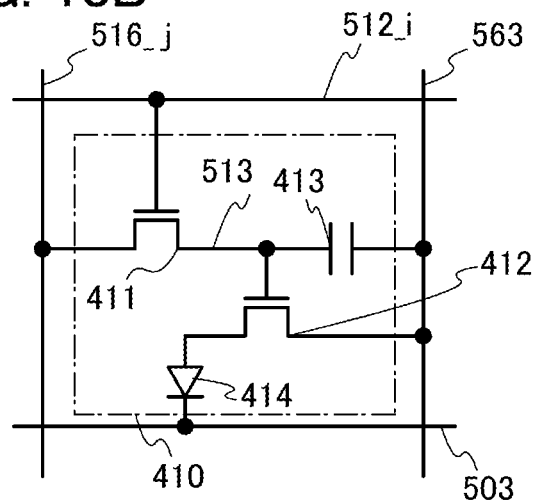

FIG. 18B illustrates a circuit configuration of the pixel 410. The pixel 410 includes a first transistor 411, a second transistor 412, a capacitor 413, and an EL element 414. A gate electrode of the first transistor 411 is connected to the wiring 512_i, and one of a source electrode and a drain electrode (hereinafter referred to as a first electrode) of the first transistor 411 is connected to the wiring 516_j. A first electrode of the second transistor 412 is connected to the wiring 563, and the other of the source electrode and the drain electrode (hereinafter referred to as a second electrode) of the second transistor 412 is connected to one electrode of the EL element 414. A second electrode of the first transistor 411 is connected to a gate electrode of the second transistor 412 and one electrode of the capacitor 413 through a wiring 513. The other electrode of the capacitor 413 is connected to the wiring 563. The other electrode of the EL element 414 is connected to the wiring 503. The potential of the wiring 503 may be a fixed potential such as 0 V, GND, or a common potential. The potential of the wiring 563 may be set as appropriate depending on the amount of current which flows through the EL element.

The first transistor 411 has a function of selecting whether an image signal supplied from the wiring 516_j is input to the gate electrode of the second transistor 412. When a signal that turns on the first transistor 411 is supplied to the wiring 512_i, an image signal is supplied to the gate electrode of the second transistor 412 and the one electrode of the capacitor 413 from the wiring 516_j through the first transistor 411.

The second transistor 412 has a function of supplying a current corresponding to an image signal held in the gate electrode of the second transistor 412 to the EL element 414. The image signal held in the gate electrode of the second transistor 412 is held between the electrodes of the capacitor 413. The second transistor 412 functions as a current source for supplying a current corresponding to an image signal to the EL element 414.

For a semiconductor layer where channels of the first transistor 411 and the second transistor 412 are formed, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide. The display device described in this embodiment has a structure in which the semiconductor layer remains in the pixel region; thus, in the case where the display device including the semiconductor is used for a transmissive display device, the transmittance of visible light is preferably increased by, for example, thinning the semiconductor layer as much as possible.

It is preferable to use an oxide semiconductor for the semiconductor layer where the channels of the first transistor 411 and the second transistor 412 are formed. An oxide semiconductor has an energy gap that is as wide as 3.0 eV or more, and thus has high transmittance with respect to visible light. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A). Thus, the potential applied to the gate electrode of the second transistor 412 can be held without the capacitor 413.

Although each of the first transistor 411 and the second transistor 412 is described as being an n-channel transistor, each of the first transistor 411 and the second transistor 412 may be a p-channel transistor.

The capacitor 413 has a function of holding an image signal supplied to the gate electrode of the second transistor 412. The capacitor 413 need not necessarily be provided; however, in the case of providing the capacitor 413, variation in the potential applied to the gate electrode of the second transistor 412, which is caused by a current flowing between the first electrode and the second electrode in an off state of the first transistor 411 (off-state current), can be suppressed.

The luminance of the EL element 414 is controlled in accordance with the amount of current which flows between the first electrode and the second electrode of the second transistor 412. Note that the EL element 414 has a structure in which an EL layer is interposed between one electrode serving as an anode and the other electrode serving as a cathode.

Figure 13:
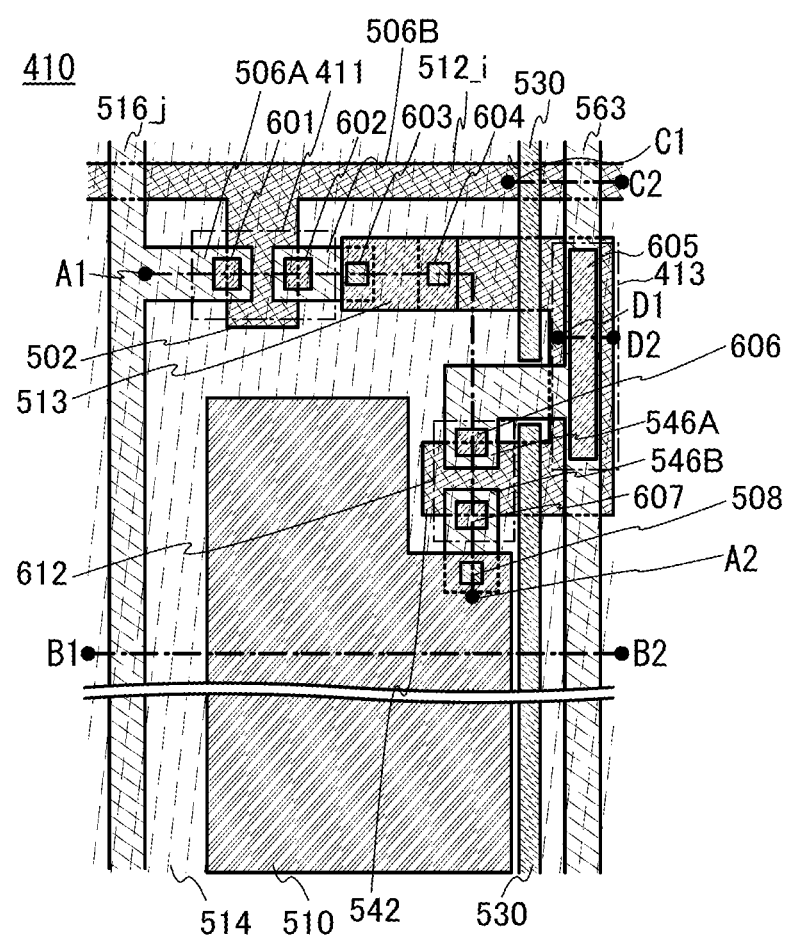
FIG. 13 is a top view illustrating one embodiment of the present invention.

Next, an example of the configuration of the pixel 410 illustrated in FIGS. 18A and 18B will be described with reference to FIG. 13 and FIGS. 14A to 14D. FIG. 13 is a top view illustrating a plan structure of the pixel 410, and FIGS. 14A to 14D are cross-sectional views illustrating a stacked structure of the pixel 410. Note that chain lines A1-A2, B1-B2, C1-C2, and D1-D2 in FIG. 13 correspond to cross sections A1-A2, B1-B2, C1-C2, and D1-D2 in FIGS. 14A to 14D, respectively.

In the first transistor 411 and the second transistor 412 described in this embodiment, a first electrode 506A and a second electrode 506B face each other with a predetermined distance therebetween, and a first electrode 546A and a second electrode 546B face each other with a constant distance therebetween. Note that the first electrode 506A and the second electrode 506B, and the first electrode 546A and the second electrode 546B may have other patterns; for example, the second electrode 546B may be surrounded by the first electrode 546A that is U-shaped (or C-shaped, square-bracket-like shaped, or horseshoe-shaped).

The semiconductor device described in this embodiment has a structure in which the semiconductor layer 505 remains in the entire pixel region 402 because a photolithography step and an etching step for forming an island-shaped semiconductor layer are not performed in order to simplify the manufacturing process (not illustrated in FIG. 13). Consequently, a first parasitic transistor in which the wiring 512_i functions as a gate electrode, the wiring 516_j functions as one of a source electrode and a drain electrode, and the wiring 563 functions as the other of the source electrode and the drain electrode is formed.

Further, a second parasitic transistor in which a gate electrode 542 of the second transistor 412 functions as a gate electrode, the second electrode 506B functions as one of a source electrode and a drain electrode, and the wiring 563 functions as the other of the source electrode and the drain electrode is formed.

Furthermore, a third parasitic transistor in which the gate electrode 542 functions as a gate electrode, the wiring 563 functions as one of a source electrode and a drain electrode, and the second electrode 546B functions as the other of the source electrode and the drain electrode is formed.

Note that a parasitic transistor is formed due to formation of a channel in a region where the first transistor 411 and the second transistor 412 are not formed but the semiconductor layer remains.

The gate electrode 542 of the second transistor 412 and the wiring 563 overlap with each other to form the capacitor 413.

In the structure of this embodiment, damage on the semiconductor layer can be reduced by the omission of the photolithography step and the etching step for forming the island-shaped semiconductor layer; thus, deterioration of the semiconductor layer can be suppressed.

When such a potential as to turn on the first transistor 411 is supplied to the wiring 512_i, the first parasitic transistor is also turned on.

When the first parasitic transistor is on, the wiring 516_j and the wiring 563 are electrically connected to each other. When the wiring 516_j and the wiring 563 are electrically connected to each other through the first parasitic transistor, current which flows from the wiring 563 to the wiring 516_j causes deviation of an image signal, so that a desired potential cannot be supplied to the gate electrode 542.

Further, the second parasitic transistor is turned on by formation of a channel in the semiconductor layer 505 overlapping with the gate electrode 542, depending on the potential corresponding to the image signal that is supplied to the gate electrode 542.

When the second parasitic transistor is on, the second electrode 506B and the wiring 563 are electrically connected to each other. When the second electrode 506B and the wiring 563 are electrically connected to each other through the second parasitic transistor, deviation of an image signal held in the gate electrode 542 is caused by the effect of the second electrode 506B, so that a desired potential cannot be held in the gate electrode 542.

Further, the third parasitic transistor is turned on by formation of a channel in the semiconductor layer 505 overlapping with the gate electrode 542, depending on the potential corresponding to the image signal that is supplied to the gate electrode 542.

When the third parasitic transistor is on, the wiring 563 and the second electrode 546B are electrically connected to each other. When the wiring 563 and the second electrode 546B are electrically connected to each other through the third parasitic transistor, the amount of current which flows through the second transistor 412 does not correspond to the image signal, so that the EL element 414 cannot emit light at a desired luminance In view of this, a structure in which a groove portion 530 in which the semiconductor layer 505 is removed is provided in the pixel 410 so that the above-described parasitic transistors are not formed is employed in this embodiment. The groove portion 530 is provided so as to cross the wiring 512_i in the line width direction of the wiring 512_i across both edges thereof; in this way, formation of the first parasitic transistor can be prevented.

In addition, the groove portion 530 is provided along a direction parallel to the direction in which the wiring 516_j or the wiring 563 extends so as to cross the gate electrode 542 in the line width direction of the gate electrode 542 across both edges thereof; in this way, formation of the second parasitic transistor and the third parasitic transistor can be prevented. Note that a plurality of groove portions 530 may be provided over the wiring 512_i, and a plurality of groove portions 530 may be provided over the gate electrode 542.

Although the size of the groove portion 530 in which the semiconductor layer 505 is removed is not particularly limited, for surely preventing formation of a parasitic transistor, the width of the portion where the semiconductor layer is removed in the groove portion 530 in a direction perpendicular to the direction in which the wiring 516_j or the wiring 563 extends is preferably 1 μm or more, further preferably 2 μm or more.

In the first transistor 411 and the second transistor 412 of this embodiment, a protective layer 651 is provided over the semiconductor layer 505 to suppress deterioration of the semiconductor layer 505. In particular, in this embodiment, an opening 601 and an opening 602 are provided in parts of the protective layer 651 over the semiconductor layer 505 to connect the first electrode 506A and the second electrode 506B to the semiconductor layer 505. Further, an opening 606 and an opening 607 are provided in parts of the protective layer 651 over the semiconductor layer 505 to connect the first electrode 546A and the second electrode 546B to the semiconductor layer 505. This structure makes it possible to suppress deterioration of the semiconductor layer 505 due to exposure of part of the semiconductor layer 505 to an etching gas or an etchant in the etching step of the semiconductor layer 505 or the etching step for forming the first electrode 506A, the second electrode 506B, the first electrode 546A, and the second electrode 546B.

Note that the openings 601, 602, 606, and 607 in the layout of the pixel 410 in FIG. 13 are preferably formed by processing with a photomask using optical proximity correction (OPC). When the opening 601 and the opening 602 for connecting the first electrode 506A and the second electrode 506B to the semiconductor layer 505 in the first transistor 411, and the opening 606 and the opening 607 for connecting the first electrode 546A and the second electrode 546B to the semiconductor layer 505 in the second transistor 412 are formed with a photomask using OPC, deformation of the openings due to diffraction of light is suppressed, so that variations in channel width and channel length of the transistors can be reduced.

The cross section A1-A2 shows the stacked structure of the first transistor 411 and the second transistor 412. The first transistor 411 and the second transistor 412 are bottom-gate transistors. The cross section B1-B2 shows the stacked structure from the wiring 516_j to the wiring 563, including the EL element 414 and the groove portion 530. Further, the cross section C1-C2 shows the groove portion 530 and the stacked structure of an intersection of the wiring 563 and the wiring 512_i. The cross section D1-D2 shows the stacked structure of an intersection of the wiring 563 and the gate electrode 542 of the second transistor 412.

Figure 14C:
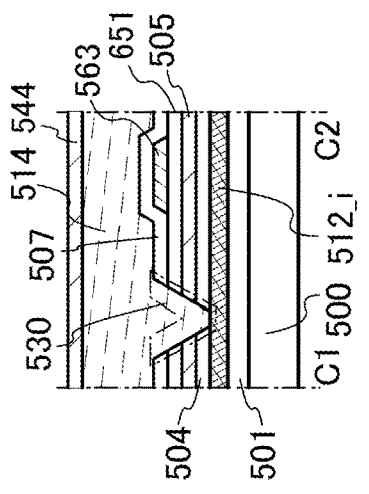
FIGS. 14A to 14D are cross-sectional views illustrating one embodiment of the present invention.
Figure 14D:
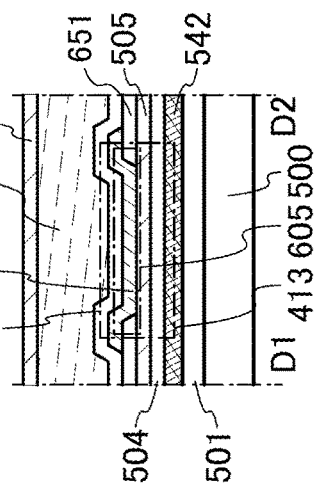
Figure 14A:
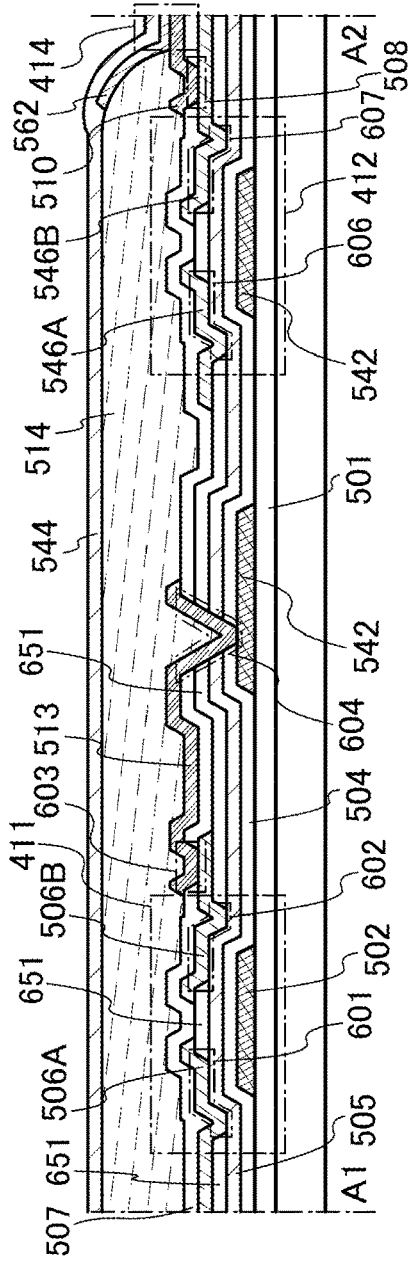

In the cross section A1-A2 in FIG. 14A, a base layer 501 is formed over a substrate 500, and a gate electrode 502 and the gate electrode 542 are formed over the base layer 501. Over the gate electrode 502 and the gate electrode 542, a gate insulating layer 504 and the semiconductor layer 505 are formed. The protective layer 651 is formed over the semiconductor layer 505. The first electrode 506A, the second electrode 506B, the first electrode 546A, and the second electrode 546B are formed over the protective layer 651. The semiconductor layer 505 is connected to the first electrode 506A and the second electrode 506B through the opening 601 and the opening 602 formed in the protective layer 651. Further, the semiconductor layer 505 is connected to the first electrode 546A and the second electrode 546B through the opening 606 and the opening 607 formed in the protective layer 651. An insulating layer 507 is formed over the first electrode 506A, the second electrode 506B, the first electrode 546A, and the second electrode 546B to be in contact with part of the protective layer 651. Over the insulating layer 507, one electrode 510 of the EL element 414 and the wiring 513 are formed. The electrode 510 is connected to the second electrode 546B through an opening 508 formed in the insulating layer 507. The wiring 513 is connected to the second electrode 506B through an opening 603 formed in the insulating layer 507, and is connected to the gate electrode 542 through an opening 604 in which part of the gate insulating layer 504, part of the semiconductor layer 505, part of the protective layer 651, and part of the insulating layer 507 are removed. Further, a partition layer 514 used for separately coloring EL layers with corresponding colors is formed over part of the electrode 510, the wiring 513, and the insulating layer 507. Over the electrode 510, an EL layer 562 is formed in an opening provided in the partition layer 514. The other electrode 544 of the EL element 414, which is part of the wiring 503, is provided over the EL layer 562 and the partition layer 514. Note that a region where the electrode 510, the EL layer 562, and the electrode 544 are stacked serves as the EL element 414.

Figure 14B:
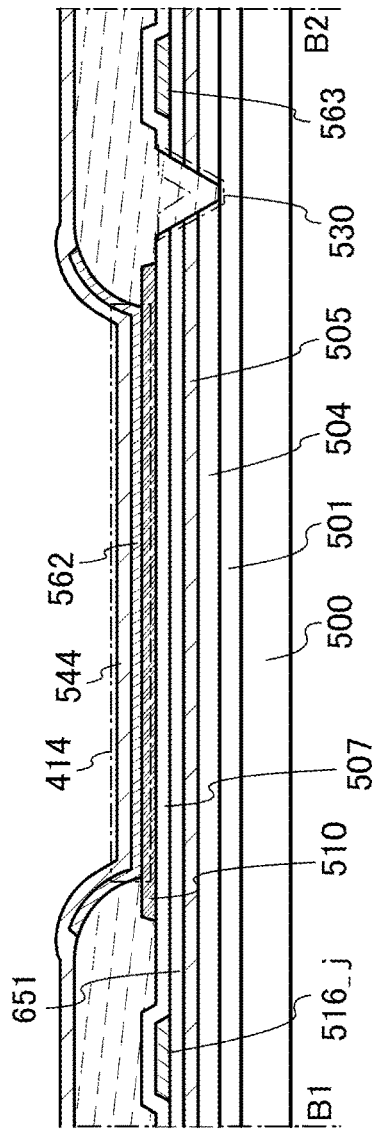

In the cross section B 1-B2 illustrated in FIG. 14B, the base layer 501 is formed over the substrate 500, the gate insulating layer 504 is formed over the base layer 501, and the semiconductor layer 505 is formed over the gate insulating layer 504. The protective layer 651 is formed over the semiconductor layer 505. The wiring 516_j and the wiring 563 are formed over the protective layer 651, and the insulating layer 507 is formed over the protective layer 651, the wiring 516_j, and the wiring 563. The electrode 510 is formed over the insulating layer 507. Further, the partition layer 514 used for separately coloring EL layers with corresponding colors is formed over the insulating layer 507 and part of the electrode 510. Over the electrode 510, the EL layer 562 is formed in the opening provided in the partition layer 514. The electrode 544 is provided over the EL layer 562 and the partition layer 514. The stack of the electrode 510, the EL layer, and the electrode 544 serves as the EL element 414.

The groove portion 530 is formed between the wiring 563 and the electrode 510 by removing part of the gate insulating layer 504, part of the semiconductor layer 505, part of the protective layer 651, and part of the insulating layer 507. The groove portion 530 does not include a semiconductor layer at least on its bottom surface.

In the cross section C1-C2 illustrated in FIG. 14C, the base layer 501 is formed over the substrate 500, and the wiring 512_i is formed over the base layer 501. Over the wiring 512_i, the gate insulating layer 504 and the semiconductor layer 505 are formed. The protective layer 651 is formed over the semiconductor layer 505. Further, the wiring 563 is formed over the protective layer 651, and the insulating layer 507 is formed over the wiring 563. The partition layer 514 is formed over the insulating layer 507, and the electrode 544 is formed over the partition layer 514. Further, the groove portion 530 is formed by removing part of the gate insulating layer 504, part of the semiconductor layer 505, part of the protective layer 651, and part of the insulating layer 507.

In the cross section D1-D2 illustrated in FIG. 14D, the base layer 501 is formed over the substrate 500, and the gate electrode 542 is formed over the base layer 501. Over the gate electrode 542, the gate insulating layer 504 and the semiconductor layer 505 are formed. The protective layer 651 is formed over the semiconductor layer 505. An opening 605 is formed in the protective layer 651, the wiring 563 is formed over the semiconductor layer 505 in the opening 605, and the insulating layer 507 is formed over the wiring 563. The partition layer 514 is formed over the insulating layer 507, and the electrode 544 is formed over the partition layer 514.

A portion in which the gate electrode 542 and the wiring 563 overlap with each other with the gate insulating layer 504 and the semiconductor layer 505 interposed therebetween functions as the capacitor 413. The gate insulating layer 504 and the semiconductor layer 505 function as a dielectric layer. In the case where a multi-layer dielectric layer is formed between the gate electrode 542 and the wiring 563, even when a pinhole is generated in one dielectric layer, the pinhole is covered with another dielectric layer; accordingly, the capacitor 413 can operate normally. The relative permittivity of an oxide semiconductor is as high as 14 to 16. Accordingly, when an oxide semiconductor is used for the semiconductor layer 505, the capacitance value of the capacitor 413 can be increased.

Figure 15:
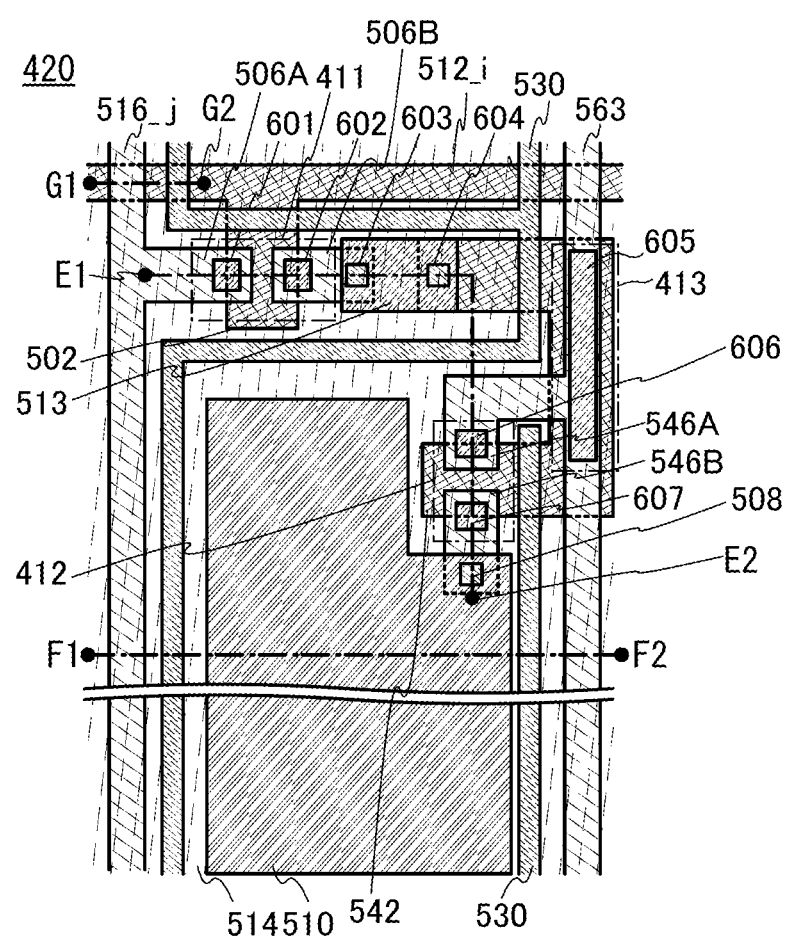
FIG. 15 is a top view illustrating one embodiment of the present invention.
Figure 16C:
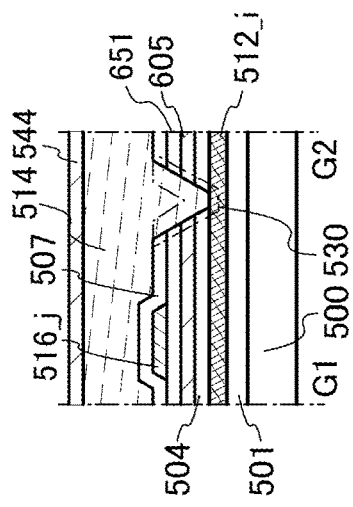
FIGS. 16A to 16C are cross-sectional views illustrating one embodiment of the present invention.
Figure 16A:
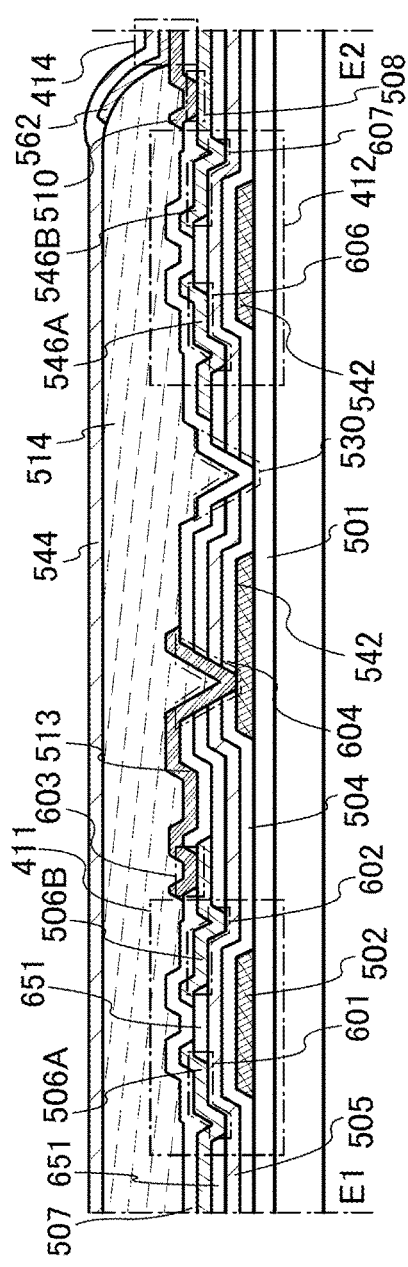
Figure 16B:
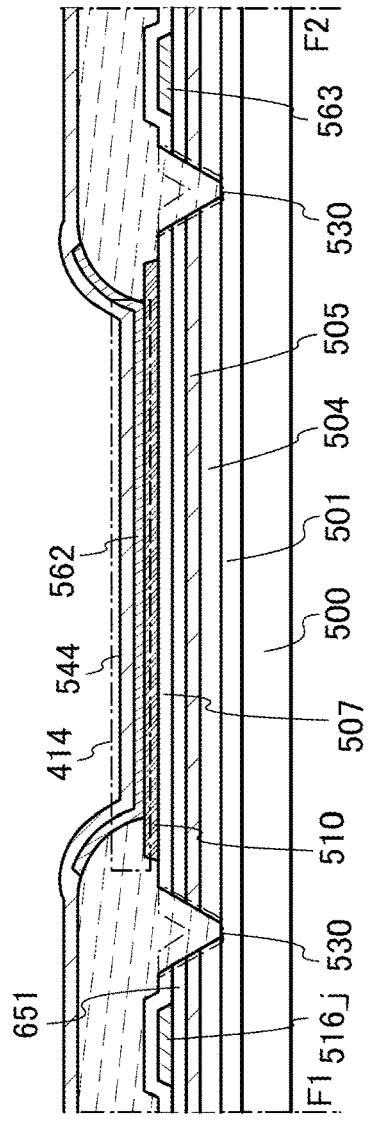

Next, an example of the pixel configuration, which is different from that illustrated in FIG. 13 will be described with reference to FIG. 15 and FIGS. 16A to 16C. FIG. 15 is a top view illustrating a plan structure of a pixel 420. Cross sections E1-E2, F1-F2, and G1-G2 in FIGS. 16A to 16C correspond to cross sections of portions indicated by chain lines E1-E2, F1-F2, and G1-G2 in FIG. 15. The pixel 420 illustrated in FIG. 15 is different from the pixel 410 illustrated in FIG. 13 in the structure of the groove portion 530.

The pixel 420 has a structure in which the groove portion 530 is provided between the wiring 516_j and the electrode 510 and between the wiring 516_j and the gate electrode 502 of the first transistor 411. The groove portion 530 is also provided between the gate electrode 502 of the first transistor 411 and the electrode 510. By making the area of the groove portion 530 larger, formation of parasitic transistors can be prevented more surely.

Figure 17:
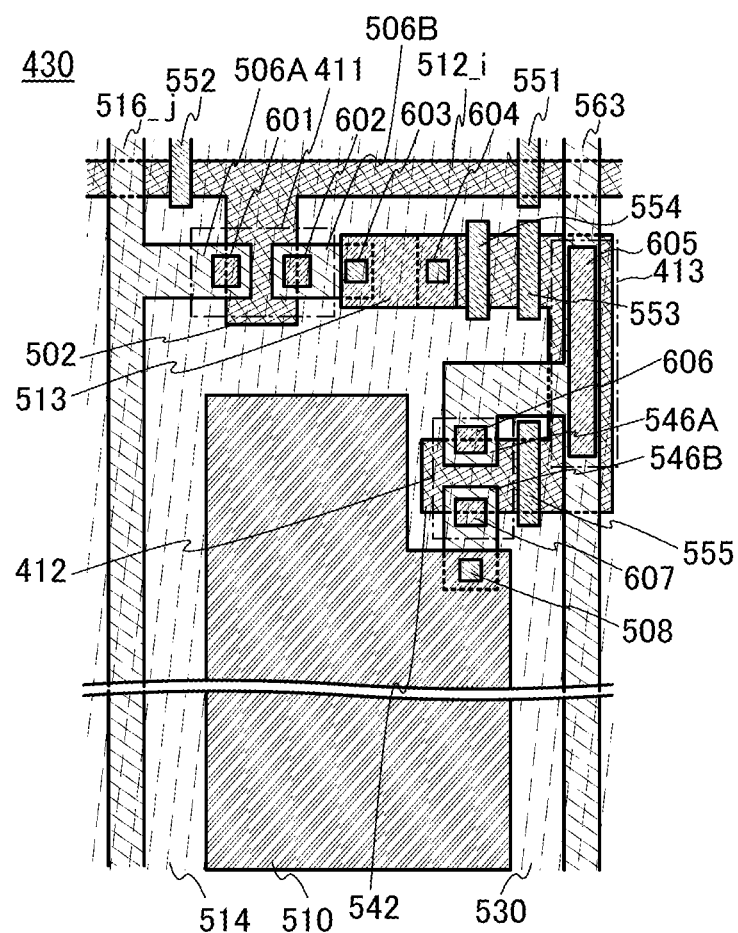
FIG. 17 is a top view illustrating one embodiment of the present invention.

Next, an example of the pixel configuration, which is different from those in FIG. 13, FIGS. 14A to 14D, FIG. 15, and FIGS. 16A to 16C, will be described with reference to FIG. 17. FIG. 17 is a top view illustrating a plan structure of a pixel 430.

The pixel 430 in FIG. 17 shows an example of a pixel configuration in which a plurality of groove portions which cross the wiring 512_i in the line width direction of the wiring 512_i across the both edges thereof is provided to reduce the influence of a parasitic channel formed by the overlap with the wiring 512_i more surely.

In the pixel 430, a groove portion 551 and a groove portion 552 in which the semiconductor layer 505 is removed are provided so as to cross the wiring 512_i in the line width direction of the wiring 512_i across the both edges thereof. When a plurality of groove portions which cross the wiring 512_i in the line width direction of the wiring 512_i across the both edges thereof is provided, the influence of a parasitic channel formed by the overlap with the wiring 512_i can be reduced more surely.

In the pixel 430, a groove portion 553, a groove portion 554, and a groove portion 555 in which the semiconductor layer 505 is removed are provided so as to cross the gate electrode 542 in the line width direction of the gate electrode 542 across the both edges thereof. When a plurality of groove portions which cross the gate electrode 542 in the line width direction of the gate electrode 542 across the both edges thereof is provided, the influence of a parasitic channel formed by the overlap with the gate electrode 542 can be reduced more surely.

Next, examples of the structures of the terminal 405 and the terminal 406 will be described with reference to FIGS. 19A1, 19A2, 19B1, and 19B2. FIGS. 19A1 and 19A2 are a plan view and a cross-sectional view, respectively, of the terminal 405. A chain line J1-J2 in FIG. 19A1 corresponds to a cross section J1-J2 in FIG. 19A2. FIGS. 19B1 and 19B2 are a plan view and a cross-sectional view, respectively, of the terminal 406. A chain line K1-K2 in FIG. 19B1 corresponds to a cross section K1-K2 in FIG. 19B2. In the cross sections J1-J2 and K1-K2, J2 and K2 correspond to end portions of the substrate.

In the cross section J1-J2, the base layer 501 is formed over the substrate 500, and the wiring 512 is formed over the baser layer 501. The gate insulating layer 504, the semiconductor layer 505, the protective layer 651, and the insulating layer 507 are formed over the wiring 512. An electrode 521 is formed over the insulating layer 507, and the electrode 521 is connected to the wiring 512 through an opening 519 formed in the gate insulating layer 504, the semiconductor layer 505, the protective layer 651, and the insulating layer 507.

In the cross section K1-K2, the base layer 501, the gate insulating layer 504, the semiconductor layer 505, and the protective layer 651 are formed over the substrate 500. The wiring 516 is formed over the protective layer 651, and the insulating layer 507 is formed over the wiring 516. An electrode 522 is formed over the insulating layer 507, and the electrode 522 is connected to the wiring 516 through an opening 520 formed in the insulating layer 507.

The terminal 407 can have a structure similar to that of the terminal 405 or the terminal 406.

The pixel region 402 and the terminal portion 404 are connected with n wirings 516. In the case where the wirings 516 extending from the pixel region 402 to the terminals 406 in the terminal portion 404 are located close to each other, a parasitic channel may be formed in a portion of the semiconductor layer 505, which is between the adjacent wirings 516, due to the potential difference between the adjacent wirings 516, and therefore the adjacent wirings 516 may be electrically connected to each other.

This phenomenon can be prevented by providing a conductive layer over the entire region from the pixel region 402 to the terminal portion 404 or between the adjacent wirings 516 with an insulating layer provided between the conductive layer and the semiconductor layer 505 and by setting the potential of the conductive layer to such a potential as not to form a parasitic channel in the semiconductor layer 505.

For example, since most of oxide semiconductors tend to be n-channel semiconductors, in the case of using an oxide semiconductor for the semiconductor layer 505, the potential of the conductive layer is set to a potential that is lower than the potential supplied to the wirings 516.

Further, it is also possible to prevent electrical connection between the adjacent wirings 516 by removing the semiconductor layer 505 between the adjacent wirings 516 in a step for forming groove portions that is described below.

Figure 20A:
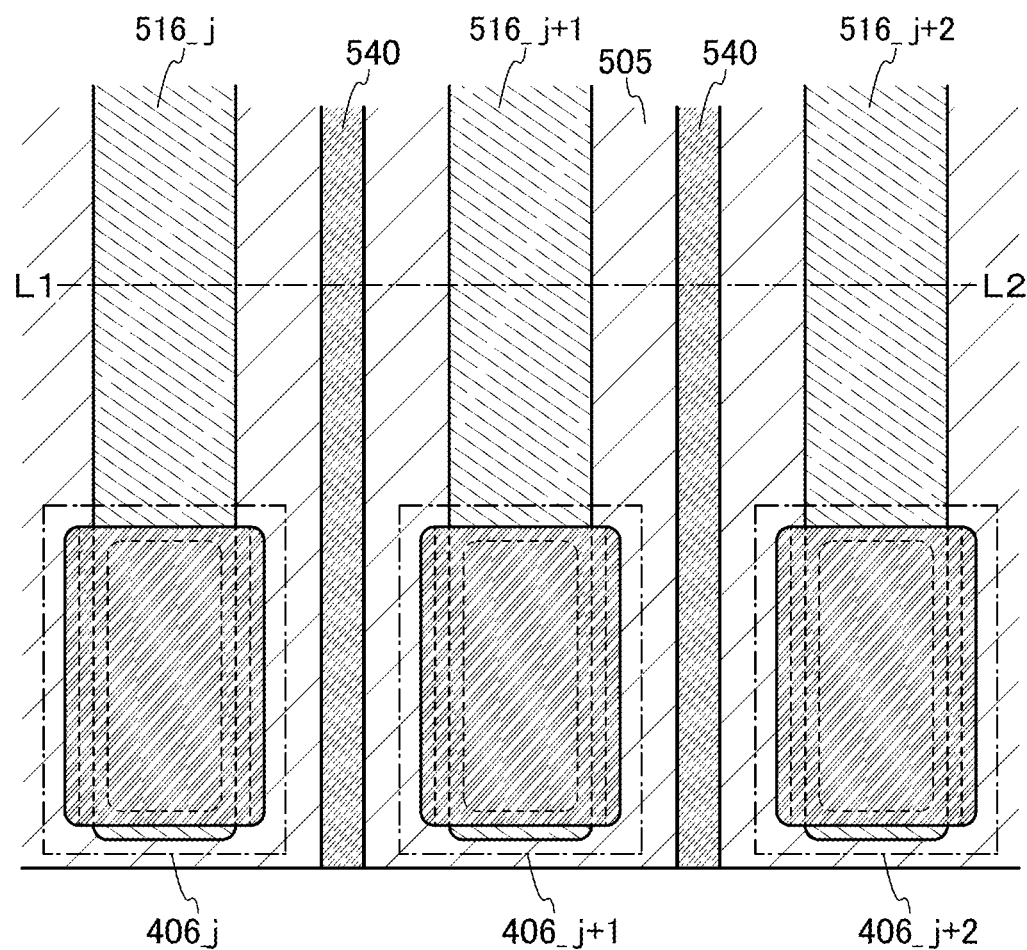
FIGS. 20A and 20B are a top view and a cross-sectional view illustrating one embodiment of the present invention.
Figure 20B:
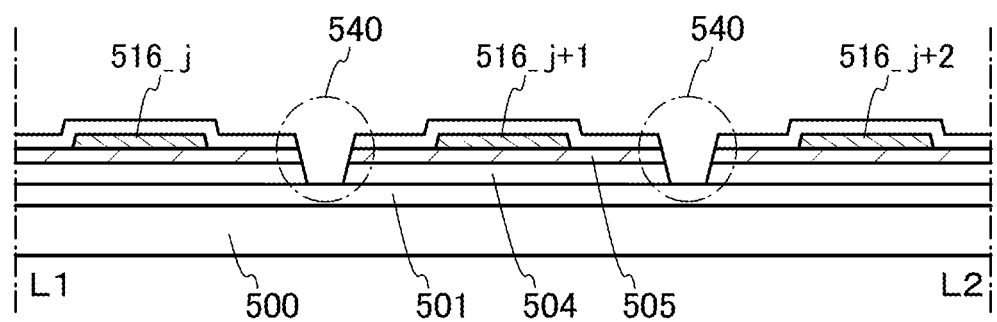
Figure 21A:
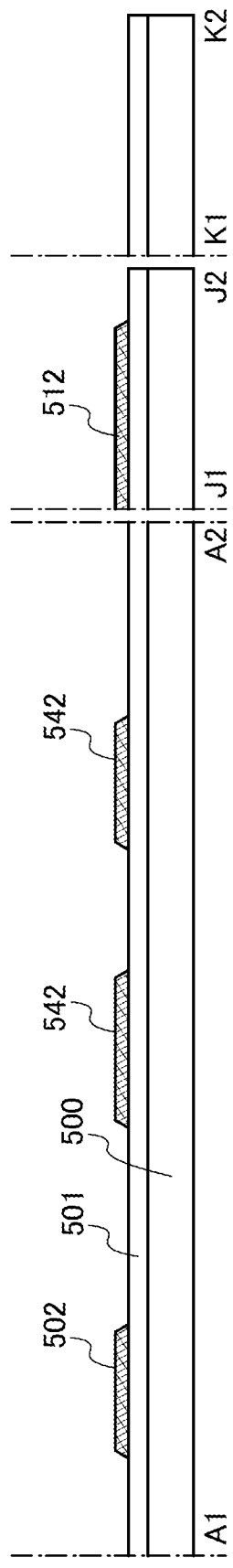
FIGS. 21A to 21C are cross-sectional views illustrating one embodiment of the present invention.
Figure 21B:
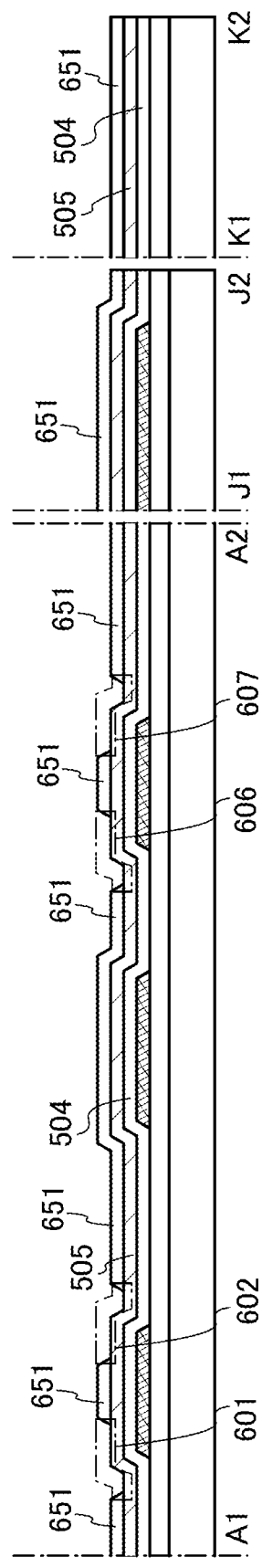
Figure 21C:
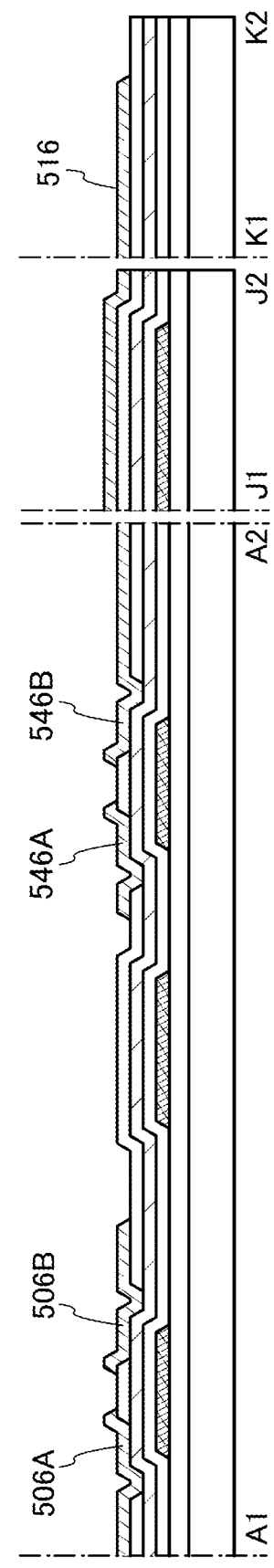

FIGS. 20A and 20B illustrate a structure in which the semiconductor layer 505 is removed by formation of groove portions 540 between the adjacent wirings 516. FIG. 20A is a top view illustrating a plan structure of the wirings 516 which are connected to the terminals 406. A cross section L1-L2 illustrated in FIG. 20B corresponds to a cross section in a portion indicated by a chain line L1-L2 in FIG. 20A. In FIG. 20A, the wiring 516_$j$ is connected to the terminal 406_$j$, the wiring 516_$j$+1 is connected to the terminal 406_$j$+1, and the wiring 516_$j$+2 is connected to the terminal 406_$j$+2. Note that the groove portions 540 can be formed in a manner similar to that of the groove portions 530.

The groove portion 540 in which the semiconductor layer 505 is removed is formed between the adjacent wirings 516_$j$ and 516_$j$+1. The groove portion 540 in which the semiconductor layer 505 is removed is formed between the adjacent wirings 516_$j$+1 and 516_$j$+2. By providing the groove portions 540 in which the semiconductor layer 505 is removed between the adjacent wirings 516, electrical connection between the adjacent wirings 516 can be prevented.

Although the size of the groove portion 540 in which the semiconductor layer 505 is removed is not particularly limited, for surely preventing formation of a parasitic channel, the width of the portion where the semiconductor layer is removed in the groove portion 540 in a direction perpendicular to the direction in which the wiring 516_$j$ or the wiring 516_$j$+1 extends is preferably 1 μm or more, further preferably 2 μm or more.

Then, a manufacturing method of the pixel portion of the EL display device described with reference to FIG. 13 will be described with reference to FIGS. 21A to 21C and FIGS. 22A to 22C. Note that cross sections A1-A2, J1-J2, and K1-K2 in FIGS. 21A to 21C and FIGS. 22A to 22C are cross-sectional views of the portions taken along the chain lines A1-A2, J1-J2, and K1-K2 in FIG. 13 and FIGS. 19A1, 19A2, 19B1, and 19B2, respectively. Note that a structure in which an oxide semiconductor is used for the semiconductor layer is specifically described in the description of the manufacturing method using FIGS. 21A to 21C and FIGS. 22A to 22C. The advantages of using an oxide semiconductor for the semiconductor layer are as described above.

First, an insulating layer to be the base layer 501 is formed with a thickness of greater than or equal to 50 nm and less than or equal to 300 nm, preferably greater than or equal to 100 nm and less than or equal to 200 nm over the substrate 500. As the substrate 500, a glass substrate, a ceramic substrate, a plastic substrate that has high heat resistance enough to withstand a process temperature of this manufacturing process, or the like can be used. As the glass substrate, for example, an alkali-free glass substrate of barium borosilicate glass, aluminoborosilicate glass, aluminosilicate glass, or the like may be used. In this embodiment, aluminoborosilicate glass is used for the substrate 500.

The base layer 501 can be formed with a single-layer structure or a stacked structure using one or more of the following insulating layers: an aluminum nitride layer, an aluminum oxynitride layer, a silicon nitride layer, a silicon oxide layer, a silicon nitride oxide layer, and a silicon oxynitride layer. The base layer 501 has a function of preventing diffusion of impurity elements from the substrate 500. Note that in this specification, silicon nitride oxide contains more nitrogen than oxygen and, in the case where measurements are performed using RBS and HFS, contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The base layer 501 can be formed by a sputtering method, a CVD method, a coating method, a printing method, or the like as appropriate.

In this embodiment, a stack of a silicon nitride layer and a silicon oxide layer is used as the base layer 501. Specifically, a 50-nm-thick silicon nitride layer is formed over the substrate 500, and a 150-nm-thick silicon oxide layer is formed over the silicon nitride layer.

Next, over the base layer 501, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 502, the gate electrode 542, and the wiring 512 are formed.

The conductive layer for forming the gate electrode 502, the gate electrode 542, and the wiring 512 can be formed with a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy containing any of these elements as its main component.

In this embodiment, the conductive layer is formed as follows: a 5-nm-thick Ti layer is formed over the base layer 501, and a 250-nm-thick Cu layer is formed over the Ti layer. Then, the conductive layer is selectively removed by etching through the first photolithography step, whereby the gate electrode 502, the gate electrode 542, and the wiring 512 are formed (see FIG. 21A). The formed gate electrode 502, gate electrode 542, and wiring 512 preferably have tapered edges because coverage with an insulating layer or a conductive layer that is later to be stacked thereover can be improved.

Note that unless otherwise specified, a photolithography step in this specification includes a step of forming a resist mask, a step of etching a conductive layer or an insulating layer, and a step of separating the resist mask.

Then, the gate insulating layer 504 is formed with a thickness of greater than or equal to 50 nm and less than or equal to 800 nm, preferably greater than or equal to 100 nm and less than or equal to 600 nm over the gate electrode 502, the gate electrode 542, and the wiring 512.

The gate insulating layer 504 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate ($HfSi_xO_y$ (x>0, y>0)), hafnium silicate to which nitrogen is added, hafnium aluminate to which nitrogen is added, or the like by a plasma CVD method, a sputtering method, or the like. The gate insulating layer 504 is not limited to a single layer and may be a stack of different layers. For example, the gate insulating layer 504 may be formed in the following manner: a silicon nitride ($SiN_y$ (y>0)) layer is formed by a plasma CVD method as a gate insulating layer A and a silicon oxide ($SiO_x$ (x>0)) layer is stacked over the gate insulating layer A as a gate insulating layer B.

Other than a sputtering method and a plasma CVD method, the gate insulating layer 504 can be formed by a film formation method such as a high-density plasma CVD method using microwaves (e.g., a frequency of 2.45 GHz).

In this embodiment, a stack of a silicon nitride layer and a silicon oxide layer is used as the gate insulating layer 504. Specifically, a 50-nm-thick silicon nitride layer is formed over the gate electrode 502 and the gate electrode 542, and a 100-nm-thick silicon oxide layer is formed over the silicon nitride layer.

The gate insulating layer 504 may be formed using an insulating material containing the same kind of component as the oxide semiconductor that is formed later. In the case of stacking layers of different materials to form the gate insulating layer 504, a layer in contact with the oxide semiconductor may be formed using an insulating material containing the same kind of component as the oxide semiconductor. This is because such a material is compatible with the oxide semiconductor, and therefore, the use of such a material for the gate insulating layer 504 enables a state of the interface between the gate insulating layer 504 and the oxide semiconductor to be kept well. Here, "the same kind of component as the oxide semiconductor" means one or more of elements selected from constituent elements of the oxide semiconductor.

Specifically, in the case where an oxide material containing In, Ga, and Zn is used for the oxide semiconductor layer, a material in which Ga, among In, Ga, and Zn that are elements contained in the oxide semiconductor, is replaced with an element which becomes a tetravalent cation is preferably used as the insulating material that can be used for the gate insulating layer 504 and contains the same kind of component as the oxide semiconductor that is formed later.

Examples of an element which becomes a tetravalent cation are Ti, Zr, and Hf, which are Group 4 elements in the periodic table, and Ge, which is a Group 14 element in the periodic table. When Ga, which becomes a trivalent cation, in the IGZO is replaced with any of the above Group 4 elements and Group 14 element in the periodic table, the element can be bonded more strongly to oxygen included in the oxide semiconductor and thus enables the gate insulating layer 504 to have a higher insulating property than the IGZO.

Alternatively, cerium (Ce), which is a lanthanoid, may be used as the element which becomes a tetravalent cation; the gate insulating layer 504 can have a higher insulating property than the IGZO by replacement of Ga with Ce.

Further, in the case where an oxide material containing In, Ga, and Zn is used for the oxide semiconductor layer, a material in which Ga, among In, Ga, and Zn that are elements contained in the oxide semiconductor, is replaced with yttrium (Y) is also preferable as the insulating material that can be used for the gate insulating layer 504 and contains the same kind of component as the oxide semiconductor. There can be a large difference in electronegativity between yttrium, which has a smaller electronegativity than Ga, and oxygen, so that yttrium can form a stronger ionic bond with oxygen in the oxide semiconductor and thus enables the gate insulating layer 504 to have a higher insulating property than the IGZO.

In the case of employing a stacked structure, the gate insulating layer 504 may have a stacked structure of a film formed using an insulating material containing the same kind of component as the oxide semiconductor and a film formed using a material different from that of the film In the case of using an oxide semiconductor layer as the semiconductor layer, in order that the oxide semiconductor layer contains hydrogen, a hydroxyl group, and moisture as little as possible, it is preferable to preheat the substrate 500 in a preheating chamber of a sputtering apparatus as pretreatment before the formation of the oxide semiconductor layer so that impurities such as hydrogen or moisture adsorbed on the substrate 500 or the gate insulating layer 504 are eliminated and removed. As an exhaustion unit provided in the preheating chamber, a cryopump is preferable. Note that this preheating treatment can be omitted. Further, this preheating may be similarly performed on the substrate 500 over which the gate electrode 502, the gate electrode 542, and the wiring 512 are formed before the formation of the gate insulating layer 504.

An oxide semiconductor used for the semiconductor layer 505 preferably contains at least indium (In) or zinc (Zn). In particular, In and Zn are preferably contained. In addition, as a stabilizer for reducing variation in electric characteristics of a transistor formed using the semiconductor layer, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In-Zn-based oxide, a Sn-Zn-based oxide, an Al-Zn-based oxide, a Zn-Mg-based oxide, a Sn-Mg-based oxide, an In-Mg-based oxide, or an In-Ga-based oxide, a three-component metal oxide such as an In-Ga-Zn-based oxide (also referred to as IGZO), an In-Al-Zn-based oxide, an In-Sn-Zn-based oxide, a Sn-Ga-Zn-based oxide, an Al-Ga-Zn-based oxide, a Sn-Al-Zn-based oxide, an In-Hf-Zn-based oxide, an In-La-Zn-based oxide, an In-Ce-Zn-based oxide, an In-Pr-Zn-based oxide, an In-Nd-Zn-based oxide, an In-Sm-Zn-based based oxide, an In-Eu-Zn-based oxide, an In-Gd-Zn-based oxide, an In-Tb-Zn-based oxide, an In-Dy-Zn-based oxide, an In-Ho-Zn-based oxide, an In-Er-Zn-based oxide, an In-Tm-Zn-based oxide, an In-Yb-Zn-based oxide, or an In-Lu-Zn-based oxide, or a four-component metal oxide such as an In-Sn-Ga-Zn-based oxide, an In-Hf-Ga-Zn-based oxide, an In-Al-Ga-Zn-based oxide, an In-Sn-Al-Zn-based oxide, an In-Sn-Hf-Zn-based oxide, or an In-Hf-Al-Zn-based oxide can be used.

The oxide semiconductor layer preferably includes In, more preferably In and Ga. It is effective to perform dehydration or dehydrogenation in a later step in order to increase the purity of the oxide semiconductor layer.

Here, for example, an In-Ga-Zn-based oxide means an oxide containing indium (In), gallium (Ga), and zinc (Zn) and there is no particular limitation on the ratio of In:Ga:Zn. The In-Ga-Zn-based oxide may contain a metal element other than In, Ga, and Zn.

The oxide semiconductor is in a single crystal state, a polycrystalline (also referred to as polycrystal) state, an amorphous state, or the like. The oxide semiconductor is preferably a c-axis aligned crystalline oxide semiconductor (CAAC-OS).

The CAAC-OS is not completely single crystal nor completely amorphous. The CAAC-OS is an oxide semiconductor with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS, distribution of crystal parts is not necessarily uniform. For example, in the formation process of the CAAC-OS, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS, the crystal part in a region to which the impurity is added becomes amorphous in some cases.

Since the c-axes of the crystal parts included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

With use of the CAAC-OS in a transistor, change in electrical characteristics of the transistor due to irradiation with visible light or ultraviolet light is reduced.

Next, the semiconductor layer 505 is formed by a sputtering method, an evaporation method, a PCVD method, a PLD method, an ALD method, an MBE method, or the like.

The semiconductor layer 505 is formed in an oxygen gas atmosphere preferably by a sputtering method. At this time, the substrate temperature is set to higher than or equal to 100° C. and lower than or equal to 600° C., preferably higher than or equal to 150° C. and lower than or equal to 550° C., more preferably higher than or equal to 200° C. and lower than or equal to 500° C. The thickness of the semiconductor layer 505 is greater than or equal to 1 nm and less than or equal to 40 nm, preferably greater than or equal to 3 nm and less than or equal to 20 nm. The impurity concentration in the obtained semiconductor layer 505 is decreased with an increase in the substrate temperature in film formation. Further, the atomic arrangement in the semiconductor layer 505 is ordered and the density thereof is increased, so that a polycrystalline oxide semiconductor or a CAAC-OS is likely to be formed. Furthermore, since an oxygen gas atmosphere is employed for the deposition, an unnecessary atom such as a rare gas atom is not contained in the semiconductor layer 505, so that a polycrystalline oxide semiconductor or a CAAC-OS is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. The thinner the semiconductor layer 505 is, the lower the short channel effect of the transistor is. However, when the semiconductor layer 505 is too thin, the semiconductor layer 505 is significantly influenced by interface scattering; thus, the field effect mobility might be decreased.

In the case of forming the semiconductor layer 505 using an In-Ga-Zn-based oxide material by a sputtering method, it is preferable to use an In-Ga-Zn-based oxide target having an atomic ratio of In: Ga:Zn=1:1:1, 4:2:3, 3:1:2, 1:1:2, 2:1:3, or 3:1:4. When the semiconductor layer 505 is formed using an In-Ga-Zn-based oxide target having the aforementioned atomic ratio, a polycrystalline oxide semiconductor or a CAAC-OS is likely to be formed.

In this embodiment, the oxide semiconductor layer is formed with a thickness of 30 nm by a sputtering method with the use of an In-Ga-Zn-based oxide target. The oxide semiconductor layer can be formed by a sputtering method in a rare gas (typically, argon) atmosphere, an oxygen atmosphere, or a mixed atmosphere of a rare gas and oxygen.

As a target for forming the oxide semiconductor layer by a sputtering method, for example, a metal oxide target having a composition ratio of $In_2O_3:Ga_2O_3:ZnO=1:1:1$ [molar ratio] is used to form an In—Ga—Zn—O layer.

It is preferable that a high-purity gas from which impurities such as hydrogen, water, a hydroxyl group, and hydride are removed be used as a sputtering gas for the formation of the oxide semiconductor layer. For example, when argon is used as a sputtering gas, it is preferable that the purity be 9N, the dew point be −121° C., the content of $H_2O$ be $_{0.1}$ ppb or lower, and the content of $H_2$ be 0.5 ppb or lower. When oxygen is used as a sputtering gas, it is preferable that the purity be 8 N, the dew point be −112° C., the content of $H_2O$ be 1 ppb or lower, and the content of $H_2$ be 1 ppb or lower.

When the oxide semiconductor layer is formed, the substrate is held in a deposition chamber kept under reduced pressure, and the substrate temperature is set to a temperature higher than or equal to 100° C. and lower than or equal to 600° C., preferably higher than or equal to 300° C. and lower than or equal to 500° C.

By heating the substrate during the film formation, the concentration of impurities such as hydrogen, moisture, hydride, or hydroxide in the formed oxide semiconductor layer can be reduced. In addition, damage by sputtering can be reduced. Then, a sputtering gas from which hydrogen and moisture are removed is introduced into the deposition chamber while moisture remaining therein is removed, and the oxide semiconductor layer is formed with the use of the above target.

In order to remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor layer formed in the deposition chamber can be reduced.

An example of the deposition conditions is as follows: the distance between the substrate and the target is 100 mm; the pressure is 0.6 Pa, the direct current (DC) power is 0.5 kW; and oxygen (the proportion of the oxygen flow rate is 100%) is used as a sputtering gas. Note that a pulsed direct-current power source is preferably used, in which case powder substances (also referred to as particles or dust) that are generated in deposition can be reduced and the film thickness can be uniform.

Next, first heat treatment is performed. By the first heat treatment, excessive hydrogen (including water and a hydroxyl group) in the oxide semiconductor layer is removed (dehydration or dehydrogenation), whereby the impurity concentration in the oxide semiconductor layer can be reduced.

The first heat treatment is performed at a temperature higher than or equal to 250° C. and lower than or equal to 750° C., or higher than or equal to 400° C. and lower than the strain point of the substrate, in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system).

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the first heat treatment can employ GRTA, in which the substrate is transferred into an inert gas heated at a high temperature, and heated for several minutes there, and then taken out from the inert gas.

When the heat treatment is performed in an atmosphere of an inert gas such as nitrogen or a rare gas, oxygen, or ultra-dry air, it is preferable that the atmosphere do not contain water, hydrogen, or the like. The purity of nitrogen, oxygen, or the rare gas which is introduced into the heat treatment apparatus is preferably 6 N (99.9999%) or higher, further preferably 7 N (99.99999%) or higher (i.e., the impurity concentration is preferably 1 ppm or lower, further preferably 0.1 ppm or lower).

The first heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor layer can be reduced; however, oxygen vacancies are caused at the same time. By the heat treatment in the oxidation atmosphere, the caused oxygen vacancies can be reduced.

In the oxide semiconductor which is purified by sufficiently reducing the hydrogen concentration and in which defect levels in an energy gap due to oxygen deficiency are reduced by supplying a sufficient amount of oxygen, the carrier concentration is less than $1\times10^{12}$ /cm$^3$, preferably less than $1\times10^{11}$ /cm$^3$, further preferably less than $1.45\times10^{10}$ /cm$^3$. For example, the off-state current (per unit channel width (1 μm) here) at room temperature (25° C.) is 100 zA (1 zA (zeptoampere) is $1\times10^{-21}$A) or less, preferably 10 zA or less. The off-state current at 85° C. is 100 zA ($1\times10^{-19}$A) or less, preferably 10 zA ($1\times10'$ A) or less. In this manner, by using an oxide semiconductor which is made to be an i-type (intrinsic) or substantially i-type oxide semiconductor, the first transistor 411 and the second transistor 412 with excellent off-state current characteristics can be obtained.

The electrical characteristics of a transistor including a purified oxide semiconductor, such as the threshold voltage and the on-state current, have almost no temperature dependence. Further, transistor characteristics hardly change due to light deterioration.

As described above, variation in electric characteristics of a transistor including a purified and i-type (intrinsic) oxide semiconductor obtained by reducing the oxygen vacancies is suppressed and thus, the transistor is electrically stable. Accordingly, an EL display device including an oxide semiconductor, which has high reliability and stable electric characteristics, can be provided.

Next, the protective layer 651 is formed over the semiconductor layer 505. The protective layer 651 can be formed using a material and a method similar to those of the gate insulating layer 504.

When the protective layer 651 in contact with the semiconductor layer 505 contains much oxygen, the protective layer 651 can function as a supply source which supplies oxygen to the semiconductor layer 505.

In this embodiment, a 200-nm-thick silicon oxide layer is used as the protective layer 651. Then, a resist mask is formed over the protective layer 651 by a second photolithography step and part of the protective layer 651 over the semiconductor layer 505 is selectively removed, whereby the openings 601, 602, 606, and 607 are formed (see FIG. 21B). The protective layer which remains over the semiconductor layer 505 after the formation of the openings 601, 602, 606, and 607 has a trapezoidal or triangular cross-sectional shape, and the taper angle θ of a lower end portion of the cross-sectional shape is 60° or less, preferably 45° or less, further preferably 30° or less. For example, in this embodiment, a resist mask is formed over the silicon oxide layer by a photolithography step and selective etching is performed, so that the protective layer 651 whose cross-sectional shape is a trapezoid and whose taper angle θ at the lower end portion is about 30° is formed. Although not illustrated, by this photolithography step, the opening 605 is formed in a manner similar to that of the openings 601, 602, 606, and 607.

Heat treatment may be performed after the protective layer 651 is formed. In this embodiment, heat treatment is performed at 300° C. for one hour in a nitrogen atmosphere.

The protective layer 651 may be formed using an insulating material containing the same kind of component as the semiconductor layer 505. In the case of stacking layers of different materials to form the protective layer 651, a layer in contact with the oxide semiconductor may be formed using an insulating material containing the same kind of component as the oxide semiconductor. This is because such a material is compatible with the oxide semiconductor, and therefore, the use of such a material for the protective layer 651 enables a state of the interface between the protective layer 651 and the oxide semiconductor to be kept well. Here, "the same kind of component as the oxide semiconductor" means one or more of elements selected from constituent elements of the oxide semiconductor.

Specifically, in the case where an oxide material containing In, Ga, and Zn is used for the oxide semiconductor layer, a material in which Ga, among In, Ga, and Zn that are elements contained in the oxide semiconductor, is replaced with an element which becomes a tetravalent cation is preferably used as the insulating material that can be used for the protective layer 651 and contains the same kind of component as the oxide semiconductor.

Examples of an element which becomes a tetravalent cation are Ti, Zr, and Hf, which are Group 4 elements in the periodic table, and Ge, which is a Group 14 element in the periodic table. When Ga, which becomes a trivalent cation, in the IGZO is replaced with any of the above Group 4 elements and Group 14 element in the periodic table, the element can be bonded more strongly to oxygen included in the oxide semiconductor and thus enables the protective layer 651 to have a higher insulating property than the IGZO.

Alternatively, cerium (Ce), which is a lanthanoid, may be used as the element which becomes a tetravalent cation; the protective layer 651 can have a higher insulating property than the IGZO by replacement of Ga with Ce.

Further, in the case where an oxide material containing In, Ga, and Zn is used for the oxide semiconductor layer, a material in which Ga, among In, Ga, and Zn that are elements contained in the oxide semiconductor, is replaced with yttrium (Y) is also preferable as the insulating material that can be used for the protective layer 651 and contains the same kind of component as the oxide semiconductor. There can be a large difference in electronegativity between yttrium, which has a smaller electronegativity than Ga, and oxygen, so that yttrium can form a stronger ionic bond with oxygen in the oxide semiconductor and thus enables the protective layer 651 to have a higher insulating property than the IGZO.

In the case of employing a stacked structure, the protective layer 651 may have a stacked structure of a film formed using an insulating material containing the same kind of component as the oxide semiconductor and a film formed using a material different from that of the film.

Note that impurities are likely to be attached to a surface of the semiconductor layer 505 which is exposed by the etching for forming the openings 601, 602, 606, and 607. The impurities include an element which is included in an etching gas or an etchant used for the etching, an element which exists in a treatment chamber where the etching is performed, or the like. Specific examples of the impurities are boron, chlorine, fluorine, carbon, and aluminum.

Next, surfaces of the semiconductor layer 505 and the protective layer 651 are subjected to cleaning treatment. The cleaning treatment can be performed using an alkaline solution such as a TMAH solution, water, dilute hydrofluoric acid, or the like. Alternatively, the cleaning treatment can be performed by plasma treatment using oxygen, dinitrogen monoxide, or a rare gas (typically argon). The cleaning treatment can remove the above impurities attached to the surfaces of the semiconductor layer 505 and the protective layer 651.

Note that a dilute hydrofluoric acid in which 50 weight % hydrofluoric acid is diluted 100 times to 100000 times with water is preferably used for the cleaning treatment. When dilute hydrofluoric acid is used for the cleaning treatment, the impurities attached to the semiconductor layer 505 can be removed together with part of the semiconductor layer 505.

Next, a conductive layer which is to be the first electrode 506A, the second electrode 506B, the first electrode 546A, the second electrode 546B, and the wiring 516 is formed over the protective layer 651 and the semiconductor layer 505 in the openings 601, 602, 606, and 607. The conductive layer for forming the first electrode 506A, the second electrode 506B, the first electrode 546A, the second electrode 546B, and the wiring 516 can be formed using a material and a method similar to those of the gate electrode 502. The conductive layer for forming the first electrode 506A, the second electrode 506B, the first electrode 546A, the second electrode 546B, and the wiring 516 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

In this embodiment, the conductive layer is formed as follows: a 5-nm-thick Ti layer is formed over the protective layer 651 and the semiconductor layer 505 in the openings 601, 602, 606, and 607, and a 250-nm-thick Cu layer is formed over the Ti layer. Then, a resist mask is formed by a third photolithography step and the conductive layer is selectively removed by etching; thus, the first electrode 506A, the second electrode 506B, the first electrode 546A, the second electrode 546B, and the wiring 516 are formed (see FIG. 21C).

Next, the insulating layer 507 is formed over the first electrode 506A, the second electrode 506B, the first electrode 546A, the second electrode 546B, the protective layer 651, and the wiring 516. The insulating layer 507 can be formed using a material and a method similar to those of the gate insulating layer 504 or the base layer 501. Sputtering is preferably employed in terms of low possibility of entry of hydrogen, water, and the like. If hydrogen is contained in the insulating layer 507, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to form the insulating layer 507 by a method through which hydrogen and impurities containing hydrogen are not contained in the insulating layer 507.

As the insulating layer 507, an inorganic insulating material such as silicon oxide, silicon oxynitride, hafnium oxide, aluminum oxide, or gallium oxide can be typically used. Gallium oxide is a material which is hardly charged; therefore, variation in threshold voltage due to charge buildup of the insulating layer can be suppressed. Note that in the case where an oxide semiconductor is used for the semiconductor layer 505, a metal oxide layer containing the same kind of component as the oxide semiconductor may be formed as the insulating layer 507 or may be stacked together with the insulating layer 507.

In this embodiment, a 200-nm-thick silicon oxide layer is formed as the insulating layer 507 by a sputtering method. The substrate temperature in the film formation may be higher than or equal to room temperature and lower than or equal to 300° C., and in this embodiment, is 100° C. The silicon oxide layer can be formed by sputtering in a rare gas (typically argon) atmosphere, an oxygen atmosphere, or a mixed atmosphere of a rare gas and oxygen. As a target, silicon oxide or silicon can be used. For example, a silicon oxide layer can be formed by sputtering in an atmosphere containing oxygen with the use of silicon as the target.

In order to remove moisture remaining in the deposition chamber at the time of formation of the insulating layer 507, an entrapment vacuum pump (e.g., a cryopump) is preferably used. When the insulating layer 507 is formed in the deposition chamber evacuated using a cryopump, the impurity concentration in the insulating layer 507 can be reduced. In addition, as an exhaustion unit for removing moisture remaining in the chamber used for depositing the insulating layer 507, a turbo molecular pump provided with a cold trap may be used.

It is preferable that a high-purity gas from which impurities such as hydrogen, water, a hydroxyl group, and hydride are removed be used as a sputtering gas used for the formation of the insulating layer 507.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for a wiring layer formed by the first photolithography step or the third photolithography step, the heat treatment temperature is set to be 380° C. or lower, preferably 350° C. or lower. In the case where Cu is used for a wiring layer formed by the first photolithography step or the third photolithography step, the heat treatment temperature is set to be 450° C. or lower. For example, the second heat treatment may be performed at 450° C. for one hour in a nitrogen atmosphere. By the second heat treatment, part of the oxide semiconductor layer (a channel formation region) is heated in the state of being in contact with the insulating layer 507, so that oxygen can be supplied from the insulating layer 507 containing oxygen to the semiconductor layer 505. It is preferable that the above atmosphere do not contain water, hydrogen, or the like.

Next, a resist mask is formed by a fourth photolithography step, and part of the insulating layer 507 over the second electrode 506B is selectively removed, so that the opening 603 is formed. In addition, part of the insulating layer 507 over the second electrode 546B is selectively removed, so that the opening 508 is formed. Over the gate electrode 542, part of the insulating layer 507, part of the protective layer 651, part of the semiconductor layer 505, and part of the gate insulating layer 504 are selectively removed, so that the opening 604 is formed.

In addition, part of the insulating layer 507 over the wiring 516 in the cross section K1-K2 is selectively removed, so that the opening 520 is formed. Over the wiring 512 in the cross section J1-J2, part of the insulating layer 507, part of the protective layer 651, part of the semiconductor layer 505, and part of the gate insulating layer 504 are selectively removed, so that the opening 519 is formed (see FIG. 22A). Although not illustrated, by this photolithography step, the groove portions 530 are formed in a manner similar to that of the opening 519. Therefore, at side surfaces of the groove portions 530, the insulating layer 507, the protective layer 651, the semiconductor layer 505, and the gate insulating layer 504 are exposed.

For the etching of the insulating layer 507, the protective layer 651, the semiconductor layer 505, and the gate insulating layer 504, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride (CCl4)) can be employed as an etching gas used for the dry etching.

As a dry etching method, a parallel plate reactive ion etching (RIE) method, an inductively coupled plasma (ICP) etching method, or the like can be used. Since the base layer 501 has a function of preventing diffusion of an impurity element from the substrate 500, for the above etching, etching conditions are preferably adjusted so as to etch the base layer 501 as little as possible.

In general, etching of the semiconductor layer and formation of the opening are separately performed through their respective photolithography steps and etching steps; according to the manufacturing process of this embodiment, etching of the semiconductor layer and formation of the opening can be performed by one photolithography step and one etching step. Therefore, not only the number of photomasks but the number of photolithography steps can be reduced as well, which can reduce the number of etching steps after the photolithography steps. In other words, an EL display device can be manufactured at low cost with high productivity with a smaller number of photolithography steps.

In addition, according to the manufacturing process of this embodiment, a photoresist is not directly formed on the oxide semiconductor layer. Further, since the channel formation region in the oxide semiconductor layer is protected by the insulating layer 507, moisture is not attached to the channel formation region in the oxide semiconductor layer in later separation and cleaning steps of the photoresist; thus, variation in characteristics of the first transistor 411 and the second transistor 412 is reduced and the reliability is increased.

Next, a conductive layer which is to be the wiring 513, the electrode 510, the electrode 521, and the electrode 522 is formed over the second electrode 506B in the opening 603, the gate electrode 542 in the opening 604, the second electrode 546B in the opening 508, and the insulating layer 507. As the conductive layer which is to be the wiring 513, the electrode 510, the electrode 521, and the electrode 522, a light-transmitting conductive layer (also referred to as a transparent conductive layer) is formed with a thickness of more than or equal to 30 nm and less than or equal to 200 nm, preferably more than or equal to 50 nm and less than or equal to 100 nm by a sputtering method, a vacuum evaporation method, or the like (see FIG. 22B).

In this embodiment, an ITO layer with a thickness of 80 nm is formed as the light-transmitting conductive layer. By a fifth photolithography step, a resist mask is formed, and the light-transmitting conductive layer is selectively etched; thus, the wiring 513, the electrode 510, the electrode 521, and the electrode 522 are formed.

The wiring 513 is connected to the second electrode 506B through the opening 603 and to the gate electrode 542 through the opening 604. The electrode 510 is connected to the second electrode 546B through the opening 508. The electrode 521 is connected to the wiring 512 through the opening 519. The electrode 522 is connected to the wiring 516 through the opening 520.

In addition, in the opening 519 and the opening 520 formed in the terminal portion 403 and the terminal portion 404, it is important that the wiring 512 and the wiring 516 be not kept in an exposed state and be covered with an oxide conductive material such as ITO. When the wiring 512 and the wiring 516, which are metal layers, are kept in an exposed state, exposed surfaces are oxidized and contact resistance with an FPC or the like is increased. The increase in contact resistance causes distortion in waveform or delay of a signal that is input from the outside, and a signal from the outside cannot be transmitted correctly, so that the reliability of the semiconductor device is lowered. By covering the exposed surfaces of the wiring 512 and the wiring 516 with an oxide conductive material such as ITO, the increase in contact resistance can be prevented, and the reliability of the semiconductor device can be improved.

Note that the direction of light extraction from the EL element 414, and the like can be determined by appropriately selecting the material of the electrode 510 of the EL element 414 as well as the materials of the EL layer 562 and the electrode 544. In this embodiment, a structure in which light is extracted from the substrate 500 side is described.

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

Next, a material for forming the partition layer is provided in the cross section A1-A2, which corresponds to a cross section of the pixel portion. The material for forming the partition layer is an organic insulating material or an inorganic insulating material. An opening 565 is formed in the partition layer 514 by a sixth photolithography step. The opening 565 is formed in the material for forming the partition layer over the electrode 510. Note that it is possible to make a sidewall of the opening 565 have a continuous curvature in its cross-sectional shape by use of a photosensitive resin material as the material for forming the partition layer. Then, the EL layer 562 is formed in a region in contact with the electrode 510 in the opening 565. Next, the electrode 544 is formed over the EL layer 562 and the partition layer 514 to serve as the other electrode of the EL element 414 (see FIG. 22C).

Note that the EL layer 562 may be formed by stacking a hole-injection layer, a hole-transport layer, a light-emitting layer, an electron-transport layer, an electron-injection layer, and the like. When the electrode 510 is used as an anode and a material with a high work function is used therefor, a metal material with a low work function may be used for the electrode 544, which is the other electrode of the EL element 414. Specifically, an alloy of aluminum and lithium can be used for the electrode 544.

According to this embodiment, a semiconductor device can be manufactured through a smaller number of photolithography steps than the conventional one and deterioration of a semiconductor layer can be suppressed. Therefore, a highly reliable EL display device can be manufactured at low cost with high productivity.

This embodiment can be freely combined with any of the other embodiments.

Embodiment 3

Figure 11A:
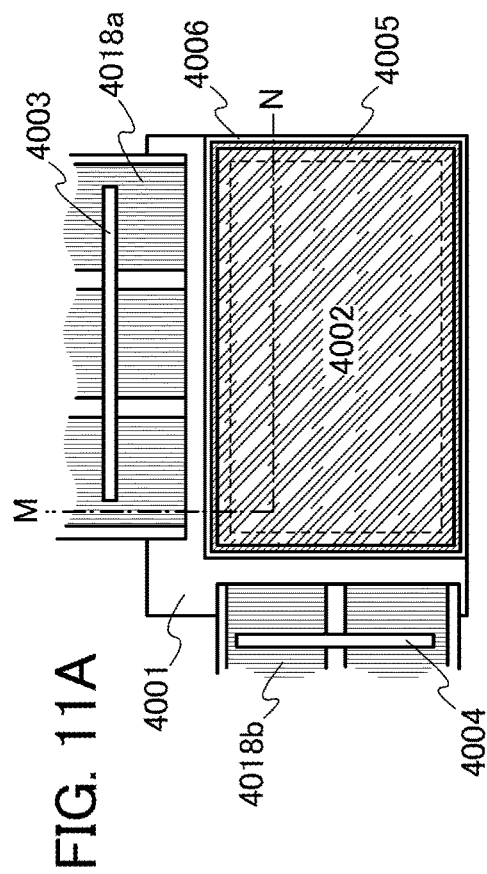
FIGS. 11A and 11B are a top view and a cross-sectional view illustrating one embodiment of the present invention.
Figure 11B:
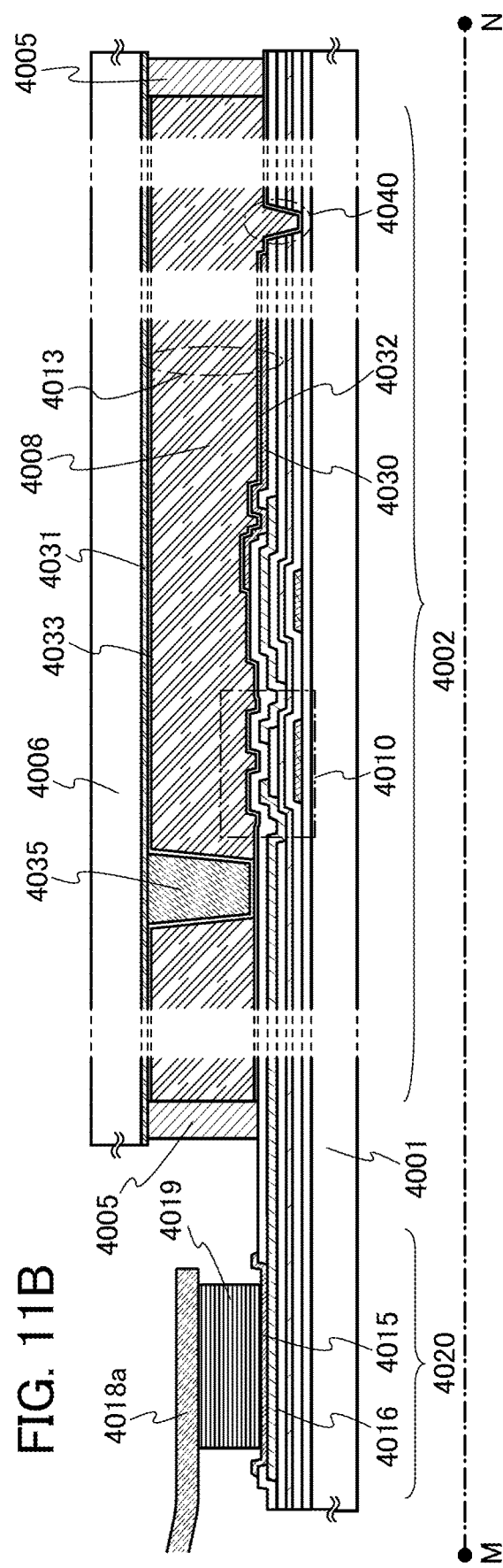

One mode of a display device in which the transistor described in Embodiment 1 is used is illustrated in FIGS. 11A and 11B.

FIG. 11A is a plan view of a panel in which a transistor 4010 and a liquid crystal element 4013 are sealed between a first substrate 4001 and a second substrate 4006 with a sealant 4005. FIG. 11B is a cross-sectional view taken along line M-N in FIG. 11A. A groove portion 4040 is provided over the first substrate 4001.

The sealant 4005 is provided so as to surround a pixel portion 4002 provided over the first substrate 4001, and the second substrate 4006 is provided over the pixel portion 4002.

Accordingly, the pixel portion 4002 is sealed together with a liquid crystal layer 4008 by the first substrate 4001, the sealant 4005, and the second substrate 4006.

Further, an input terminal 4020 is provided in a region over the first substrate 4001 outside a region surrounded by the sealant 4005, and flexible printed circuits (FPCs) 4018a and 4018b are connected to the input terminal 4020. The FPC 4018a is electrically connected to a signal line driver circuit 4003 which is separately provided over another substrate, and the FPC 4018b is electrically connected to a scan line driver circuit 4004 which is separately provided over another substrate. Various signals and potentials supplied to the pixel portion 4002 are supplied from the signal line driver circuit 4003 and the scan line driver circuit 4004 via the FPC 4018a and the FPC 4018b.

Note that a connection method of separately formed driver circuits is not particularly limited, and a chip on glass (COG) method, a wire bonding method, a tape carrier package (TCP) method, a tape automated bonding (TAB) method, or the like can be used.

Although not illustrated, the signal line driver circuit 4003 or the scan line driver circuit 4004 may be provided over the substrate 4001 with the use of the transistor disclosed in this specification.

As a display element provided in the display device, a liquid crystal element (also referred to as a liquid crystal display element) can be used. Furthermore, a display medium whose contrast is changed by an electric effect, such as electronic ink, can be used.

The display device illustrated in FIGS. 11A and 11B includes an electrode 4015 and a wiring 4016. The electrode 4015 and the wiring 4016 are electrically connected to a terminal included in the FPC 4018a via an anisotropic conductive layer 4019.

The electrode 4015 is formed using the same conductive layer as a first electrode 4030, and the wiring 4016 is formed using the same conductive layer as electrodes serving as a source and a drain of the transistor 4010.

In this embodiment, the transistor described in Embodiment 1 can be applied to the transistor 4010. The transistor 4010 included in the pixel portion 4002 is electrically connected to a display element to form a display panel. A variety of display elements can be used as the display element as long as display can be performed.

FIGS. 11A and 11B illustrate an example of a display device in which a liquid crystal element is used as a display element. In FIGS. 11A and 11B, the liquid crystal element 4013 which is a display element includes the first electrode 4030, a second electrode 4031, and the liquid crystal layer 4008. Insulating layers 4032 and 4033 serving as alignment films are provided so that the liquid crystal layer 4008 is interposed therebetween. The insulating layer 4032 functioning as an alignment film is also provided over the groove portion 4040. The second electrode 4031 is formed on the second substrate 4006 side. The first electrode 4030 and the second electrode 4031 are stacked with the liquid crystal layer 4008 provided therebetween.

A spacer 4035 is a columnar spacer which is formed on the second substrate 4006 using an insulating layer and is provided to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

The size of storage capacitor formed in the liquid crystal display device is set considering the leakage current of the transistor provided in the pixel portion or the like so that charge can be held for a predetermined period. By using the transistor in which a purified oxide semiconductor is used for a semiconductor layer including a channel region, it is enough to provide a storage capacitor having capacitance that is less than or equal to ⅓ preferably less than or equal to ⅕ of liquid crystal capacitance of each pixel.

In the transistor used in this embodiment, which includes a purified oxide semiconductor layer, the current in an off state (the off-state current) can be made small. Accordingly, an electrical signal such as an image signal can be held for a longer period in the pixel, and a writing interval can be set longer in an on state. Thus, the frequency of refresh operation can be reduced, which leads to an effect of suppressing power consumption. In addition, in the transistor including a purified oxide semiconductor layer, a potential applied to the liquid crystal element can be held even when a storage capacitor is not provided.

In addition, the use of an oxide semiconductor layer as the semiconductor layer enables the transistor used in this embodiment to have a relatively high field-effect mobility compared with a transistor using amorphous silicon and thus operate at high speed. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

As described above, by application of the transistor described in Embodiment 1, a liquid crystal display device can be manufactured in which the reliability of a transistor is improved without increasing the number of photomasks used in the manufacturing process of the display device including the transistor. Therefore, a highly reliable liquid crystal display device can be manufactured at low cost with high productivity.

This embodiment can be freely combined with any of the other embodiments.

Embodiment 4

Figure 23A:
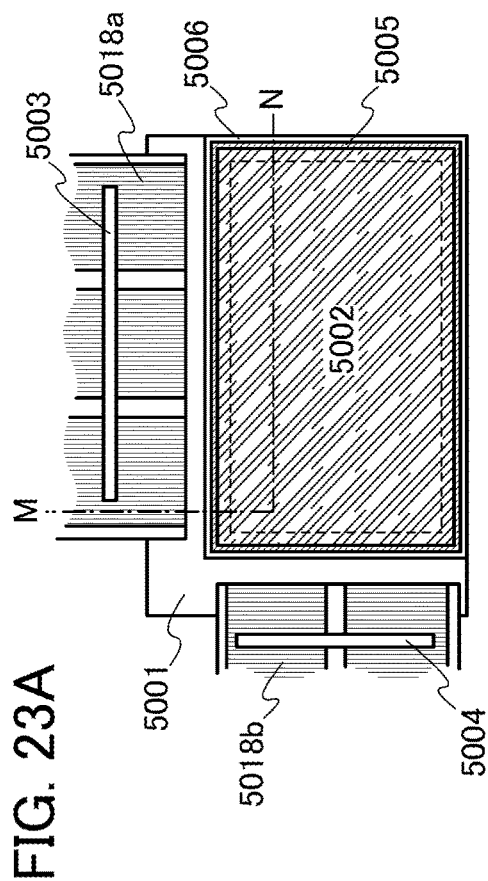
FIGS. 23A and 23B are a top view and a cross-sectional view illustrating one embodiment of the present invention.
Figure 23B:
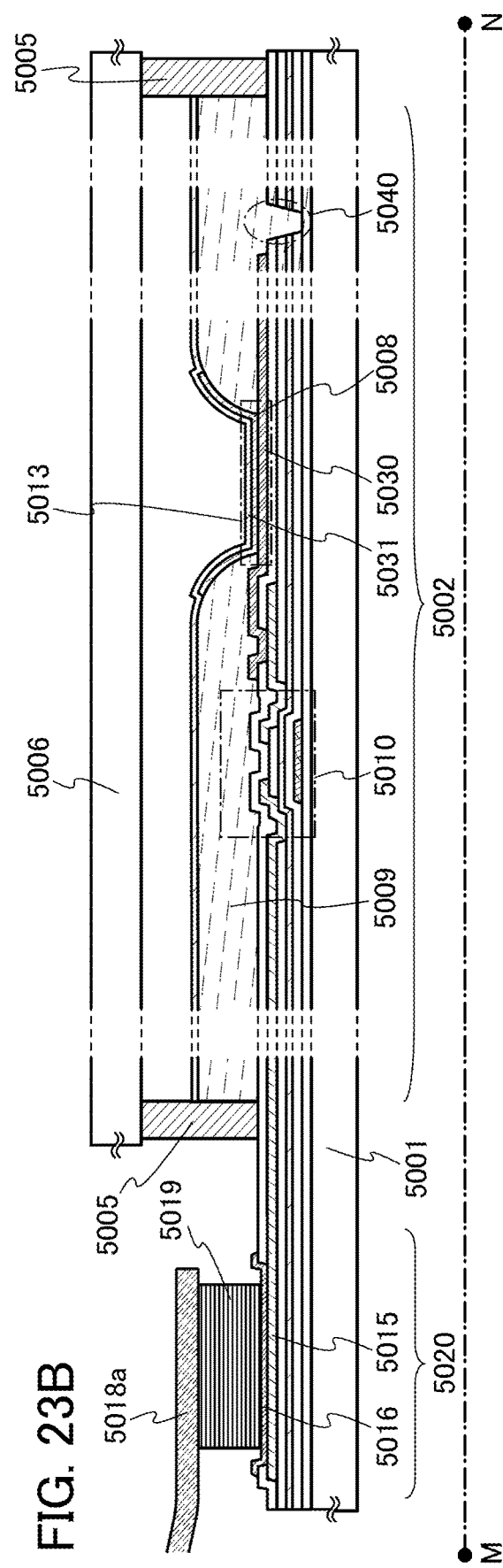

One mode of a display device in which the transistor described in Embodiment 2 is used is illustrated in FIGS. 23A and 23B.

FIG. 23A is a plan view of a panel in which a transistor 5010 and an EL element 5013 are sealed between a first substrate 5001 and a second substrate 5006 with a sealant 5005. FIG. 23B is a cross-sectional view taken along line M-N in FIG. 23A. A groove portion 5040 is provided over the first substrate 5001.

The sealant 5005 is provided so as to surround a pixel portion 5002 provided over the first substrate 5001, and the second substrate 5006 is provided over the pixel portion 5002. Accordingly, the pixel portion 5002 is sealed by the first substrate 5001, the sealant 5005, and the second substrate 5006.

Further, an input terminal 5020 is provided in a region over the first substrate 5001 outside a region surrounded by the sealant 5005, and flexible printed circuits (FPCs) 5018a and 5018b are connected to the input terminal 5020. The FPC 5018a is electrically connected to a signal line driver circuit 5003 which is separately provided over another substrate, and the FPC 5018*b* is electrically connected to a scan line driver circuit 5004 which is separately provided over another substrate. Various signals and potentials supplied to the pixel portion 5002 are supplied from the signal line driver circuit 5003 and the scan line driver circuit 5004 via the FPC 5018*a* and the FPC 5018*b*.

Note that a connection method of separately formed driver circuits is not particularly limited, and a chip on glass (COG) method, a wire bonding method, a tape carrier package (TCP) method, a tape automated bonding (TAB) method, or the like can be used.

Although not illustrated, the signal line driver circuit 5003 or the scan line driver circuit 5004 may be provided over the substrate 5001 with the use of the transistor disclosed in this specification.

The display device illustrated in FIGS. 23A and 23B includes an electrode 5015 and a wiring 5016. The electrode 5015 and the wiring 5016 are electrically connected to a terminal included in the FPC 5018*a* via an anisotropic conductive layer 5019.

The electrode 5015 is formed using the same conductive layer as a first electrode and a second electrode of the transistor 5010. The wiring 5016 is formed using the same conductive layer as a first electrode 5030 which serves as one electrode of the EL element 5013.

In this embodiment, the second transistor described in Embodiment 2 can be applied to the transistor 5010. The transistor 5010 included in the pixel portion 5002 is electrically connected to a display element to form a display panel.

The display device illustrated in FIGS. 23A and 23B is an example in which an EL element is used as a display element. In FIGS. 23A and 23B, the EL element 5013 includes the first electrode 5030, a second electrode 5031, and an EL layer 5008. A partition layer 5009 in which the EL element 5013 is provided is also provided over the groove portion 5040.

The groove portion 5040 is filled with the partition layer 5009, whereby end portions of a semiconductor layer and an insulating layer which are exposed in the formation of the groove portion 5040 can be covered. In this structure, the exposed portions can be protected, which results in an improvement in the reliability of the semiconductor device.

In addition, the use of an oxide semiconductor layer as the semiconductor layer enables the transistor used in this embodiment to have a relatively high field-effect mobility compared with a transistor using amorphous silicon and thus operate at high speed. Therefore, by using the transistor in a pixel portion of an EL display device, a high-quality image can be provided.

In addition, since the transistors can be separately provided in a driver circuit portion and a pixel portion over one substrate, the number of components of the EL display device can be reduced.

As described above, by application of the transistor described in Embodiment 2, an EL display device can be manufactured in which the reliability of a transistor is improved without increasing the number of photomasks used in the manufacturing process of the display device including the transistor. Therefore, a highly reliable EL display device can be manufactured at low cost with high productivity.

This embodiment can be freely combined with any of the other embodiments.

Embodiment 5

In this embodiment, examples of electronic devices each including the display device described in any of the above embodiments will be described.

Figure 12A:
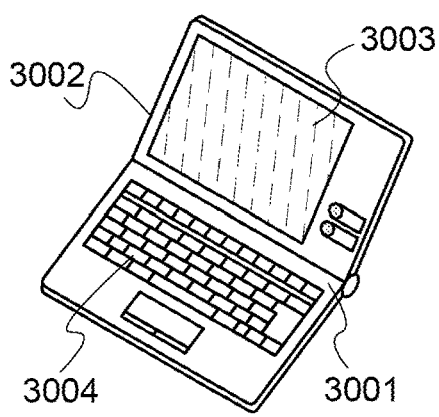
FIGS. 12A to 12F illustrate examples of electronic devices.

FIG. 12A illustrates a laptop personal computer, which includes a main body 3001, a housing 3002, a display portion 3003, a keyboard 3004, and the like. By using either the liquid crystal display device or the EL display device described in the above embodiments, a highly reliable laptop personal computer can be provided at low cost with high productivity.

Figure 12B:
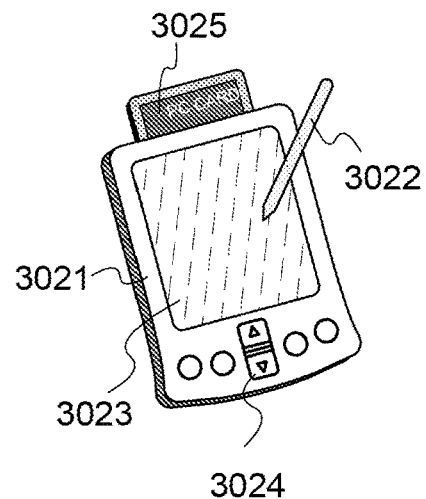

FIG. 12B illustrates a personal digital assistant (PDA), which includes a main body 3021 provided with a display portion 3023, an external interface 3025, operation buttons 3024, and the like. A stylus 3022 is included as an accessory for operation. By using either the liquid crystal display device or the EL display device described in the above embodiments, a highly reliable personal digital assistant (PDA) can be provided at low cost with high productivity.

Figure 12C:
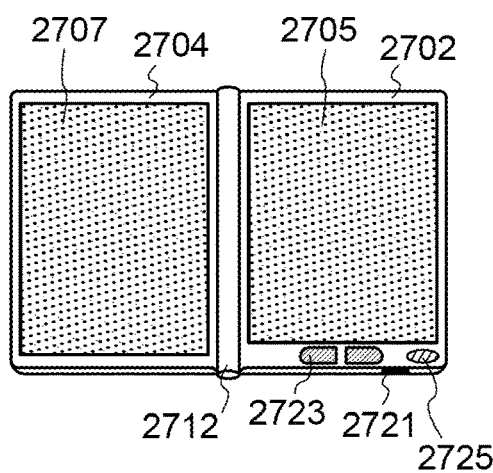

FIG. 12C illustrates an example of an e-book reader. For example, the e-book reader includes two housings, a housing 2702 and a housing 2704. The housing 2702 and the housing 2704 are combined with a hinge 2712 so that the e-book reader can be opened and closed with the hinge 2712 as an axis. With such a structure, the e-book reader can operate like a paper book.

A display portion 2705 and a display portion 2707 are incorporated in the housing 2702 and the housing 2704, respectively. The display portion 2705 and the display portion 2707 may display one image or different images. In the structure where different images are displayed on different display portions, for example, the right display portion (the display portion 2705 in FIG. 12C) can display text and the left display portion (the display portion 2707 in FIG. 12C) can display images. By using either the liquid crystal display device or the EL display device described in the above embodiments, a highly reliable e-book reader can be provided at low cost with high productivity.

FIG. 12C illustrates an example in which the housing 2702 is provided with an operation portion and the like. For example, the housing 2702 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may be configured to transmit and receive data wirelessly. Through wireless communication, desired book data or the like can be purchased and downloaded from an e-book server.

Figure 12D:
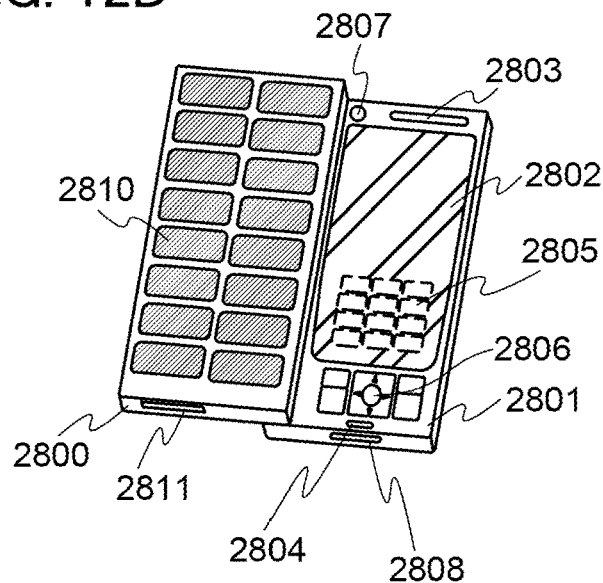

FIG. 12D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 12D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as illustrated in FIG. 12D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using either the liquid crystal display device or the EL display device described in the above embodiments, a highly reliable mobile phone can be provided at low cost with high productivity.

Figure 12E:
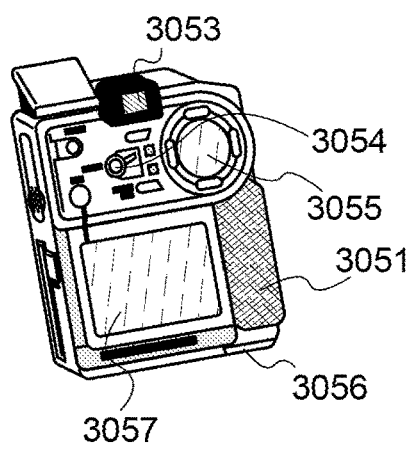

FIG. 12E illustrates a digital video camera, which includes a main body 3051, a display portion A 3057, an eyepiece portion 3053, an operation switch 3054, a display portion B 3055, a battery 3056, and the like. By using either the liquid crystal display device or the EL display device described in the above embodiments, a highly reliable digital video camera can be provided.

Figure 12F:
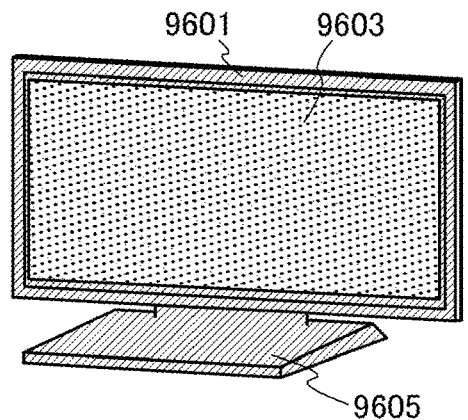

FIG. 12F illustrates an example of a television set. In the television set, a display portion 9603 is incorporated in a housing 9601. The display portion 9603 can display images. Here, the housing 9601 is supported by a stand 9605. By using either the liquid crystal display device or the EL display device described in the above embodiments, a highly reliable television set can be provided.

The television set can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

This application is based on Japanese Patent Application serial no. 2011-247360 filed with Japan Patent Office on Nov. 11, 2011 and Japanese Patent Application serial no. 2011-247367 filed with Japan Patent Office on Nov. 11, 2011, the entire contents of which are hereby incorporated by reference.

What is claimed is:

1. A semiconductor device comprising:
    a semiconductor layer;
    an insulating layer over the semiconductor layer;
    a first wiring over the insulating layer, the first wiring electrically connected to the semiconductor layer; and
    a conductive layer over the insulating layer,
    wherein the semiconductor layer includes a first region configured to be a channel formation region of a first transistor, a second region configured to be a channel formation region of a second transistor, and a third region between the first region and the second region,
    wherein the channel formation region of the first transistor is electrically connected to a gate electrode of the second transistor via the conductive layer,
    wherein the second transistor is electrically connected to a first light-emitting element,
    wherein the first transistor, the second transistor, and the first light-emitting element are provided in a first pixel,
    wherein the second transistor is adjacent to the first transistor, and
    wherein the conductive layer is in contact with a side surface of the semiconductor layer via an opening of the semiconductor layer.

2. The semiconductor device according to claim 1, wherein at least the third region of the semiconductor layer is not overlapped with the first wiring.

3. The semiconductor device according to claim 1, further comprising:
    a second wiring electrically connected to the channel formation region of the second transistor via an opening of the insulating layer.

4. The semiconductor device according to claim 3, further comprising:
    a capacitor comprising a part of the gate electrode of the second transistor and a part of the second wiring.

5. The semiconductor device according to claim 1, wherein the semiconductor layer comprises polycrystalline silicon.

6. The semiconductor device according to claim 1, wherein the first wiring has a stacked structure using metal materials selected from molybdenum, titanium, tungsten, tantalum, aluminum, copper, chromium, neodymium, and scandium.

7. A semiconductor device comprising:
    a first insulating layer;
    a semiconductor layer over the first insulating layer;
    a second insulating layer over the semiconductor layer;
    a first wiring over the second insulating layer, the first wiring electrically connected to the semiconductor layer; and
    a conductive layer over the second insulating layer,
    wherein the semiconductor layer includes a first region configured to be a channel formation region of a first transistor, a second region configured to be a channel formation region of a second transistor, and a third region between the first region and the second region,
    wherein the channel formation region of the first transistor is electrically connected to a gate electrode of the second transistor via the conductive layer,
    wherein the second transistor is electrically connected to a first light-emitting element,
    wherein the first transistor, the second transistor, and the first light-emitting element are provided in a first pixel,
    wherein the second transistor is adjacent to the first transistor,
    wherein the conductive layer is in contact with the first insulating layer via an opening of the second insulating layer and an opening of the semiconductor layer, and wherein the conductive layer is in contact with a side surface of the semiconductor layer in the opening of the semiconductor layer.

8. The semiconductor device according to claim 7, wherein at least the third region of the semiconductor layer is not overlapped with the first wiring.

9. The semiconductor device according to claim 7, further comprising:
a second wiring electrically connected to the channel formation region of the second transistor via an opening of the second insulating layer.

10. The semiconductor device according to claim 9, further comprising:
a capacitor comprising a part of the gate electrode of the second transistor and a part of the second wiring.

11. The semiconductor device according to claim 7, wherein the semiconductor layer comprises polycrystalline silicon.

12. The semiconductor device according to claim 7, wherein the first wiring has a stacked structure using metal materials selected from molybdenum, titanium, tungsten, tantalum, aluminum, copper, chromium, neodymium, and scandium.

13. A semiconductor device comprising:
a semiconductor layer;
an insulating layer over the semiconductor layer;
a first wiring over the insulating layer, the first wiring electrically connected to the semiconductor layer; and
a conductive layer over the insulating layer,
wherein the semiconductor layer includes a channel formation region of a first transistor, a channel formation region of a second transistor, a channel formation region of a third transistor, and a channel formation region of a fourth transistor,
wherein the channel formation region of the first transistor is electrically connected to a gate electrode of the second transistor via the conductive layer,
wherein the second transistor is electrically connected to a first light-emitting element,
wherein the first transistor, the second transistor, and the first light-emitting element are provided in a first pixel,
wherein the channel formation region of the third transistor is electrically connected to a gate electrode of the fourth transistor,
wherein the fourth transistor is electrically connected to a second light-emitting element,
wherein the third transistor, the fourth transistor, and the second light-emitting element are provided in a second pixel adjacent to the first pixel, and
wherein the conductive layer is in contact with a side surface of the semiconductor layer in an opening of the semiconductor layer.

14. The semiconductor device according to claim 13, wherein the first pixel and the second pixel are electrically connected to the first wiring.

15. The semiconductor device according to claim 13, further comprising:
a second wiring electrically connected to the channel formation region of the second transistor via an opening of the insulating layer; and
a capacitor comprising a part of the gate electrode of the second transistor and a part of the second wiring.

16. The semiconductor device according to claim 13, wherein the semiconductor layer comprises polycrystalline silicon.

17. The semiconductor device according to claim 13, wherein the first wiring has a stacked structure using metal materials selected from molybdenum, titanium, tungsten, tantalum, aluminum, copper, chromium, neodymium, and scandium.

* * * * *